US007306895B2

(12) United States Patent
Kano et al.

(10) Patent No.: US 7,306,895 B2
(45) Date of Patent: Dec. 11, 2007

(54) PATTERN FORMING METHOD, IMAGE FORMING METHOD, FINE PARTICLE ADSORPTION PATTERN FORMING METHOD, CONDUCTIVE PATTERN FORMING METHOD, PATTERN FORMING MATERIAL AND PLANOGRAPHIC PRINTING PLATE

(75) Inventors: Takeyoshi Kano, Shizuoka-ken (JP); Koichi Kawamura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 445 days.

(21) Appl. No.: 10/828,472

(22) Filed: Apr. 21, 2004

(65) Prior Publication Data
US 2004/0209203 A1 Oct. 21, 2004

(30) Foreign Application Priority Data

Apr. 21, 2003 (JP) ............................. 2003-115984
May 7, 2003 (JP) ............................. 2003-129150
Jun. 24, 2003 (JP) ............................. 2003-179442
Mar. 18, 2004 (JP) ............................. 2004-079009

(51) Int. Cl.
*G03F 7/26* (2006.01)
*G03F 7/14* (2006.01)
*G03F 7/028* (2006.01)
*G03F 7/095* (2006.01)

(52) U.S. Cl. ...................... 430/291; 430/302; 430/324
(58) Field of Classification Search ................ 430/302, 430/291, 324
See application file for complete search history.

(56) References Cited

U.S. PATENT DOCUMENTS

| 3,188,165 | A | 6/1965 | Magat et al. |
| 3,745,042 | A | 7/1973 | Lim et al. |
| 3,892,575 | A | 7/1975 | Watts et al. |
| 4,275,092 | A | 6/1981 | Nakayama et al. |
| 4,355,053 | A | 10/1982 | Nezu et al. |
| 5,889,073 | A | 3/1999 | Zhang et al. |
| 6,306,492 | B1 | 10/2001 | Yamada et al. |
| 6,566,029 | B2 | 5/2003 | Kawamura et al. |
| 6,593,059 | B2 | 7/2003 | Kawamura et al. |
| 6,607,866 | B1 | 8/2003 | Kawamura et al. |
| 2002/0106583 | A1* | 8/2002 | Kawamura et al. ...... 430/271.1 |
| 2003/0186162 | A1 | 10/2003 | Takahashi et al. |
| 2004/0067434 | A1 | 4/2004 | Kano et al. |
| 2004/0209203 | A1 | 10/2004 | Kano et al. |

FOREIGN PATENT DOCUMENTS

| DE | 1145135 | 8/1959 |
| DE | 2052397 | 10/1970 |
| EP | 0 709 228 A1 | 1/1996 |
| EP | 1088679 A2 | 4/2001 |
| EP | 1 172 696 A1 | 1/2002 |
| EP | 1 211 096 A1 | 6/2002 |
| EP | 1 302 504 A1 | 4/2003 |
| EP | 1400544 A1 | 3/2004 |
| JP | 53-17407 A | 2/1978 |
| JP | 54-74102 A | 6/1979 |
| JP | 59-101651 A | 6/1984 |
| JP | 59-101657 A | 6/1984 |
| JP | 06-018706 A | 1/1994 |
| JP | 07-001849 A | 1/1995 |
| JP | 7-1853 A | 1/1995 |
| JP | 8-507727 A | 8/1996 |
| JP | 8-272087 A | 10/1996 |
| JP | 8-292558 A | 11/1996 |
| JP | 10-017688 A | 1/1998 |
| JP | 10-53658 A | 2/1998 |
| JP | 2828374 B2 | 9/1998 |
| JP | 11-043614 A | 2/1999 |
| JP | 11-084658 A | 3/1999 |
| JP | 11-119413 A | 4/1999 |
| JP | 2938397 B2 | 6/1999 |
| JP | 2000-080189 A | 3/2000 |
| JP | 2000-247799 A | 9/2000 |
| JP | 2001-166491 A | 6/2001 |
| JP | 2002-273209 A | 9/2002 |
| JP | 2002-283530 A | 10/2002 |
| JP | 2002-324966 A | 11/2002 |

OTHER PUBLICATIONS

Patent Abstracts of Japan abstract of JP-A-1-279257 dated Nov. 9, 1989.
Hiroo Iwata, "Surface Graft Reaction on Separation Membrance and Dynamic Function of Grafted Chains", Surface, vol. 32, No. 3 (1994) pp. 28-34 published by Koushinsha.
Martin S. Kunz, et al., "Colloidal Gold Dispersions in Polymeric Matrices", Journal of Colloid and Interface Science 156, pp. 240-249 (1993) published by Academic Press, Inc.
"Langmuir, vol. 15" by Takehisa Matsuda, et. Al, 1999, pp. 5560-5566.
E. Kim, Y. Xia, G.M. Whitesides, "Advanced Materials" vol. 8, WileyInterscience, 1996, pp. 245-247.

* cited by examiner

*Primary Examiner*—Richard L. Schilling
(74) *Attorney, Agent, or Firm*—Sughrue Mion Pllc.

(57) ABSTRACT

The invention provides a pattern forming method including providing a polymerization initiation layer which is obtained by fixing, by a cross-linking reaction, a polymer having functional groups having polymerization initiation ability and cross-linking groups at side chains, on a support, and forming a pattern including a preparation zone and a non-preparation zone of a graft polymer by preparing the graft polymer on the surface of the polymerization initiation layer using graft polymerization, by contacting a compound having a polymerizable group on the polymerization initiation layer and supplying energy imagewise; an image forming method which applies the pattern forming method; a pattern forming material; and a planographic printing plate. A fine particle adsorption pattern forming method and a conductive pattern forming method are also provided.

11 Claims, No Drawings

PATTERN FORMING METHOD, IMAGE FORMING METHOD, FINE PARTICLE ADSORPTION PATTERN FORMING METHOD, CONDUCTIVE PATTERN FORMING METHOD, PATTERN FORMING MATERIAL AND PLANOGRAPHIC PRINTING PLATE

CROSS-REFERENCE TO RELATED APPLICATION

This application claims priority under 35 USC 119 from Japanese Patent Application Nos. 2003-115984, 2003-129150, 2003-179442 and 2004-79009, the disclosure of which is incorporated by reference herein.

BACKGROUND OF THE INVENTION

1. Field of the Invention

The present invention relates to a pattern forming method, to an image forming method, a fine particle adsorption pattern forming method, and a conductive pattern forming method, in which substances having various functionalities are adhered in a pattern shape as applications of the pattern forming method, and to a pattern forming material and a planographic printing plate prepared by the pattern forming method.

2. Description of the Related Art

Techniques for forming a fine pattern have recently attracted attention in various fields. In particular, methods for forming fine hydrophilic/hydrophobic patterns have attracted attention. For example, as a method of forming hydrophilic/hydrophobic patterns, there is a known technique of forming a pattern having hydrophilic/hydrophobic zones by forming a stamp having a convex pattern on a surface, adhering hydrophobic molecules on the convex pattern portion, then transferring the hydrophobic molecules onto a substrate, and adhering hydrophilic molecules on a portion of the substrate to which the hydrophobic molecules have not been transferred (for example, see Japanese Patent Application Laid-Open (JP-A) No. 2002-283530). The hydrophilic/hydrophobic pattern thus prepared is useful for various functional devices, DNA chips and the like. However, although fine and precise patterns can be formed according to the technique, a specific material must be used, and it has been difficult to apply the method to large area image formation and the like.

As a technique related to application to large area image formation, there is a known method of forming a pattern (an image portion and a non image portion) comprising a hydrophilic layer and a hydrophobic substrate surface, by forming the hydrophilic layer comprising a hydrophilic graft polymer on the whole surface of the hydrophobic substrate, and then removing imagewise the hydrophilic layer from the substrate surface by abrasion by laser exposure (for example, see JP-A No. 11-119413). Since the step of transferring the pattern is not required according to the method, it can be used as a large area planographic printing plate material by adhering water and an ink on the prepared hydrophilic/hydrophobic pattern. However, the method of forming the hydrophilic/hydrophobic pattern requires an expensive high power laser because high energy is required for removing the hydrophilic layer, and further, the quality and the resolution of the formed image are also unsatisfactory.

As methods of forming patterns by lower energy in response to this problem, there is a known method of preparing a hydrophilic/hydrophobic pattern, by forming a preparation portion and a non preparation portion of a graft polymer through the steps of 1. cross-linking a polystyrene film using γ-rays, 2. chloromethylating a styrene unit portion, 3. bonding dithiocarbamate on a film surface and bonding a photo-polymerization initiator on the film surface, and 4. immersing the film in a monomer solution and carrying out imagewise active beam irradiation (for example, see "Langmuir, Volume 15" by Takehisa Matsuda, et. al, 1999, pp. 5560-5566). However, there are problems in that this method requires 4 steps for forming the hydrophilic/hydrophobic pattern and the work is troublesome.

As a technique of applying the hydrophilic/hydrophobic pattern, there is a technique of arranging fine particles in a pattern shape. The technique of arranging fine particles is an important technique for achieving higher functions such as larger area, higher resolution and higher density of materials such as catalysts, recording materials, sensors, electronic devices and optical devices, and thus, studies thereon have been carried out extensively.

For example, a method of forming the aggregated fine particles is proposed in which a liquid dispersion medium of fine particles is developed on a substrate to form a liquid thin film, the liquid thickness of the liquid dispersion medium is reduced and controlled to a liquid thickness equal to or thinner than the particle size, and the fine particles are aggregated by use of surface tension (for example, see Japanese Patent No. 2828374). According to the method, a layer of fine particles can be evenly aggregated and uniformly arranged, but it is difficult to obtain a patterned arrangement in a desired zone.

Further, as a technique of arranging fine particles in a pattern shape, there is a known method in which a surface of an oxide substrate such as $TiO_2$ is irradiated with light in a pattern shape, a hydrophilic pattern is formed on the surface, and the fine particles are arranged in accordance with the pattern (for example, see JP-A No. 2002-273209). According to the method, it is possible to prepare a pattern of fine particles, but since the fine particles are merely physically adhered and not fixed, they are easily released, and the pattern is not suitable for uses as various devices. Further, particles also tend to be adhered to a portion other than the pattern where the fine particles are adhered, and there is a desire for a method of forming a pattern having high selectivity where particles are not adhered on a portion other than the pattern.

As another method of arranging fine particles in a pattern shape, there is a known method of laminating pattern-shaped fine particles using the micro stamp of G. M. Whitesides et al. (for example, see E. Kim, Y. Xia, G. M. Whitesides, "Advanced Materials" Vol. 8, Wiley Interscience, 1996, page 245). According to the method, polymer fine particles with a sub micron size can be accumulated in order with certainty, and a method of forming a pattern having high selectivity where particles are not adhered on a portion other than the pattern can be provided. However, since the procedure of the method is difficult and the solvent evaporation rate must be controlled for preparing ordered particle laminates, the particle laminates cannot be easily prepared. Further, since an area capable of being prepared is small, this method is not suitable for preparing a laminate with a large area. Furthermore, adsorption strength between a substrate and fine particles laminated in a pattern shape is weak. Therefore from the viewpoint of practical use, high adsorption strength between the substrate and the fine particles is required.

On the other hand, finer conductive materials (conductive pattern) are required in accordance with the size reduction of electric home products. Typically, such conductive pattern material is obtained by providing a thin film conductive material which is formed by known methods such as vacuum evaporation on an insulator, treating it with a resist, removing the portion of the resist preliminarily prepared by pattern exposure, and then carrying out etching treatment to form a desired pattern. Accordingly, it requires at least four steps, and when wet etching treatment is carried out, a step for disposal the waste solution is also required. Therefore a complicated process has to be carried out.

Then, there has been recently developed a method of drawing a metal paste containing metal fine particles on a substrate by ink jet, as a method of forming conductive patterns (for example, see JP-A No. 2002-324966). However, the method has problems in preparing conductive fine patterns in that fine patterns having an order of several microns cannot be prepared because of the drawing by ink jet, and in that, while patterns having an order of several tens of microns can be prepared, conductivity is unstable because of low viscosity of the metal paste and difficulty in lamination, etc. Further, since the conductive layer which is drawn is only set on the substrate, there have also been problems with respect to adhesion property between the substrate and the conductive layer.

SUMMARY OF THE INVENTION

The present invention has been made in light of the above-mentioned circumstances.

The present invention is to provide a pattern forming method which can form a fine and sharp pattern capable of being applied over a wide range by a simple method without requiring a specific material, specific compound or high energy. In addition., the invention is to provide an image forming method, a pattern forming material and a planographic printing plate to which this pattern forming method is applied.

Further, the invention is to provide a fine particle adsorption pattern forming method which can form, by a simple procedure, a firm and uniform fine particle adsorption pattern which is not peeled by a mechanical operation such as rubbing, only on desired zones on a support, and which can also be applied to large area pattern formation.

Further, the invention is to provide a conductive pattern forming method which can obtain fine patterns having the high adhesion property of a conductive material, high resolution and stable conductivity without disconnection, and which has a wide application range.

The inventors have carried out intensive studies and have thus completed the invention.

Namely, a first aspect of the invention is to provide a pattern forming method comprising:

providing a polymerization initiation layer which is obtained by fixing, by a cross-linking reaction, a polymer having functional groups having polymerization initiation ability and cross-linking groups at side chains, on a support; and forming a pattern comprising a preparation zone and a non-preparation zone of a graft polymer by preparing the graft polymer on the surface of the polymerization initiation layer using graft polymerization, by contacting a compound having a polymerizable group on the polymerization initiation layer and supplying energy imagewise.

Further, a second aspect of the invention is to provide an image forming method comprising:

providing a polymerization initiation layer which is obtained by fixing, by a cross-linking reaction, a polymer having functional groups having polymerization initiation ability and cross-linking groups at side chains, on a support;

forming a pattern comprising a preparation zone and a non-preparation zone of a graft polymer by preparing the graft polymer on the surface of the polymerization initiation layer using graft polymerization, by contacting a compound having a polymerizable group on the polymerization initiation layer and supplying energy imagewise; and adhering a colorant on the preparation zone or the non-preparation zone of the graft polymer.

A third aspect of the invention is to provide a fine particle adsorption pattern forming method comprising:

forming a polymerization initiation layer which is obtained by fixing, by a cross-linking reaction, a polymer having functional groups having polymerization initiation ability and cross-linking groups at side chains, on a support;

preparing a graft polymer having a polar group in a pattern shape on the surface of the polymerization initiation layer; and adsorbing fine particles on the graft polymer.

A fourth aspect of the invention is to provide a fine particle adsorption pattern forming method comprising:

forming a polymerization initiation layer which is obtained by fixing, by a cross-linking reaction, a polymer having functional groups having polymerization initiation ability and cross-linking groups at side chains, on a support;

forming a pattern comprising a preparation zone and a non-preparation zone of a graft polymer by preparing the graft polymer on the surface of the polymerization initiation layer using graft polymerization, by contacting a compound having a polymerizable group and a polar group on the polymerization initiation layer and supplying energy imagewise; and adsorbing fine particles on the preparation zone of the graft polymer.

Further, in the above-mentioned fine particle adsorption pattern forming method (the third and fourth aspects) of the present invention, the polar group is preferably an ionic group from the viewpoints of affinity and adsorption properties with the fine particle.

A fifth aspect of the invention is to provide a fine particle adsorption pattern forming method comprising:

forming a polymerization initiation layer which is obtained by fixing, by a cross-linking reaction, a polymer having functional groups having polymerization initiation ability and cross-linking groups at side chains, on a support;

forming a pattern comprising a hydrophilic zone and a hydrophobic zone on the surface of the polymerization initiation layer, by providing a polymer compound layer comprising a polymer compound which is directly and chemically bonded with the polymerization initiation layer and has a functional group whose hydrophilicity or hydrophobicity is changed by heat, acid or radiation and applying heat, acid or radiation imagewise to the polymer compound layer; and adsorbing fine particles on the hydrophilic zone or the hydrophobic zone.

A sixth aspect of the invention is to provide a conductive pattern forming method comprising:

forming a polymerization initiation layer which is obtained by fixing, by a cross-linking reaction, a polymer having functional groups having polymerization initiation ability and cross-linking groups at side chains, on a support;

preparing a graft polymer having a polar group in a pattern shape on the surface of the polymerization initiation layer; and adsorbing a conductive material on the graft polymer.

A seventh aspect of the invention is to provide a conductive pattern forming method comprising:

forming a polymerization initiation layer which is obtained by fixing, by a cross-linking reaction, a polymer having functional groups having polymerization initiation ability and cross-linking groups at side chains, on a support;

forming a pattern comprising a preparation zone and a non-preparation zone of a graft polymer by preparing the graft polymer on the surface of the polymerization initiation layer using graft polymerization, by contacting a compound having a polymerizable group and a polar group on the polymerization initiation layer and supplying energy imagewise; and adsorbing a conductive material on the preparation zone of the graft polymer.

An eighth aspect of the invention is to provide a conductive pattern forming method comprising:

forming a polymerization initiation layer which is obtained by fixing, by a cross-linking reaction, a polymer having functional groups having polymerization initiation ability and cross-linking groups at side chains, on a support;

forming a pattern comprising a hydrophilic zone and a hydrophobic zone on the surface of the polymerization initiation layer, by providing a polymer compound layer comprising a polymer compound which is directly and chemically bonded with the polymerization initiation layer and has a functional group whose hydrophilicity or hydrophobicity is changed by heat, acid or radiation and applying heat, acid or radiation imagewise to the polymer compound layer; and adsorbing a conductive material on the hydrophilic zone or the hydrophobic zone.

In the above-mentioned conductive pattern forming methods of the sixth to eighth aspects of the invention, it is preferable that the conductive material is further heated at a range of 50 to 500° C. after the conductive material is adsorbed.

In any of the above-mentioned pattern forming method, image forming method, fine particle adsorption pattern forming methods and conductive pattern forming methods, the fixation by the cross-linking reaction is preferably carried out by the cross-linking reaction using a cross-linking agent in the step of forming a polymerization initiation layer. The cross-linking reaction using a cross-linking agent is preferably carried out under a temperature condition of 50 to 300° C.

A ninth aspect of the invention is to provide a pattern forming material comprising:

a support;

a polymerization initiation layer formed on the support by using a polymer having functional groups having polymerization initiation ability at side chains; and a pattern comprising a preparation zone and a non-preparation zone of a graft polymer which is directly and chemically bonded on the surface of the polymerization initiation layer.

In the pattern forming material of the invention, it is preferable that the polymer having functional groups having polymerization initiation ability at side chains further has cross-linking groups at side chains. It is more preferable that the polymerization initiation layer is formed by cross-linking the polymer having cross-linking groups at side chains by a cross-linking reaction due to heat. Thus, the polymerization initiation layer can fix the polymer by the cross-linking reaction. The fixation by the cross-linking reaction is preferably carried out by the cross-linking reaction using a cross-linking agent, and the cross-linking reaction using such a cross-linking agent is preferably carried out under a temperature condition of 50 to 300° C.

Further, it is preferable in the pattern forming material of the invention that the above-mentioned preparation zone of a graft polymer exhibits hydrophilicity or hydrophobicity, and that the hydrophilicity or hydrophobicity of the above-mentioned non-preparation zone is different from that of the preparation zone. Thus, since the hydrophilicity or hydrophobicity of the preparation zone and that of the non-preparation zone of a graft polymer are mutually different, application of a substance to the non-preparation zone is suppressed when the substance is applied to the preparation zone of a graft polymer, and the accuracy of applying the substance is improved.

Further, the pattern forming material of the invention may be characterized in that a substance is applied to the preparation zone of a graft polymer.

The pattern forming material of the invention can be variously applied depending on the substance applied to the above-mentioned preparation zone of a graft polymer.

Firstly, when the substance which is applied to the above-mentioned preparation zone of a graft polymer is a colorant, the pattern forming material of the invention can be applied to an image forming material which can be applied to a large area, and has high sharpness and the superior uniformity of a colored zone.

When the substance which is applied to the above-mentioned preparation zone of a graft polymer is fine particles, the pattern forming material of the invention can be applied to a fine particle adsorption pattern material in which the fine particles are uniformly and firmly adhered to a desired zone.

Furthermore, when the substance which is applied to the above-mentioned preparation zone of a graft polymer is a conductive material, the pattern forming material of the invention can be applied to a conductive pattern material which has high adhesion property of the conductive material, high resolution and stable conductivity without disconnection.

As mentioned above, it is preferable in the pattern forming material of the invention that the preparation zone of a graft polymer is formed by pattern-shaped energy application for forming fine patterns.

Additionally, a planographic printing plate is an example of an application of the pattern forming material. A tenth aspect of the invention is to provide a planographic printing plate comprising:

a pattern comprising a preparation zone and a non-preparation zone of a graft polymer which is directly and chemically bonded on the surface of a polymerization initiation layer which contains a polymer having functional groups having polymerization initiation ability at side chains and is provided on a support, wherein the preparation zone of a graft polymer exhibits hydrophilicity or hydrophobicity, and a hydrophilicity or hydrophobicity of the non-preparation zone is different from that of the preparation zone.

The operation of the invention is not entirely clear, but is presumed to be as follows.

According to the invention, the polymerization initiation layer is obtained by fixing a polymer having functional groups having polymerization initiation ability and cross-linking groups at side chains by a cross-linking reaction, or contains a polymer having functional groups having polymerization initiation ability at side chains. In both these cases, since the functional groups having polymerization initiation ability in the polymerization initiation layer are pendent on polymer chains, the initiator component (component having the polymerization initiation ability) in the polymerization initiation layer can be prevented from eluting in a solution when the solution which contains a compound (for example, a monomer) used for the preparation step (graft polymerization) of a graft polymer is brought in contact with the surface of the polymerization initiation layer. As a result, the by-product of a homopolymer which is not directly bonded with the surface of the polymerization initiation layer is suppressed, and only the graft polymer directly bonded thereon is prepared imagewise on the surface of the polymerization initiation layer.

Accordingly, according to the pattern forming method and pattern forming material of the invention, a pattern comprising the preparation zone and non-preparation zone of a graft polymer can be formed by a simple procedure of directly preparing the graft polymer on the above-mentioned surface of the polymerization initiation layer.

Further, according to the pattern forming method and pattern forming material of the invention, the pattern is formed by the preparation zone and non-preparation zone of a graft polymer, the latter being the zone where the polymerization initiation layer is exposed. In particular, since one terminal of the polymer chain of the graft polymer is bonded to the polymerization initiation layer while the other terminal is not fixed and has a high degree of freedom, the graft polymer is superior in mobility, and it is considered that the physical properties expressed by the graft polymer are different from that of the zone where the polymerization initiation layer is exposed, due to the nature of this high degree of freedom, whereby a clear boundary can be provided between the preparation zone and non-preparation zone of a graft polymer. Accordingly, the pattern comprising the preparation zone and non-preparation zone of a graft polymer is easily applied to various uses in which minuteness and precision are required.

In particular, in the image forming method of the invention having the step of adhering a colorant to the pattern comprising the preparation zone and the non-preparation zone of a graft polymer which have been formed by the pattern forming method of the invention, the colorant is selectively adhered on the preparation zone or the non-preparation zone of a graft polymer. In particular, in the image forming method of the invention, when the colorant is adhered to the graft polymer, the durability of an image becomes better since the colorant is firmly adsorbed, the bonding between the graft polymer and the polymerization initiation layer is firm, and no homopolymer which is not directly bonded with the surface of the polymerization initiation layer is produced as a by-product.

According to the pattern forming method of the invention and the pattern forming material of the invention, for example, when a graft polymer having superior hydrophilicity is prepared on the surface of the hydrophobic polymerization initiation layer, a hydrophilic/hydrophobic pattern can be formed in which the preparation zone of a graft polymer becomes a hydrophilic zone and the non-preparation zone (the exposed portion of the polymerization initiation layer) becomes a hydrophobic zone. Thus, when the hydrophilic zone comprises a graft polymer, the hydrophilicity expressed is superior because of the property of the graft polymer having superior mobility. Therefore, it is thought that, in the hydrophilic/hydrophobic patterns formed, the difference in properties between the hydrophilic zone and the hydrophobic zone (the surface of the polymerization initiation layer) becomes particularly large and a clear boundary can be provided between the hydrophilic zone and the hydrophobic zone. Accordingly, the hydrophilic/hydrophobic patterns obtained can be applied as a planographic printing plate. In this case, an ink is accurately adhered at the hydrophobic zone (image portion), and wetting water is accurately adhered at the hydrophilic zone (non-image portion), whereby printed articles having high image quality and high resolution can be obtained. In particular, since the hydrophilic zone comprises the preparation zone of a graft polymer, the staining of the non-image portion is prevented by its superior hydrophilicity, and printed articles having higher quality can be obtained.

Alternatively, a graft polymer having the hydrophobicity can be prepared on the hydrophilic surface of the polymerization initiation layer to form the hydrophilic/hydrophobic pattern, and the preparation zone of a graft polymer is the image portion while the exposed portion of the polymerization initiation layer is the non-image portion. As mentioned above, since no homopolymer which is not directly bonded with the surface of the polymerization initiation layer is produced on the surface of the polymerization initiation layer as a by-product, the durability of the non-image portion or the image portion comprising the preparation zone of a graft polymer becomes better.

Regarding the fine particle adsorption pattern forming method of the invention, it is considered that the graft polymer prepared on the polymerization initiation layer interacts with the fine particles having a specific physical property and shows a strong adsorption property with respect to the fine particles having a specific physical property. In the invention, the fine particles having a specific physical property can be arranged and adsorbed on the graft polymer at a high density by utilizing this property, and the fine particle adsorption pattern making use of various superior functions which the fine particles have can be formed.

Further, since the fine particle adsorption pattern forming method of the invention has the step of forming the above-mentioned polymerization initiation layer, only the graft polymer which is directly and chemically bonded with the polymerization initiation layer is prepared on a predetermined zone. Since the fine particles are adsorbed on the graft polymer, the fine particle adsorption pattern is not peeled from the support together with the graft polymer even if mechanical operations such as abrasion are applied after adherence of the fine particles, and therefore, it is considered that the firm fine particle adsorption pattern having further improved adhesion property of the fine particles can be obtained.

Since the conductive pattern forming method of the invention has the step of forming the above-mentioned polymerization initiation layer, only the graft polymer which is directly and chemically bonded with the polymerization initiation layer is prepared on a predetermined zone. Further, since a conductive material is adsorbed on the prepared graft polymer, the conductive material adsorption pattern is not peeled from the support together with the graft polymer even if mechanical operations such as abrasion are applied after adherence of the conductive material, and therefore, it is considered that the firm conductive pattern (conductive material adsorption pattern) having improved adhesion property of the conductive material can be obtained.

When the adsorption density of the conductive material is adequately high for the conductive material adsorption pattern obtained herein, it expresses a superior conductivity as it is. However, the conductivity can be further improved by heating the conductive material after the conductive material is adsorbed. The reason is presumed to be that mutual fusion of the conductive materials occurs to improve the adhesion property between the conductive material and to reduce gaps among the conductive material.

DETAILED DESCRIPTION OF THE INVENTION

<<Pattern Forming Method and Image Forming Method>>

First, the pattern forming method and the image forming method of the present invention are explained in detail.

The pattern forming method and image forming method of the present invention have (1) the step of providing a polymerization initiation layer which is obtained by fixing by a cross-linking reaction, a polymer having functional groups having polymerization initiation ability and cross-linking groups at side chains, on a support (hereinafter, referred to as the "polymerization initiation layer forming step"), and (2) the step of forming a pattern comprising a preparation zone and a non-preparation zone of a graft polymer by preparing the graft polymer on the surface of the polymerization initiation layer using graft polymerization, by contacting a compound having a polymerizable group on the polymerization initiation layer and supplying energy imagewise (hereinafter, referred to as the "pattern forming step").

Further, the image forming method of the invention further has (3) the step of adhering a colorant on the preparation zone or the non-preparation zone of the graft polymer (hereinafter, referred to as the "colorant adhering step"), in addition to the above-mentioned (1) polymerization initiation layer forming step and (2) pattern forming step.

These respective steps are explained below in order.

<(1) Polymerization Initiation Layer Forming Step>

First, there is explained the step of providing a polymerization initiation layer which is obtained by fixing a polymer having functional groups having polymerization initiation ability and cross-linking groups at side chains by a cross-linking reaction, on a support.

The polymer having functional groups having polymerization initiation ability and cross-linking groups at side chains, which constitutes the polymerization initiation layer (hereinafter, suitably referred to as the specific polymerization initiation polymer), is preferably a copolymer containing a copolymer component having functional groups having polymerization initiation ability (hereinafter, suitably referred to as the polymerization initiation group) and a copolymer component having cross-linking groups.

[Copolymerization Component Having a Functioned Group Having Polymerization Initiation Ability]

As for the copolymerization component which has polymerization initiating group and constitutes the specific polymerization initiating polymer, a monomer having a polymerizable group allowing radical, anionic or cationic polymerization in which the following structure, as a functional group, having polymerization initiation ability is pendent at side chains is preferred. That is, the copolymerization component has the structure in which a polymerizable group which is polymerizable and a functioned group having polymerization initiation ability coexist within the molecule.

The structure having the polymerization initiation ability includes: (a) aromatic ketones, (b) onium salt compounds, (c) organic peroxides, (d) thio compounds, (e) hexaaryl biimidazole compounds, (f) ketoxime ester compounds, (g) borate compounds, (h) azinium compounds, (i) active ester compounds, (j) compounds containing a carbon-halogen linkage, and (k) pyridinium compounds. The followings indicate specific examples of the above items (a) to (k), which are not intended to limit the invention.

(a) Aromatic Ketones

As for the preferred aromatic ketones (a) which have the structure having polymerization initiation ability in the invention, compounds having the skeletal structure of benzophenone or of thioxanthone are included, which have been described in "RADIATION CURING IN POLYMER SCIENCE AND TECHNOLOGY", J. P. Fouassier, J. F. Rabek (1993), p. 77-117. For example, the following compounds are exemplified.

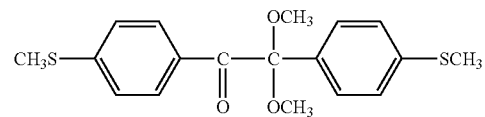

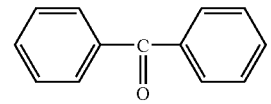

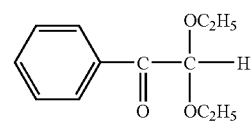

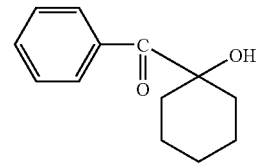

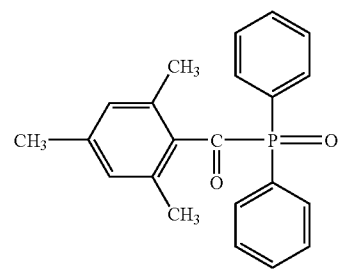

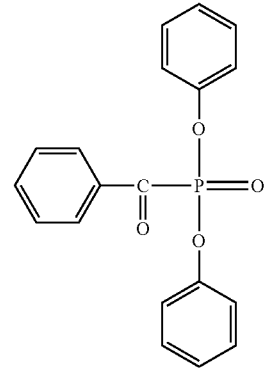

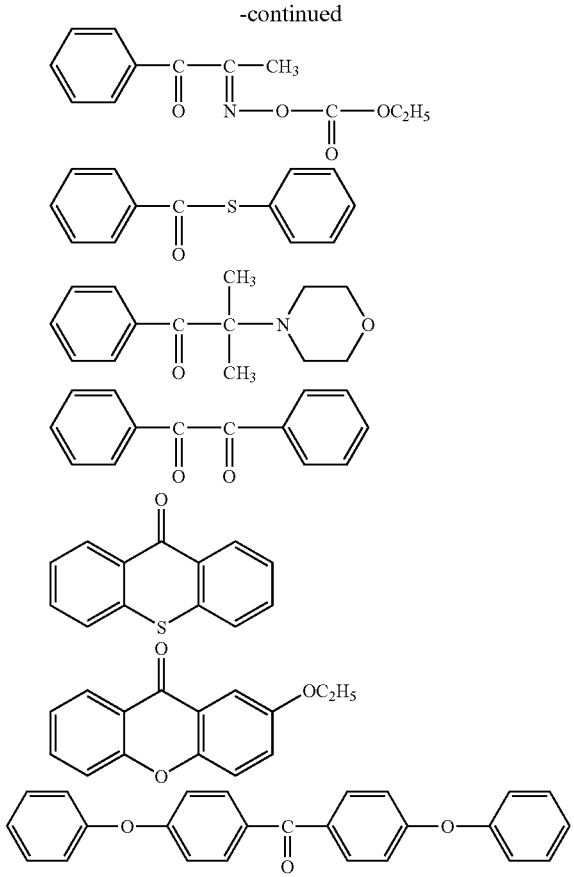

Examples of the particularly preferred aromatic ketones (a) are expained as follows.

α-Thiobenzophenone compounds as described in JP-B No. 47-6416, and benzoin ether compounds as described in JP-B No. 47-3981, for example, the following compound, are included.

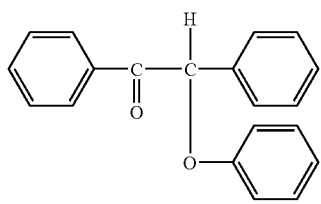

α-Substituted benzoin compounds, for example, the following compound, as described in JP-B No. 47-22326, is included.

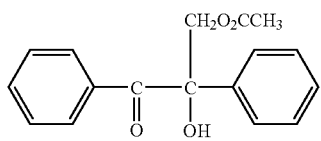

Benzoin derivatives as described in JP-B No. 47-23664, aroylphosphonic acid esters as described in JP-A No. 57-30704, dialkoxybenzophenones as described in JP-B No. 60-26483, for example, the following compound, is exemplified.

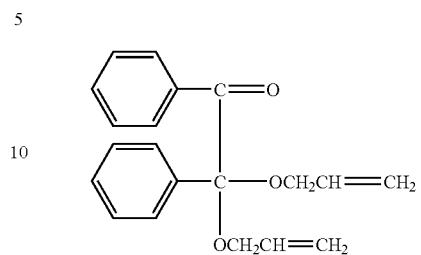

Benzoin ethers as described in JP-B No. 60-26403 and JP-A No. 62-81345, for example, the following compound, is exemplified.

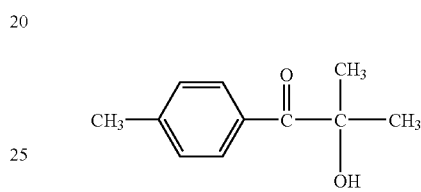

α-Aminobenzophenones, for example, the following compounds as described in JP-B No. 1-34242, U.S. Pat. No. 4,318,791, and EP-B No. 0,284,561 A1, are included.

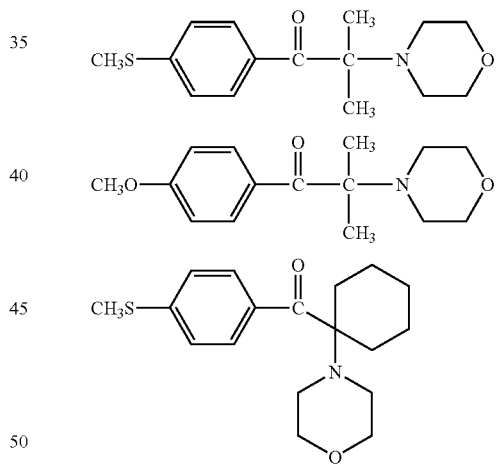

p-Di(dimethylaminobenzoyl)benzene as shown in the following formula, as described in JP-A No. 2-211452, is exemplified.

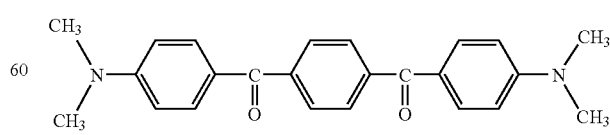

Thio-substituted aromatic ketones as described in JP-A No. 61-194062, for example, the following compound, is exemplified.

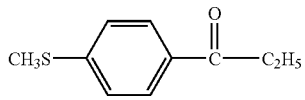

Acylphosphine sulfides as described in JP-B No. 2-9597, for example, the following compounds are exemplified.

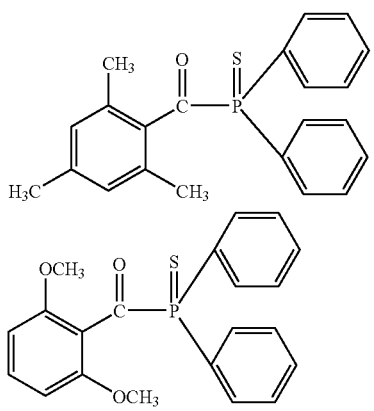

Acylphosphines as described in JP-B No. 2-9596, for example, the following compounds are exemplified.

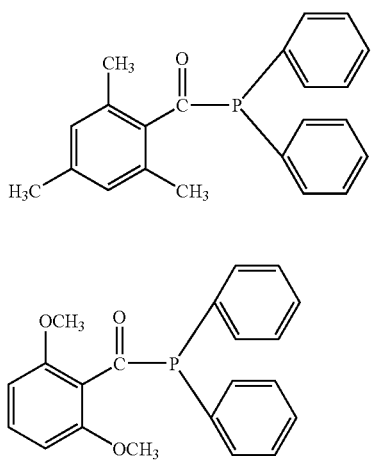

In addition, thioxanthones as described in JP-B No. 63-61950 and coumalins as described in JP-B No. 59-42864 are included.

(b) Oniumu Salt Compounds

As for the onium salt compounds (b) which are preferred as the structure having polymerization initiation ability in the invention, compounds as shown by the following formulae (1) to (3) are included.

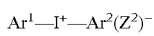  Formula (1)

  Formula (2)

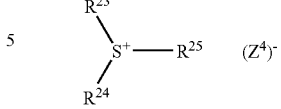  Formula (3)

In the formula (1), $Ar^1$ and $Ar^2$ each independently represents optionally substituted an aryl group of up to 20 carbon atoms. When the aryl group has a substituent or substituents, the preferred substituent includes halogen atoms, a nitro group, alkyl groups of up to 12 carbon atoms, alkoxy groups of up to 12 carbon atoms, or aryloxy groups of up to 12 carbon atoms. $(Z^2)^-$ represents a counter ion selected from the group consisting of halogen ions, perchlorate ions, carboxylate ions, tetrafluoroborate ions, hexafluorophosphate ions, and sulfonate ions, more preferably, perchlorate ions, hexafluorophosphate ions, and arylsulfonate ions.

In the formula (2), $Ar^3$ represents an optionally substituted aryl group of up to 20 carbon atoms. The preferred substituent includes halogen atoms, a nitro group, alkyl groups of up to 12 carbon atoms, alkoxy groups of up to 12 carbon atoms, aryloxy groups of up to 12 carbon atoms, alkylamino groups of up to 12 carbon atoms, dialkylamino groups of up to 12 carbon atoms, arylamino groups of up to 12 carbon atoms, and diarylamino groups of up to 12 carbon atoms. $(Z^3)^-$ represents the same counter ion as $(Z^2)^-$.

In the formula (3), $R^{23}$, $R^{24}$ and $R^{25}$ may be the same or different and each represents an optionally substituted hydrocarbon group of up to 20 carbon atoms. The preferred substituent includes halogen atoms, a nitro group, alkyl groups of up to 12 carbon atoms, alkoxy groups of up to 12 carbon atoms, or aryloxy groups of up to 12 carbon atoms. $(Z^4)^-$ represents the same counter ion as $(Z^2)^-$.

Specific example of the onium salt compound (b) preferably used in the invention includes those described in JP-A No. 2001-133969, paragraph number [0030]-[0033]; JP-A No. 2001-305734, paragraph number [0048]-[0052]; and JP-A No. 2001-343742, paragraph number [0015]-[00461].

(c) Organic Peroxide Compounds

As for the organic peroxide compounds (c) which are preferred as the structure having polymerization initiation ability in the invention, almost all the organic compounds having one or more of oxygen-oxygen linkages within the molecule are included. Such compounds are exemplified by methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexanone, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethyl-hexane-2,5-dihydroperoxide, 1,1,3,3-tetramethylbutyl hydroperoxide, di-tert-butyl peroxide, tert-butylcumyl peroxide, dicumyl perioxide, bis(tert-butylperoxyisopropyl) benzene, 2,5-dimethyl-2,5-di(tert-butylperoxy)hexane, 2,5-hexanoyl peroxide, succinic peracid, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxycarbonate, dimethoxy isopropyl peroxycarbonate, di(3-methyl-3-methyoxybutyl)

peroxydicarbonate, tert-butyl peroxyacetate, tert-butyl peroxy pivalate, tert-butyl peroxyneodecanoate, tert-butyl peroxyoctanoate, tert-butyl peroxy-3,5,5-trimethylhexanoate, tert-butylperoxylaurate, tert-carbonate, 3,3',4,4'-tetra-(t-butyl peroxycarbonyl)benzophenone, 3,3',4,4'-tetra-(t-amyl peroxycarbonyl)benzophenone, 3,3',4,4'-tetra-(t-hexyl peroxycarbonyl)benzophenone, 3,3',4,4'-tetra-(t-octyl peroxycarbonyl)benzophenone, 3,3',4,4'-tetra-(cumyl peroxycarbonyl)benzophenone, 3,3',4,4'-tetra-(p-isopropylcumyl peroxycarbonyl)benzophenone, carbonyl di(t-butylperoxy dihydrogen diphthalate), and carbonyl di(t-hexylperoxy dihydrogen diphthalate).

Among these compounds, peroxy ester types of compounds such as 3,3',4,4'-tetra-(t-butyl peroxycarbonyl)benzophenone, 3,3',4,4'-tetra-(t-amyl peroxycarbonyl)benzophenone, 3,3',4,4'-tetra-(t-hexyl peroxycarbonyl)benzophenone, 3,3',4,4'-tetra-(t-octyl peroxycarbonyl)benzophenone, 3,3',4,4'-tetra-(cumyl peroxycarbonyl)benzophenone, 3,3',4,4'-tetra-(p-isopropylcumyl peroxycarbonyl)benzophenone, and di-t-butyl diperoxy isophthalate are preferably used.

(d) Thio Compounds

As for the thio compounds (d) which are preferred as the structure having polymerization initiation ability in the invention, compounds as shown by the following formula (4) are included.

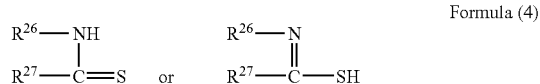

Formula (4)

wherein in the formula (4), $R^{26}$ represents an alkyl group, an aryl group or a substituted aryl group; and $R^{27}$ represents a hydrogen atom or an alkyl group. Alternatively, $R^{26}$ and $R^{27}$ may bond with each other and represents a non-metallic atomic group necessary for forming a 5- to 7-membered ring which may contain a heteroatom selected from oxygen, sulfur and nitrogen atoms.

The alkyl group in the formula (4) includes preferably those of 1 to 4 carbon atoms. The aryl group includes preferably those of 6 to 10 carbon atoms, such as phenyl or naphthyl. The substituted aryl group includes the above-mentioned aryl group substituted by halogen atom such as chlorine atom, alkyl group such as methyl, or alkoxy group such as methoxy or ethoxy. $R^{27}$ is preferably an alkyl group of 1 to 4 carbon atoms. Specific examples of the thio compounds of the formula (4) include the following compounds shown in table 1.

TABLE 1

| No. | $R^{26}$ | $R^{27}$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—CH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |

TABLE 1-continued

| No. | $R^{26}$ | $R^{27}$ |
|---|---|---|
| 14 | C$_6$H$_4$—OCH$_3$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_5$— | |
| 29 | —C$_6$H$_4$—O— | |
| 30 | —N=C(SCH$_3$)—S— | |
| 31 | —C$_6$H$_4$—NH— | |
| 32 | 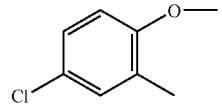 | |

(e) Hexaarylbiimidazole Compounds

As for the hexaaryl biimidazole compounds (e) which are preferred as the structure having polymerization initiation ability in the invention, lophine dimers as described in JP-B Nos. 45-37377 and 44-86516 are included. Such dimers are exemplified by 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluoromethylphenyl)-4,4',5,5'-tetraphenylbiimidazole, and the like.

(f) Ketoxime Ester Compounds

The ketoxime ester compounds (f) which are preferred as the structure having polymerization initiation ability in the invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxymiminobutan-2-one, 2-ethoxycarbonyloxyimino-1-phenylpropan-1-one, and the like.

(g) Borate Compounds

As for the borate compounds (g) which are preferred as the structure having polymerization initiation ability in the invention, compounds as shown by the following formula (5) are included.

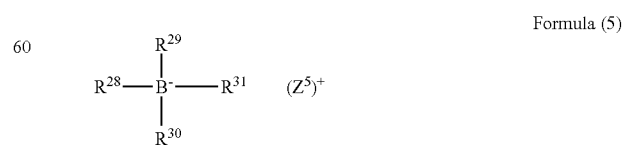

Formula (5)

In the formula (5), $R^{28}$, $R^{29}$, $R^{30}$ and $R^{31}$ may be the same or different and each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group; two or more of $R^{28}$, $R^{29}$, $R^{30}$ and $R^{31}$ may bond with each other to form a cyclic structure; however, at least one of $R^{28}$, $R^{29}$, $R^{30}$ and $R^{31}$ is a substituted or unsubstituted alkyl group. $(Z^5)^+$ represents an alkali metal cation or a quaternary ammonium cation.

As the alkyl group of $R^{28}$ to $R^{31}$, straight chain, branched chain or cyclic alkyl groups of 1 to 18 carbon atoms are preferably included. Specific examples include methyl, ethyl, propyl, isopropyl, butyl, pentyl, hexyl, octyl, stearyl, cyclobutyl, cyclopentyl, cyclohexyl, and the like. The substituted alkyl group, as mentioned above, includes those substituted by halogen atom (e.g., —Cl, —Br), cyano, nitro, aryl group (preferably, phenyl), hydroxy, —COOR$^{32}$ (wherein $R^{32}$ is a hydrogen atom, an alkyl group of 1 to 14 carbon atoms, or aryl group), —OCOR$^{33}$ or —OR$^{34}$ (wherein $R^{33}$ and $R^{34}$ each represents an alkyl group of 1 to 14 carbon atoms, or an aryl group), and those having a group or groups of the following formula as substituent.

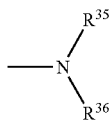

In the above formula, $R^{35}$ and $R^{36}$ each independently represents a hydrogen atom, an alkyl group of 1 to 14 carbon atoms, or an aryl group.

The aryl group of $R^{28}$ to $R^{31}$ includes mono- to tri-cyclic aryl groups such as phenyl and naphthyl. The substituted aryl group includes the aryl groups substituted by a substituent or substituents as mentioned in the substituted alkyl group, or by an alkyl group or groups of 1 to 14 carbon atoms. The alkenyl group of $R^{28}$ to $R^{31}$ includes a straight chain, a branched chain or cyclic alkenyl groups of 2 to 18 carbon atoms. The substituent in the substituted alkenyl group includes those as mentioned as substituents in the substituted alkyl groups. The alkynyl group of $R^{28}$ to $R^{31}$ includes a straight chain or a branched chain alkynyl groups of 2 to 28 carbon atoms, and the substituent in the substituted alkynyl group includes those as mentioned as substituents in the substituted alkyl groups. The heterocyclic group of $R^{28}$ to $R^{31}$ includes 5-membered or larger, preferably 5- to 7-membered heterocyclic groups containing at least one of N, S and O, which heterocyclic groups may contain a condensed ring or rings. These heterocyclic groups may contain a substituent or substituents exemplified as the substituents in the substituted aryl groups. Specific examples of the compounds of the formula (5) include those as described in U.S. Pat. Nos. 3,567,453 and 4,343,891, and European Patent Nos. 109,772 and 109,773, and those as described below.

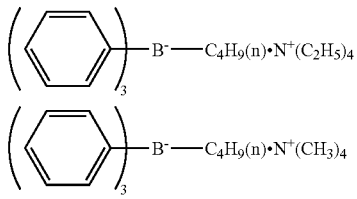

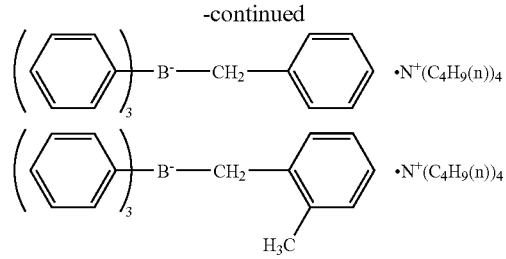

(h) Azinium compounds

As for the azinium salt compounds (h) which are preferred as the structure having polymerization initiation ability in the invention, compounds containing an N—O linkage as described in JP-A Nos. 63-138345, 63-142345, 63-142346 and 63-143537 and JP-B No. 46-42363 are included.

(i) Active Ester Compounds

As for the active ester compounds (i) which are preferred as the structure having polymerization initiation ability in the invention, imidosulfonate compounds as described in JP-B No. 62-6223 and active sulfonates as described in JP-B No. 63-14340 and JP-A No. 59-174831 are included.

(j) Compounds Containing a Carbon-Halogen Linkage

As for the compounds containing a carbon-halogen linkage (j) which are preferred as the structure having polymerization initiation ability in the invention includes: compounds as shown by the following formulae (6) to (12).

Compounds represented by the formula (6):

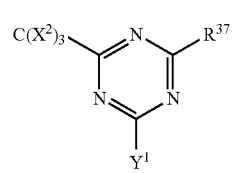

Formula (6)

wherein in the formula (6), $X^2$ represents a halogen atom; $Y^1$ represents —C($X^2$)$_3$, —NH$_2$, —NHR$^{38}$, —NR$^{38}$, or —OR$^{38}$; $R^{38}$ represents an alkyl group, a substituted alkyl group, an aryl group, or a substituted aryl group; $R^{37}$ represents —C($X^2$)$_3$, an alkyl group, a substituted alkyl group, an aryl group, substituted aryl group, or substituted alkenyl group.

Compound represented by formula (7):

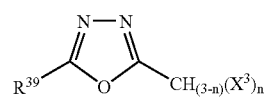

Formula (7)

wherein in the formula (7), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group, or a cyano group; $X^3$ represents a halogen atom; and n indicates an integer of 1 to 3.

Compound represented by the formula (8):

$R^{40}$-$Z^6$-CH$_{(2-m)}$($X^3$)$_m$R$^{41}$         Formula (8)

wherein in the formula (8), $R^{40}$ represents an aryl group or a substituted aryl group; $R^{41}$ represents a group as mentioned below or halogen; and $Z^6$ represents —C(=O)—, —C(=S)— or —SO$_2$—. $X^3$ represents a halogen atom; and m represents 1 or 2.

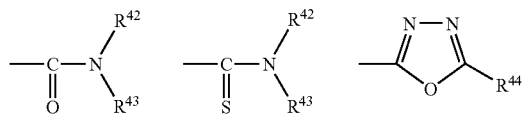

In the above formulae, $R^{42}$ and $R^{43}$ each represents an alkyl group, a substituted alkyl group, an alkenyl group, a substituted alkenyl group, an aryl group, or a substituted aryl group; and $R^{44}$ has the same meanings as $R^{38}$ in the formula (6).

Compounds represented by the formula (9):

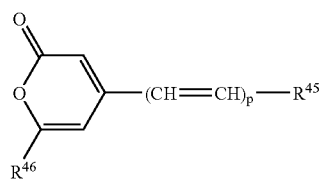

Formula (9)

wherein in the formula (9), $R^{45}$ represents an optionally substituted aryl group or a heterocyclic group; $R^{46}$ represents a trihaloalkyl group of 1 to 3 carbon atoms or a trihaloalkenyl group; and p represents 1, 2 or 3.

Carbonylmethylene heterocyclic compounds having a trihalogenomethyl group represented by the formula (10):

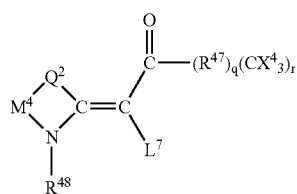

Formula (10)

wherein in the formula (10), $L^7$ represents a hydrogen atom or a substituent of the formula: CO—$(R^{47})$q$(C(X^4)_3)$ r; $Q^2$ represents a sulfur, selenium or oxygen atom, a dialkylmethylene group, an alken-1,2-ylene group, a 1,2-phenylene group or a N—R group; $M^4$ represents a substituted or an unsubstituted alkylene or an alkenylene group, or a 1,2-arylene group; $R^{48}$ represents an alkyl group, an aralkyl group or an alkoxyalkyl group; $R^{47}$ represents a carbocyclic or a heterocyclic divalent aromatic group; $X^4$ represents a chlorine, bromine or iodine atom; and q=0 and r=1, or q=1 and r=1 or 2.

4-Halogeno-5-(halogenomethyl-phenyl)-oxazole derivatives represented by the formula (11):

Formula (11)

[structure]

whrein in the formula (11), $X^5$ represents a halogen atom; t indicates an integer of 1 to 3; s indicates an integer of 1 to 4; $R^{49}$ represents a hydrogen atom or a $CH_{3-t}X^5{}_t$ group; and $R^{50}$ represents an optionally substituted s-valent unsaturated organic group.

2-(Halogenomethyl-phenyl)-4-halogeno-oxazole derivatives represented by the formula (12):

Formula (12)

[structure]

wherein in the formula (12), $X^6$ represents a halogen atom; v indicates an integer of 1 to 3; u indicates an integer of 1 to 4; $R^{51}$ represents a hydrogen atom or an $CH_{3-v}X^6{}_v$ group; and $R^{52}$ represents an optionally substituted u-valent unsaturated organic group.

Specific examples of the compounds containing a carbon-halogen linkage include, for example, compounds as described in Wakabayashi, et al., Bull. Chem. Soc. Japan, 42, 2924 (1969), for example, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, 2-(α,α,β-trichloroethyl)-4,6-bis(trichloromethyl)-S-triazine, and the like. In addition, compounds as described in British Patent No. 1,388,492, for example, 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine, 2-(p-methoxystyryl)-4-amino-6-trichloromethyl-S-triazine, and the like; compounds as described in JP-A No. 53-133428, for example, 2-(4-methoxy-naphth-1-yl)-4,6-bis-trichloromethyl-S-triazine, 2-(4-ethoxy-naphth-1-yl)-4,6-bis(trichloromethyl)-S-triazine, 2-[4-(2-ethoxyethyl)-naphth-1-yl]-4,6-bis(trichloromethyl)-S-triazine, 2-(4,7-dimethoxy-naphth-1-yl)-4,6-bis-trichloromethyl-S-triazine, 2-(acenaphth-5-yl)-4,6-bis-trichloromethyl-S-triazine, and the like; and compounds as described in German Patent No. 3337024, for example, compounds as described below, are included.

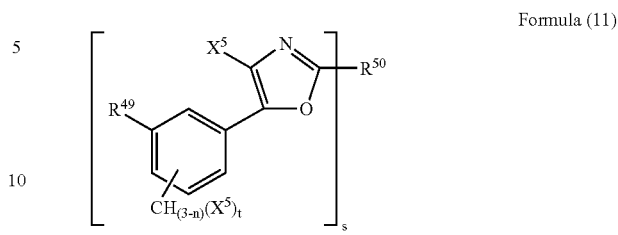

-continued

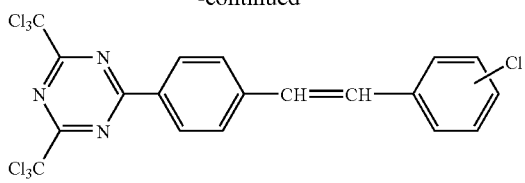

In addition, compounds as described in F. C. Schaefer, et al., J. Org. Chem., 29, 1527 (1964), for example, 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine, 2-methoxy-4-methyl-6-trichloromethyl-S-triazine, and the like, are included. In addition, the following compounds as described in JP-A No. 62-58241 are exemplified.

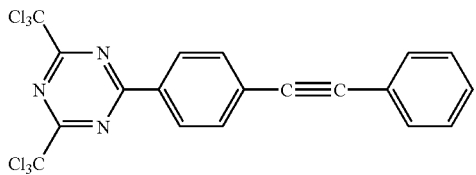

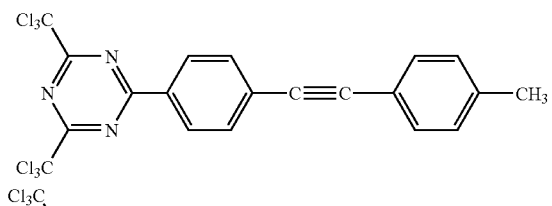

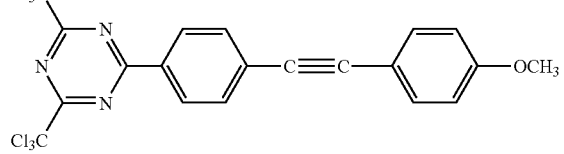

In addition, the following compounds as described in JP-A No. 5-281728 are exemplified.

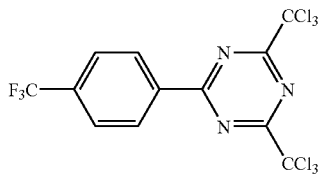

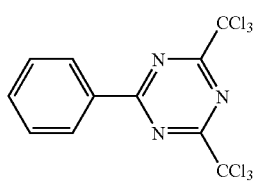

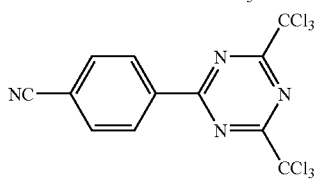

Moreover, a group of compounds which can readily be synthesized by a person skilled in the art according to the synthetic process as described in M. P. Hutt, E. F. Elslager and L. M. Herbel, Journal of Heterocyclic Chemistry, vol. 7 (No. 3), p. 511 (1970), for example, the following compounds are exemplified.

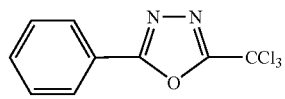

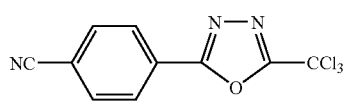

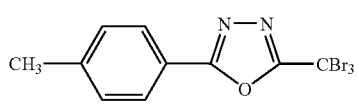

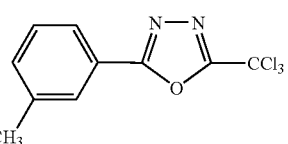

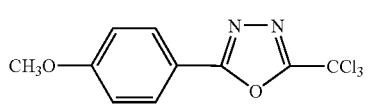

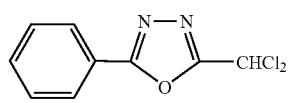

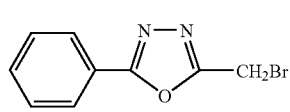

(k) Pyridium Compound

In the invention, examples of (k) the pyridium compound which is preferable as a structure having polymerization initiation ability include the pyridium compound described in JP-A No. 2001-305734, and in particular, the compound having the structure shown below is more preferable TABLE 2
E type
| | R⁵ | R⁶ | R⁷ | R⁸ | R⁹ | R¹⁰ | X |
|---|---|---|---|---|---|---|---|
| II-45 | PhCH₂— | H | H | —CH₂—O—C(O)—C(O)—Ph | H | H | PR₆ |
| II-46 | PhCH₂— | Cl | H | —CH₂—O—C(O)—C(O)—Ph | H | H | TsO* |
| II-47 | PhCH₂— | H | CH₃ | —CH₂—O—C(O)—C(O)—Ph | H | H | BF₄ |
| II-48 | C₇H₁₅— | H | H | —CH₂—O—C(O)—C(O)—CH₃ | H | H | PF₆ |
| II-49 | C₇H₁₅— | H | H | —CH₂—O—C(O)—C(O)—Ph | H | H | PF₆ |
| II-50 | CH₃ | H | H | —CH₂—O—C(O)—C(O)—C₇H₁₅ | H | H | TsO* |
| II-51 | C₇H₁₅— | H | H | H | —CH₂—O—C(O)—C(O)—Ph | H | PF₆ |
TsO* = H₃C—C₆H₄—SO₃
TABLE 3
E type
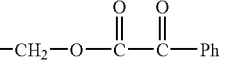
| | R⁵ | R⁶ | R⁷ | R⁸ |
|---|---|---|---|---|
| II-52 | PhCH₂— | CH₃ | H | H |
| II-53 | PhCH₂— | H | H | H |

TABLE 3-continued

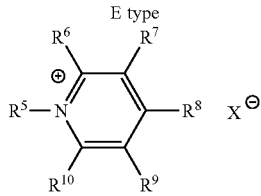

| | R⁶ | R⁷ | R⁸ |
|---|---|---|---|
| II-54 | CF₃–⟨phenyl⟩–CH₂– | H | H | —O—C(O)—C(O)—Ph |
| II-55 | CF₃–⟨phenyl⟩–CH₂– | H | H | H |
| II-56 | ⟨phenyl⟩–CH₂– | H | H | —CH₂—O—C(O)—C(O)—⟨phenyl⟩—OCH₃ |
| II-57 | ⟨phenyl⟩–CH₂– | H | H | —CH₂—O—C(O)—C(O)—⟨phenyl⟩—CF₃ |

| | R⁹ | R¹⁰ | X |
|---|---|---|---|
| II-52 | —CH₂—O—C(O)—C(O)—Ph | H | PF₆ |
| II-53 | H | —CH₂—O—C(O)—C(O)—Ph | PF₆ |
| II-54 | H | H | BF₄ |
| II-55 | H | —CH₂—O—C(O)—C(O)—Ph | PF₆ |
| II-56 | H | H | PF₆ |
| II-57 | H | H | BF₄ |

In the structure having polymerization initiation ability, it is preferred that the aromatic ketones or triazines having the structure as mentioned below are pendent on a polymerizable group.

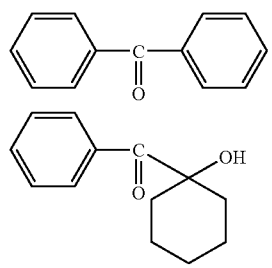

In the structure having a polymerization initiation ability, only one may be pendent on the polymerizable group, or two or more of such structure may be pendent on the polymerizable group.

The polymerizable group on which the structure having a polymerization initiation ability is pendent includes those allowing radical, anionic or cationic polymerization such as acryl, methacryl, acrylamido, methacrylamido, or vinyl. Among them, particularly preferred one is acryl or methacryl because it is an easily synthesizable group.

In the invention, as a specific example of copolymer component having a functional group capable of initiating polymerization, monomers having the following structure are exemplified.

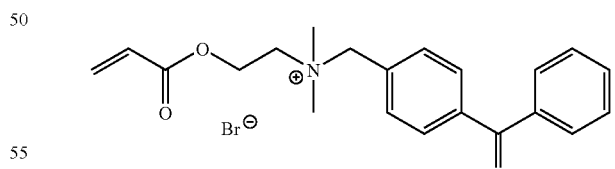

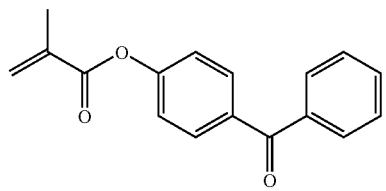

-continued

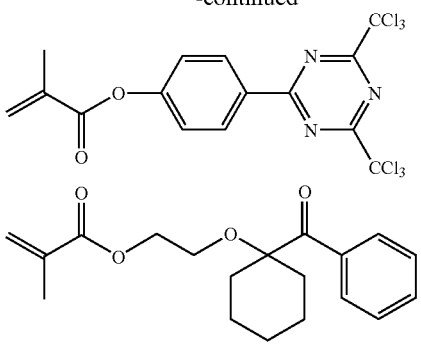

[Copolymer Components Having Cross-linking Groups]

In the invention, it is preferred that a copolymer component having a cross-linking group, which constitutes a specific polymerization initiating polymer, is a monomer having a polymerizable group allowing radical, anionic or cationic polymerization, on which the so far known cross-linking group (a functional group having the structure used in cross-linking reactions) is pendent at side chains as described in Shinji Yamashita (Editor), "Handbook of Cross-linking Agents". That is, this copolymer component has a cross-linking group together with a polymerizable group which is polymerizable within the molecule.

Among the so far known cross-linking groups, it is preferable to use those in which a carboxylic acid group (—COOH), hydroxyl group (—OH), amino (—NH$_2$) or isocyanate (—NCO) is pendent on the polymerizable group.

In such a cross-linking group, only one group may be pendent on the polymerizable group, or two or more groups may be pendent on the polymerizable group.

As for the polymerizable groups on which a cross-linking group is pendent, those allowing radical, anionic or cationic polymerization such as acryl, methacryl, acrylamido, methacrylamido, or vinyl are included. Among them, particularly preferred one is acryl or methacryl because it is an easily synthesizable group.

In the invention, as specific examples of copolymer component having a cross-linking group, monomers having the following structure are exemplified.

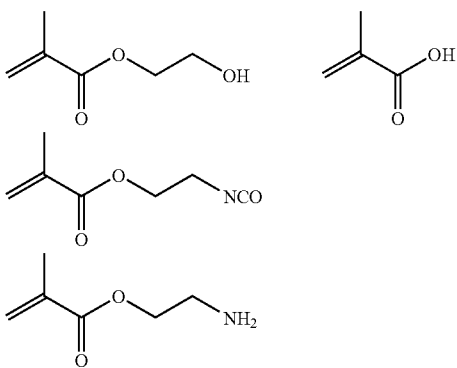

[Other Copolymerization Component]

The third copolymerization component shown below may be used for the specific polymerization initiation polymer of the invention in order to adjust the film forming property, the hydrophilic/hydrophobic properties, solvent solubility, polymerization initiation property and the like.

Any compound can be used as the third copolymerization component so far as it is a radical, anionic or cationic polymerizable compound. Preferable examples of the compound include an acryl monomer and a methacryl monomer to which an alkyl group having 1 to 20 carbon atoms is pendent. At this time, the alkyl group may be substituted with any substituent.

When the structure having polymerization initiation ability is a system initiating polymerization by hydrogen extraction of benzophenones and the like, it is preferable to use isopropyl methacrylate as another copolymerization component because initiation efficiency is raised.

It is preferable to copolymerize a monomer having a quatery ammonium salt structure, because the organic solvent durability of the polymerization initiation layer containing the specific polymerization initiation polymer is increased.

Further, it is preferable to use a monomer containing a hydrophilic group such as methacrylic acid as the third copolymerization component in order to let the polymerization initiation layer containing the specific polymerization initiation polymer be hydrophilic.

These other copolymerization components may be used alone and 2 or more thereof may be used.

As the copolymerization molar ratio of (A) a copolymerization component having the polymerization initiation group, (B) a copolymerization component having the cross-linking group and (C) the third copolymerization component in the specific polymerization initiation polymer of the invention, it is preferable that (A) is 1% by mol or more, (B) is 10% by mol or more and (C) is 0% by mol or more. It is preferable that (A) is 1 to 50% by mol, (B) is 10 to 70% by mol and (C) is 1 to 70% by mol. It is more preferable from the viewpoint of the film property of the polymerization initiation layer after a graft polymerization reaction and a cross-linking reaction that (A) is 5 to 30% by mol, (B) is 20 to 70% by mol and (C) is 1 to 70% by mol. When more than one third copolymerization component are used, (C) indicates the sum of these third copolymerization components.

Further, the average molecular weight of the specific polymerization initiation polymer of the invention is preferably 10000 to 10 million, more preferably 10000 to 5 million and further preferably 100000 to one million, from the viewpoints of solubility to the monomer solution of the polymerization initiation layer, and the like.

The specific polymerization initiating polymer of the invention can be synthesized by copolymerizing the above-mentioned copolymer components. Though the copolymer can be synthesized in any way of polymerization, it is preferred to utilize a radical polymerization reaction in view of the convenience of the reaction.

Though the specific polymerization initiating polymer of the invention can be explained as mentioned above, the synthesis of the initiating polymer is not limited to that by copolymerization. For example, a polymer containing a polymerization initiating group on the side chain is first synthesized and thereafter a proper amount of cross-linking group is introduced therein to give the specific polymerization initiating polymer of the invention. Alternatively, one monomer unit which contains a polymerization initiating group together with a cross-linking group is polymerized to give the specific polymerization initiating polymer of the invention.

Although specific examples of the specific polymerization initiation polymer of the invention are shown below, the invention is not limited to these. The numerical values shown in the specific examples show the molar copolymerization ratio of respective repeating units.
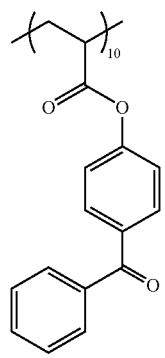 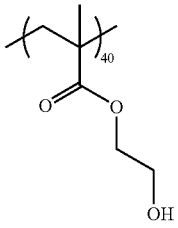 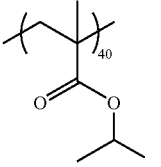
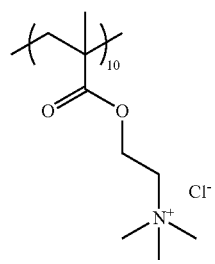 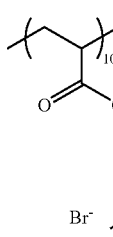
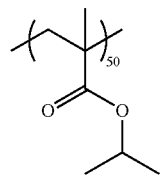 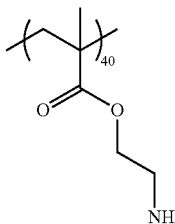
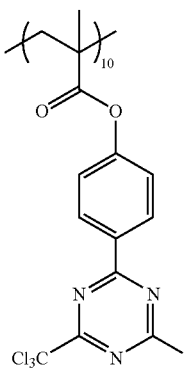 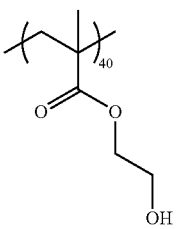 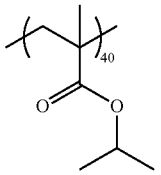
-continued
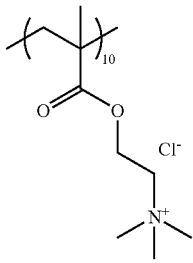 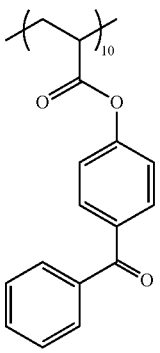
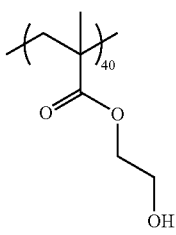 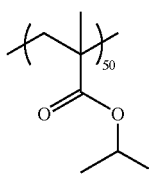
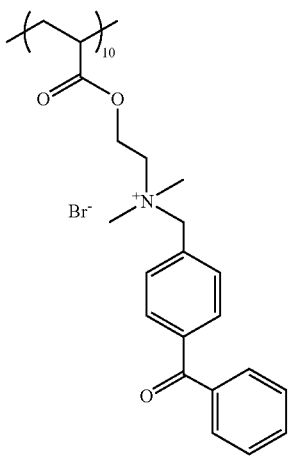 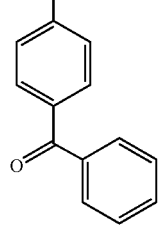
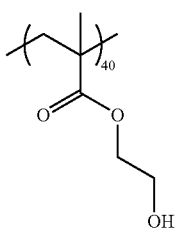 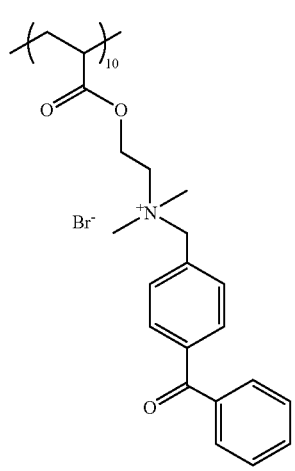

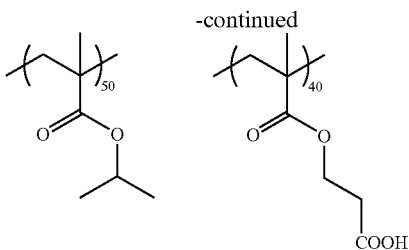

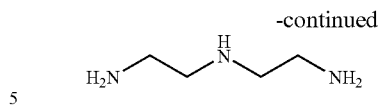

[Polymerization Initiating Layer Formed by Fixing the Specific Polymerization Initiating Polymer by a Cross-linking Reaction]

In the step of forming a polymerization initiating layer, as methods for fixing the specific polymerization initiating polymer by a cross-linking reaction, there are a method for utilizing a self-condensation reaction of the specific polymerization initiating polymer and a method of using a cross-linking agent, and it is preferred to use a cross-linking agent. A method for using a cross-linking agent and a self-condensation reaction of the specific polymerization initiation polymer may be used together.

As for a method for utilizing a self-condensation reaction of the specific polymerization initiation polymer, for example, when the cross-linking group is —NCO, the self-condensation reaction proceeds with heating; this characteristic is utilized in this reaction. The cross-linking structure is formed with proceeding of the self-condensation reaction.

As for the cross-linking agent used in the method of using a cross-linking agent, the so far known agents as described in Shinji Yamashita (Editor), "Handbook of Cross-linking Agents" can be used.

The preferred combination of the cross-linking group contained in the specific polymerization initiating polymer and the cross-linking agent are as follows: (cross-linking group, cross-linking agent)=(—COOH, polyvalent amine), (—COOH, polyvalent aziridine), (—COOH, polyvalent isocyante), (—COOH, polyvalent epoxy), (—NH$_2$, polyvalent isocyante), (—NH$_2$, aldehydes), (—NCO, polyvalent amine), (—NCO, polyvalent isocyanate), (—NCO, polyvalent alcohol), (—NCO, polyvalent epoxy), (—OH, polyvalent alcohol), (—OH, polyvalent halogenated compound), (—OH, polyvalent amine), and (—OH, acid anhydride). In particular, (functional group, cross-linking agent)=(—OH, polyvalent isocyanate) is a more preferred combination in view of the urethane linkage being generated after cross-linking and highly strong crosslink being formed.

Specific examples of the cross-linking agents used in the invention include those having the following structure.

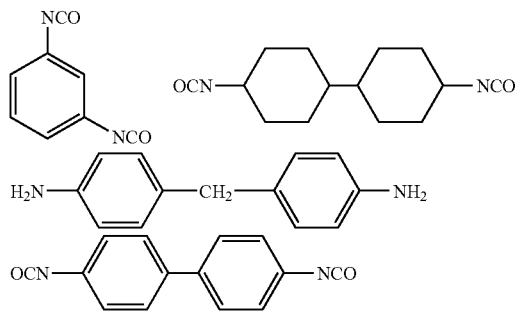

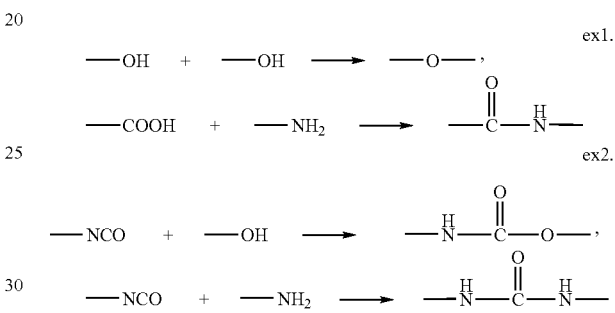

Such a cross-linking agent is added to a coating solution containing the specific polymerization initiating polymer at the time of coating of the polymerization initiating layer. Thereafter, the coated film can form the firm cross-link structure with proceeding of the cross-linking reaction by heat during drying under heating. In particular, the cross-linking reaction proceeds with the dehydration reaction as shown in ex 1 and the addition reaction as shown in ex 2 to form the crosslink structure. The reaction may preferably be carried out under the condition of a temperature from 50 to 300° C., more preferably from 50 to 150° C., and even more preferably from 80 to 150° C.

The amount of the cross-linking agent to be added to the coating solution, though it is altered depending on the amount of the cross-linking group contained in the specific polymerization initiating polymer, is usually preferred in the range of 0.01 to 50 equivalent for the mole number of the cross-linking group, more preferably in 0.01 to 10 equivalent, and even more preferably in 0.5-3 equivalent, in view of the degree of cross-linking and elution of the cross-linking agent.

In the invention, one of known cross-linking reactions such as the above-mentioned self condensation reaction, dehydration reaction and addition reaction may be used as the cross-linking reaction of the polymerization initiation layer, and 2 or more of cross-linking reactions may be used in combination. For example, the polymerization initiation layer having a firmer cross-linking structure can be formed by using in combination the self condensation reaction and the cross-linking reaction using a cross-linking agent.

[Support]

There is no limitation in the support used in the invention as far as it is a dimensionally stable plate satisfying necessary flexibility, strength, durability, and so on. Such a support is exemplified by paper, paper laminated with plastic (e.g., polyethylene terephthalate, polyethylene naphthalate, polyethylene, polypropylene, polystyrene, etc.), metal plate (e.g., aluminum, zinc, copper, etc.), plastic film (e.g., cellulose diacetate, cellulose triacetate, cellulose propionate, cellulose butyrate, cellulose acetate butyrate, cellulose nitrate, polyethylene terephthalate, polyethylene naphthalate, polyethylene, polystyrene, polypropylene, polycarbonate, polyvinylacetal, etc.), and paper or plastic film laminated or vapor-deposited with the metal as mentioned above.

As for the support used in the invention, polyester film or aluminum plates are preferred, and polyester film is more preferred. In addition, an aluminum laminated or vapor-deposited plastic film is preferred, too.

[Film Formation of the Polymerization Initiating Layer]

In this step, the specific polymerization initiation polymer is dissolved in a proper solvent to give a coating solution, which is placed on a support, for example by coating, and the solvent is then removed to form film with proceeding of a cross-linking reaction.

(Solvent)

As for the solvent used in coating of the polymerization initiation layer, there is no particular limitation as far as the specific polymerization initiation polymer is soluble therein. In view of easy drying and workability, it is preferable to choose a solvent of which the boiling point is not so high, specifically those having approximately 40 to 150° C.

Specifically, acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, and the like, are included.

These solvents may be used alone or as a mixture. The content of the solid component in the coating solution is preferably 2 to 50% by weight.

The polymerization initiating layer may be preferably formed with 0.1 to 20 g/m$^2$ of the coating amount (weight after drying), more preferably 1 to 15 g/m$^2$, in view of the polymerization initiation ability and the film characteristics.

The polymerization initiation layer of the invention is obtained by fixing a polymer having functional groups having polymerization initiation ability and cross-linking groups at side chains by a cross-linking reaction. Since a graft polymer is prepared on the surface of the polymerization initiation layer, when a solution containing a compound having a polymerizable group is contacted in the step of preparing the graft polymer described later, the elution, into the solution, of an initiator component (component having polymerization initiation ability) in the polymerization initiation layer can be prevented. Further, since the polymerization initiation layer can aggressively utilize not only a normal radical cross-linking reaction, but also a condensation reaction and an addition reaction, a firmer cross-linking structure can be obtained. As a result, it can be efficiently prevented that the initiator component in the polymerization initiation layer is eluted, the by-product of a homopolymer which is not directly bonded with the surface of the polymerization initiation layer is suppressed, and only the graft polymer which is directly bonded is prepared imagewise on the surface of the polymerization initiation layer.

<(2) Pattern Forming Step>

The patterns comprising the preparation zone and non-preparation zone of a graft polymer, which are formed in the step, are preferably the hydrophilic/hydrophobic patterns. therefore, it is required that the hydrophilicity/hydrophobicity of the preparation zone and non-preparation zone of a graft polymer are mutually in the reverse relation, namely, it is required that a hydrophilic graft polymer is prepared when the polymerization initiation layer exhibiting hydrophobicity is used. On the other hand, it is required that a hydrophobic graft polymer is prepared when the polymerization initiation layer exhibiting hydrophilicity is used. Among these, since the polymerization initiation layer often exhibits hydrophobicity usually, it is preferable that the hydrophilic graft polymer is prepared on the polymerization initiation layer exhibiting hydrophobicity to form the hydrophilic/hydrophobic patterns.

First, a method of preparing the graft polymer on the surface of the polymerization initiation layer is described.

[Graft Polymerization]

In the invention, as the method of preparing the graft polymer on the surface of the polymerization initiation layer, the means generally called as a surface graft polymerization is used. The graft polymerization is a method for snthesis of a graft (grafted) polymer by imparting an active species on the chain of a polymer compound and further bonding and polymerizing the polymer compound to another monomer which initiates polymerization. In particular, when the polymer compound to which an active species are imparted forms a solid surface, it is called as a surface graft polymerization. In the invention, the polymer compound to which an active species are imparted is the above-mentioned specific polymerization initiation polymer.

The graft polymer of the invention includes a polymer obtained by binding a desired polymer with an active species which exists on the chain of a polymer compound in the polymerization initiation layer.

In the invention, in the graft polymerization, a graft polymer is prepared by treating the polymerization initiation layer provided on a support by plasma or electron beam, generating radical on the surface to express polymerization initiation ability, and then reacting the active surface with a compound (for example, a hydrophilic monomer) having a polymerizable group.

[Energy Application for Imparting Active Species to Polymerization Initiation Layer]

A method for energy application for imparting an active species to the polymerization initiation layer, namely the specific polymerization initiation polymer which constitutes the polymerization initiation layer is not specifically limited, and may be any method so far as it is a method of capable of supplying energy that can activate a polymerization initiation group in the polymerization initiation layer and carry out the graft polymerization of a compound having a polymerizable group with the active species. Specifically, preferable examples thereof include active beam irradiation such as exposure from the viewpoints of cost and the simplification of an equipment.

As the active beam usable for supplying energy, ultraviolet rays, visible rays and infrared rays are mentioned. However, among these active beams, ultraviolet rays and visible rays are preferable, and ultraviolet rays are preferable in particular, from the viewpoint of being superior in polymerization speed. The main wave length of the active beam is preferably between 250 nm and 800 nm.

Examples of the light source include a low pressure mercury lamp, a high pressure mercury lamp, a fluorescent lamp, a xenon lamp, a carbon arc lamp, a tungsten incandescent lamp, sun light and the like.

The required time for irradiation of the active beam is usually several seconds to 24 hours depending on the preparation density of a target graft polymer and a light source used.

The preparation of the graft polymer using graft polymerization of the invention is specifically expained below. A method of forming the hydrophilic/hydrophobic patterns comprising the preparation zone and non-preparation zone of a graft polymer by preparing the graft polymer having a hydrophilic group using a hydrophilic compound, on the surface of the polymerization initiation layer having hydrophobicity, is exemplified.

Specifically, the preparation method of the graft polymer using the hydrophilic compound is roughly classified into:

1. a method of providing an upper layer containing the hydrophilic compound having a polymerizable group, on the above-mentioned polymerization initiation layer, then carrying out light irradiation, and binding and polymerizing the hydrophilic compound to the polymerization initiation layer; and 2. a method of immersing a support equipped with the above-mentioned polymerization initiation layer in the solution of the hydrophilic compound having a polymerizable group, carrying out light irradiation, and binding and polymerizing the hydrophilic compound to the polymerization initiation layer.

The preparation method of the graft polymer by graft polymerization using the hydrophilic compound as the compound having a polymerizable group is specifically expained below.

"1. Method of providing upper layer containing hydrophilic compound having polymerizable group on polymerization initiation layer, then carrying out light irradiation, and binding and polymerizing the hydrophilic compound to the polymerization initiation layer"

In the method, an upper layer (hereinafter, suitably referred to as the upper layer merely) containing a hydrophilic compound having a polymerizable group is arranged on the above-mentioned polymerization initiation layer (hereinafter, occasionally referred to as the lower layer) formed on a support, then light irradiation is carried out to prepare an active species in the polymerization initiation layer, and the hydrophilic compound is bound to and polymerized with the active species to form a hydrophilic layer.

As the hydrophilic compound having a polymerizable group which is used for the method, a hydrophilic polymer having a polymerizable group, a hydrophilic macro monomer, a hydrophilic monomer and the like which are shown below can be used, and these can be used in combination. When the hydrophilic polymer having a polymerizable group is used, a chain polymerization reaction is not always required at the time of being bonded on the polymerization initiation layer, and only a small amount of the polymerizable group may be reacted.

(Hydrophilic Polymer Having a Polymerizable Group)

The hydrophilic polymer having a polymerizable group contained in the upper layer means that containing a radical polymerizable group into which is introduced an ethylene-adding polymerizing unsaturated group such as vinyl, allyl or (meth)acryl in the molecule. It is necessary that this hydrophilic polymer containing a radical polymerizable group has a polymerizable group on the terminal of the major chain and/or side chain; and preferably on the terminals of both. Hereinafter, the hydrophilic polymer having the polymerizable group (on the terminal of the major chain and/or side chain) is referred to as a hydrophilic polymer containing a radical polymerizable group.

Such a hydrophilic polymer containing a radical polymerizable group may be synthesized as follows.

The synthetic method includes (a) a method for copolymerizing a hydrophilic monomer with a monomer having an ethylene-adding polymerizing unsaturated group; (b) a method comprising copolymerizing a hydrophilic monomer with a monomer having a double bond precursor, followed by introduction of a double bond by treatment with a base; and (c) a method for reacting the functional group of a hydrophilic polymer with a monomer having an ethylene-adding polymerizable unsaturated group. Among these methods, in view of an aptitude for synthesis, a method for reacting the functional group of a hydrophilic polymer with a monomer having an ethylene-adding polymerizable unsaturated group is particularly preferred.

The hydrophilic monomer used in the synthesis of the hydrophilic polymer containing a radical polymerizable group includes those having a hydrophilic group such as carboxyl, sulfonic acid, phosphoric acid, amino or a salt thereof, hydroxyl, amide or ether, for example, (meth)acrylic acid or alkali metal salts or amine salts thereof, itaconic acid or alkali metal salts or amine salts thereof, 2-hydroxyethyl (meth)acrylate, (meth)acrylamide, N-monomethylol (meth)acrylamide, N-dimethylol (meth)acrylamide, allylamine or hydrohalic acid salts thereof, 3-vinylpropionic acid or alkali metal salts or amine salts thereof, vinylsulfonic acid or alkali metal salts or amine salts thereof, 2-sulfoethyl (meth)acrylate, polyoxyethylene glycol mono(meth)acrilate, 2-acrylamido-2-methylpropane-sulfonic acid, acid phospho-oxypolyoxyethylene glycol mono(meth)acrylate and the like.

The hydrophilic polymer containing a radical polymerizable group constituting the upper layer is a hydrophilic monopolymer or copolymer prepared from at least one selected from these hydrophilic monomers.

In synthesizing the hydrophilic polymer containing a radical polymerizable group by the method (a), as the monomer having an ethylene-adding polymerizing unsaturated group which copolymerizes with a hydrophilic monomer, for example, an allyl-containing monomer is included, specifically allyl (meth)acrylate or 2-allyloxyethyl(meth)acrylate.

In synthesizing the hydrophilic polymer containing a radical polymerizable group by the method (b), as the monomer having a double bond precursor which copolymerizes with a hydrophilic monomer, 2-(3-chloro-1-oxopropoxy)ethyl methacrylate is exemplified.

In synthesizing the hydrophilic polymer containing a radical polymerizable group by the method (c), as the monomer having an unsaturated group for addition-polymerization which is used in introduction of an unsaturated group by utilizing the reaction of a functional group such as the hydroxyl or epoxy group with the carboxylic or amino group or its salt in the hydrophilic polymer, (meth)acrylic acid, glycidyl (meth)acrylate, allyl glycidyl ether, 2-isocyanatoethyl (meth)acrylate, and the like are exemplified.

(Hydrophilic Macromonomer)

The hydrophilic polymer containing a radical polymerizable group contained in the upper layer may be a hydrophilic macromonomer. With respect to the method for producing macromonomers used in the invention, a variety of methods have been proposed, for example, in "Chemistry and Industry of Macromonomers", edited by Yuya Yamashita, Chapter 2 "Synthesis of Macromonomers" published by IPC Press, Sep. 20, 1989.

Particularly useful hydrophilic macromonomer used in the invention includes macromonomers derived from carboxyl-containing monomers such as acrylic acid or methacrylic acid; sulfonic acid macromonomers derived from monomer of 2-acrylamido-2-methylpropanesulfonic acid, vinylstyrenesulfonic acid and salts thereof; amide-type macromonomers derived from (meth)acrylamide, N-vinylacetamide, N-vinylformamide, or N-vinylcarboxylic acid amide monomer; macromonomers derived from hydroxyl-containing monomers such as hydroxyethyl methacrylate, hydroxyethyl acrylate or glycerol monomethacrylate; and macromonomers derived from alkoxy- or ethylene oxide-containing monomers such as methoxyethyl acrylate, methoxypolyethylene glycol acrylate or polyethylene glycol acrylate. In addition, monomers having a polyethylene glycol chain or polypropylene glycol chain may also be used as macromonomers of the invention.

The molecular weight of the particularly useful hydrophilic macromonomers is in the range of 250 to 100,000, particularly in 400 to 30,000.

Further, a hydrophilic monomer may be further added in formation of the upper layer in addition to the above-mentioned hydrophilic polymer containing a radical polymerizable group. Graft chains having a branched structure are formed by further carrying out the graft polymerization of a hydrophilic monomer on the polymerizable group of side chains of the hydrophilic polymer (graft chain) containing a radical polymerizable group bonded with the polymerization initiation layer by adding the hydrophilic monomer. It indicates those in which, when a polymerizable group is situated on the side chains of the graft polymer prepared on the surface of the polymerization initiation layer, the compound (including a monomer, macromer and polymer) having a polymerizable group is further graft-polymerized to prepare graft chains, and the graft chains forms a branched structure. According to the branched structure, the formation density and mobility of the hydrophilic graft chains having high mobility are remarkably improved, therefore further high hydrophilicity is expressed.

The addition amount of the hydrophilic monomer is preferably 0 to 60% by weight based on the total solid content of the upper layer from the viewpoint of coating property.

(Hydrophilic Monomer)

The hydrophilic monomer used together with a hydrophilic polymer containing a radical polymerizable group in formation of the upper layer includes those having a positive charge such as ammonium or phosphonium, or a negative charge or an acidic group capable of dissociating into a negative charge such as sulfonic acid, carboxyl, phosphoric acid or phosphonic acid group. In addition, for example, a hydrophilic monomer having a non-ionic group such as hydroxyl, amide, sulfonamide, alkoxy, or cyano, may also be used.

In the invention, the specific example of the particularly useful hydrophilic monomer used together with a hydrophilic polymer containing a radical polymerizable group includes the following monomers.

Examples of the hydrophilic monomer include (meth)acrylic acid and an alkali metal salt or an amine salt thereof, itaconic acid and an alkali metal salt or an amine salt thereof, allylamine and a hydrogen halide acid salt thereof, 3-vinylpropionic acid and an alkali metal salt or an amine salt thereof, vinylsulfonic acid and an alkali metal salt or an amine salt thereof, styrenesulfonic acid and an alkali metal salt or an amine salt thereof, 2-sulfoethylene(meth)acrylate, 3-sulfopropylene(meth)acrylate and an alkali metal salt or an amine salt thereof, 2-acrylamide-2-methylpropane-sulfonic acid and an alkali metal salt or an amine salt thereof, acid phosphoxypolyoxyethylene glycol mono(meth)acrylate and a salt thereof, 2-dimethylaminoethyl(meth)acrylate and a hydrogen halide acid salt thereof, 3-trimethylammoniumpropyl (meth)acrylate, 3-trimethylammoniumpropyl(meth)acrylamide and N,N,N-trimethyl-N-(2-hydroxy-3-methacryloyloxypropyl)ammonium chloride. Examples of the useful hydrophilic monomer further include 2-hydroxyethyl (meth)acrylate, (meth)acrylamid, N-monomethylol(meth)acrylamide, N-dimethylol (meth)acrylamid, N-vinylpirolidone, N-vinylacetoamide and polyoxyethylene glycol mono (meth)acrylate.

Although the above-mentioned hydrophilic monomers are useful when they are used together with a hydrophilic polymer containing a radical polymerizable group, these monomers may also be used alone in the upper layer and may directly be bonded or polimerized to the polimerization initiation layer by graft polimerization.

(Solvent Used as the Upper Layer Component)

There is no particular limitation in a coating solvent used in the composition for forming an upper layer in the invention, as far as the hydrophilic polymer containing a radical polymerizable group or hydrophilic monomer as major component in the upper layer is soluble therein. Particularly, aqueous solvents such as water or water-soluble solvents are preferred, and it is preferable to add a surface active agent to the solvent or mixture thereof.

The water-soluble solvent means solvents which are miscible with water in an optional ratio, including, for example, alcoholic solvents such as methanol, ethanol, propanol, ethylene glycol or glycerin, acids such as acetic acid, ketone-type solvents such as acetone, and amide-type solvents such as formamide.

The surface active agent to be added to the solvent in case of necessity, which is soluble in the solvent, includes, for example, anionic surfactants such as sodium n-dodecylbenzenesulfonate, cationic surfactants such as n-dodecyltrimethylammonium chloride, and non-ionic surfactants such as polyoxyethylene nonylphenol ether (commercially available, e.g., as Emulgen 910, Kao Corp.), polyoxyethylene sorbitan monolaurate (commercially available, e.g., as "Tween 20" (trade name)), and polyoxyethylene lauryl ether.

The coating amount of the upper layer is preferably in 0.1-10 g/m$^2$ converting into the solid component, particularly in 1-5 g/m$^2$, from the view point of surface hydrophilicity and formation of homogeneous coating film "(2) A method which comprises immersing a substrate having the polymerization initiating layer into a solution of a hydrophilic compound having a polymerizable group, followed by irradiation of light to make the hydrophilic compound bond and polymerize to the polymerization initiating Layer"

In this method, a substrate having the polymerization initiating layer is immersed into a solution of a hydrophilic compound having a polymerizable group, and then light is irradiated to generate an active species on the polymerization initiating layer, to which the hydrophilic compound is directly bonded and polymerized to form a hydrophilic layer.

As for the hydrophilic compound used in this method, the hydrophilic polymer having a polymerizable group, the hydrophilic macromer having a polymerizable group and the hydrophilic monomer having a polymerizable group used in the method (1) can be used alone or togher. When a hydrophilic polymer having a polymerizable group is used as a hydrophilic compound, chain polymerization reaction during the bonding to the polymerization initiating layer is not always necessary. Reaction by a small amount of polymerizable group may also be sufficient.

(Solvent Used for a Solution of a Hydrophilic Compound Having a Polymerizable Group)

There is no particular limitation in a coating solvent used in the solution of a hydrophilic compound having a polymerizable group, as far as the hydrophilic compound containing a polymerizable group is soluble therein. Particularly, aqueous solvents such as water or water-soluble solvents are preferred, and it is also preferred to add a surface active agent to the solvent or mixture thereof.

The water-soluble solvent means solvents which are miscible with water in an optional ratio, including, for example, alcoholic solvents such as methanol, ethanol, propanol, ethylene glycol or glycerin, acids such as acetic acid, ketone-type solvents such as acetone, and amide-type solvents such as formamide.

Further, when the hydrophilic/hydrophobic pattern comprising the preparation zone and non-preparation zone of a graft polymer is formed, it is necessary to prepare the graft polymer having hydrophobicity using a hydrophobic compound as the compound having a polymerizable group when the polymerization initiation layer exhibits hydrophilicity. Examples of the hydrophobic compound used include methacrylates such as butyl methacrylate and isopropyl methacrylate, hydrophobic monomers such as (meth)acrylate and styrene, a hydrophobic macromer using these monomers and a hydrophobic polymer having a polymerizable group. As the preparation method of the graft polymer using a hydrophobic compound having these polymerizable groups, similar methods as the preparation method of the graft polymer using the above-mentioned hydrophilic compound can be used.

The thickness of a graft layer formed by the graft polymer prepared as mentioned above is preferably in the range of 0.001 to 10 $g/m^2$ and more preferably in the range of 0.01 to 5 $g/m^2$ from the viewpoints of the expression of superior mobility which is peculiar to the graft polymer, and the like.

Since the graft polymer prepared as mentioned above is directly bonded with the polymerization initiation layer, it becomes superior in durability.

According to the above-mentioned pattern forming method of the invention, the patterns comprising the preparation zone and non-preparation zone (zone where the polymerization initiation layer is exposed) of the graft polymer can be formed on the polymerization initiation layer. Since the graft polymer is superior in the mobility and has properties with high freedom, the physical property expressed from the graft polymer is different from that of the zone where the polymerization initiation layer is exposed, and clear boundaries can be provided between the preparation zone and non-preparation zone of the graft polymer. Accordingly, the patterns comprising the preparation zone and non-preparation zone of the graft polymer are easily applied to various uses for which minuteness and precision are desired.

In particular, when the preparation zone of the graft polymer forms the hydrophilic/hydrophobic patterns comprising a hydrophilic zone, clear boundaries can be provided between the hydrophilic zone and the hydrophobic zone, therefore the hydrophilic/hydrophobic patterns are also easily applied to various uses.

<(3) Colorant Adhering Step>

The image forming method of the invention is characterized by having (3) the step of adhering a colorant on the preparation zone or non-preparation zone of the graft polymer in addition to the above-mentioned (1) and (2) steps.

In the present step, a visible image is formed by adhering a colorant which can form the visible image, on the preparation zone or non-preparation zone of the graft polymer obtained by the above-mentioned method. Here, the colorant to be adsorbed on the preparation zone or non-preparation zone of the graft polymer may be an inorganic compound or an organic compound so far as it is a substance capable of forming the visible image. The substance capable of forming the visible image indicates a substance having absorption at a visible wavelength region, and the specific examples include a colored dye or pigment, various light-impermeable pigments, and metal fine particles.

Further, when the patterns comprising the preparation zone and non-preparation zone of the graft polymer prepared through the above-mentioned (1) and (2) steps are the hydrophilic/hydrophobic patterns, the colorant to be adhered is required to be selected according to the nature of the graft polymer which forms the hydrophilic or hydrophobic zone.

(Relation Between Polar Group of Hydrophilic Graft Polymer and Colorant)

Specifically, when the hydrophilic group of the hydrophilic graft polymer has negative charge such as a salt of sulfonic acid and a salt of carboxylic acid, the visible image can be formed by adsorbing a molecule having positive charge, for example, a cationic dye.

Examples of the cationic colorant usable for the image forming include a cationic dye, a cationically charged inorganic pigment, metal fine particles and a coated pigment forming a cationic surface layer on its surface, and coated metal fine particles.

Here, as the usable cationic dye, known dyes can be used by being suitably selected in accordance with the purposes such as color tone and image density. It is considered that the cationic dye is electrically pulled to the graft polymer by the function of an acidic group which is a polarity converting group such as the above-mentioned sulfonic acid group and carboxylic acidic group, penetrated not only on the surface of the graft layer but also into the inside, and finally bonded with the acidic group, and then that an image is formed. The image is firmly adsorbed because of ionic interaction, and the image with high density having high fastness is formed with a small amount of dye.

Specific examples of the cationic dye include a dye having an alkylamino bond or an aralkylamino bond at the terminal of chromophore, a dye having an acid amide bond such as a sulfonic acid alkyl amide, and heterocyclic compounds having a group capable of forming cation, such as an azo dye, a methine dye and a thiazole/azo dye. Examples of the skeleton of the cationic dye include triphenylmethane, diphenylmethane, xanthene, acridine, azine, thiazine, thiazole, oxazine and azo. These dyes are described in detail in, for example, "New Dye Chemistry" edited by Yutaka Hosoda, published by GIHODO (1957), pp. 316 to 322.

As an alternative image forming mechanism, for example, when the hydrophilic group of the hydrophilic graft polymer has cationic charge such as an ammonium group, a visible image is formed by adsorbing a molecule having negative charge, for example, an acidic dye and the like.

Examples of the anionic colorant which can be used for the image formation include an acidic dye, an anionically charged inorganic pigment and metal fine particles, and coated pigments and coated metal fine particles on whose surface an anionic surface layer is formed.

As the acidic dyes which can be used herein, known dyes can be used by being suitably selected in accordance with purposes such as color tone and image density. Examples of the acidic dye include dyes of azo-base, anthraquinone-base, triphenylmethane-base, xanthene-base, azine-base and quinoline-base. These dyes can be optionally used. Specific examples of the dye include C.I. Acid Yellow 1, C.I. Acid Orange 33, C.I. Acid Red 80, C.I. Acid Violet 7 and C.I. Acid Blue 93. These dyes are described in detail in, for example, "Dye Hand Book" edited by Organic Synthetic Chemistry Institute, published by MARUZEN (1970), pp. 392 to 471.

Not only the colorant used for forming the visible image can be used alone, but also a plural number of kinds thereof can be used in combination. Further, a plural number of colorants can be used by being mixed in advance to obtain a desired color tone.

Examples of the method of adhering a colorant on the hydrophilic zone or hydrophobic zone include a method of coating a solution in which a colorant molecule is dissolved or dispersed, on the hydrophilic/hydrophobic patterns prepared through the above-mentioned (1) and (2) steps, and a method of immersing a support on which the hydrophilic/hydrophobic patterns are formed, in these solutions or dispersions. In both the cases of coating and immersion, an excessive amount of the colorant are supplied, and the contact time between the solution or dispersion and the hydrophilic zone or hydrophobic zone is preferably 10 seconds to 60 minutes, further preferably about 1 minute to about 20 minutes for carrying out adequate adherence on a desired hydrophilic zone or hydrophobic zone.

The maximum amount of the colorant which can be adhered on the hydrophilic/hydrophobic zones is preferably adhered from the viewpoints of the sharpness, color tone and durability of an image. Further, the concentration of a solution and dispersion is preferably at least about 10 to about 20% by mass from the viewpoint of adherence efficiency.

The amount of these colorants to be used can be suitably selected in accordance with the image forming mechanism and the purpose. When they are introduced by ionic adsorption, an image having high density and high sharpness can be formed by a smaller amount in comparison with the amount of a coloring material or colored material used for a general image forming material.

Further, as the alternative image forming mechanism, a method of adhering a hydrophobic colorant such as oily ink is mentioned. When the image forming mechanism is used, there can be applied either of a method of adhering the colorant to the hydrophobic group of the graft polymer by using the hydrophilic/hydrophobic pattern comprising the polymerization initiation layer exhibiting hydrophilicity and a graft polymer having hydrophobicity, or a method of adhering the colorant on the surface of the hydrophobic zone (namely, the exposed surface of the polymerization initiation layer exhibiting hydrophobicity) where a graft polymer having hydrophilicity is not formed, by using the hydrophilic/hydrophobic pattern comprising the polymerization initiation layer exhibiting hydrophobicity and a graft polymer having hydrophilicity.

When there is used the image forming mechanism that an light-impermeable material such as an inorganic pigment and a metal pigment is adhered (adsorbed) as a colorant, or an light-permeable colored dye is adhered (adsorbed) using a resin film containing a hydrophobic polymer as a support, an light-permeable pattern forming material and a display material such as OHP and electric decorations in streets can also be easily obtained.

A sharp image excellent in image quality and resolution can be formed according to the image forming method of the invention, and further, since the durability of the image formed is good, it has the advantage of capable of being preferably used for various purposes. In this way, wide uses can be expected, i.e., various images in accordance with purposes can be easily formed and image formation with a large area is easy, therefore it can be preferably applied to a planographic printing plate, material display and the like which are described later.

<<Fine Particle Adsorption Pattern Forming Method>>

Next, the fine particle adsorption pattern forming method of the invention is explained in detail.

The fine particle adsorption pattern forming method of the invention has (A) the step of providing a polymerization initiation layer which is obtained by fixing, by a cross-linking reaction, a polymer having functional groups having polymerization initiation ability and cross-linking groups at side chains, on a support (polymerization initiation layer forming step), (B) the step of preparing a graft polymer having a polar group in a pattern shape on the surface of the polymerization initiation layer (hereinafter, referred to as "pattern forming step"), and (C) the step of adsorbing fine particles on the graft polymer (hereinafter, referred to as "fine particle adsorption step").

These (A) polymerization initiation layer forming step, (B) pattern forming step and (C) fine particle adsorption step are specifically described in the explanation of the preferable modes of the invention which are described later.

The preferable modes of the fine particle adsorption pattern forming method of the invention include methods described below. However, the invention is not limited to these methods.

A first preferable mode of the fine particle adsorption pattern forming method of the invention is characterized by having the step of forming a polymerization initiation layer which is obtained by fixing, by a cross-linking reaction, a polymer having functional groups having polymerization initiation ability and cross-linking groups at side chains, on a support (step (A)), the step of forming a pattern comprising a preparation zone and a non-preparation zone of a graft polymer by preparing the graft polymer on the surface of the polymerization initiation layer using graft polymerization, by contacting a compound having a polymerizable group and a polar group on the polymerization initiation layer and supplying energy imagewise (step (B)), and the step of adsorbing fine particles on the graft polymer preparation zone (step (C)).

A second preferable mode of the fine particle adsorption pattern forming method of the invention is characterized by having the step of forming a polymerization initiation layer which is obtained by fixing, by a cross-linking reaction, a polymer having functional groups having polymerization initiation ability and cross-linking groups at side chains, on a support (step (A)), the step of forming a pattern comprising a hydrophilic zone and a hydrophobic zone on the surface of the polymerization initiation layer, by providing a polymer compound layer comprising a polymer compound which is directly and chemically bonded with the polymerization initiation layer and has a functional group whose hydrophilicity or hydrophobicity is changed by heat, acid or radiation and by applying heat, acid or radiation to the polymer compound layer imagewise (step (B)), and the step of adsorbing fine particles on the hydrophilic zone or the hydrophobic zone (step (c)).

First, the first preferable mode of the fine particle adsorption pattern forming method of the invention is explained.

<(A) Polymerization Initiation Layer Forming Step>

In the step, a polymerization initiation layer is formed which is obtained by fixing, by a cross-linking reaction, a polymer having functional groups having polymerization initiation ability and cross-linking groups at side chains, on a support. Regarding the details of this step, the content of (1) the polymerization initiation layer forming step in the above-mentioned pattern forming method of the invention is applied.

Further, the support used in the step is similar to the support used in the above-mentioned pattern forming method of the invention, and is suitably selected depending on the uses of the fine particle adsorption pattern forming material obtained by the forming method.

<(B) Pattern Forming Step>

In the step, a pattern comprising the preparation zone and the non-preparation zone of a graft polymer are formed by contacting a compound having a polymerizable group and a polar group on the polymerization initiation layer and preparing the graft polymer on the surface of the polymerization initiation layer using graft polymerization by imagewise application of energy. Regarding the details of this step, the content of (2) the pattern forming step in the above-mentioned pattern forming method of the invention is applied.

Further, in (B) the pattern forming step, a graft polymer is prepared by using a compound having a polymerizable group and a polar group. As the compound having a polymerizable group and a polar group used herein, a compound having a polymerizable group and, from the viewpoints of the affinity and adsorption property, an ionic group as a polar group is preferable, and more specifically, a compound having a polymerizable group and a hydrophilic group is preferable. Examples of the compound having a polymerizable group and a hydrophilic group include a hydrophilic polymer having a polymerizable group, a hydrophilic macromonomer having a polymerizable group and a hydrophilic monomer having a polymerizable group which are used in (2) the pattern forming step in the above-mentioned pattern forming method of the invention.

<(C) Fine Particle Adsorption Step>

In the step, fine particles are adsorbed on the graft polymer preparation zone formed by the above-mentioned step (B).

1. Fine Particles

The fine particles applied to the step are explained.

The fine particles according to the invention may be fine particles having physical property which can form interaction with the polar group which the graft polymer according to the invention has to be bonded with it. However, the fine particles having charge on their surface are preferable in particular. The fine particles according to the invention may be suitably selected in accordance with the purpose of functional surface formed.

Further, the particle diameter of the fine particles can be selected in accordance with the purpose.

The particle diameter of the fine particles is different in accordance with the purpose. However, it is preferably in the range of 0.1 nm to 1 μm in general, further preferably in the range of 1 nm to 300 nm, and preferably in the range of 1 nm to 100 nm in particular, for effectively provoking interaction with a graft film.

Thus, the reason why the smaller the particle diameter of the fine particles used in the invention is, the more preferable it is, is that when the particle diameter is smaller, the fine particles are easily penetrated into the graft film and can be interacted with the graft film, and then that the adhesion property of the fine particles is improved.

In the preferable mode of the invention, since the fine particles are ionically adsorbed, it is needless to say that the particle diameter and adsorption amount are limited depending on the surface charge of fine particles and the number of ionic groups.

The illustration is given regarding the state of adsorption of the fine particles on the graft polymer of the invention while an ionic group is taken as an example of a polar group. The fine particles are systematically arranged in nearly a single layer state in accordance with the existence state of the ionic group which the graft polymer has, and a plural number of nanoscale fine particles are adsorbed on many ionic groups of a long graft polymer and, as a result, arranged in a multilayer state.

Then, the functional fine particles which can be applied as the fine particles according to the invention are explained by exemplifying specific examples thereof.

1-1. Fine Particles for Optical Material

When the fine particle adsorption pattern forming method of the invention is applied to the preparation of an optical material, it is preferable to use at least one kind of fine particle selected from resin fine particles and metal oxide fine particles, as the functional fine particles.

1-1-1. Resin Fine Particles

Preferable examples of the resin fine particles include those in which the central portion of fine particles, which is called as core, is an organic polymer, and preferable examples of the metal oxide fine particles include silica ($SiO_2$), titanium oxide ($TiO_2$), aluminum oxide ($Al_2O_3$), zinc oxide (ZnO) and stannic oxide ($SnO_2$). Further, so-called transparent pigments such as calcium oxide, aluminum hydroxide, magnesium hydroxide, clay and tarc, pigment fine particles called as white pigment, and the like can be used so far as they are those having a preferable shape which is described below.

Further, as the resin fine particles, those having high hardness are preferable from the viewpoint of durability, and specific examples thereof include spherical fine particles comprising resins such as an acryl resin, a polystyrene resin, a polyethylene resin, an epoxy resin and a silicone resin, and among these, cross-linked resin fine particles are preferable. The particle diameter of the fine particles is preferably in the range of 10 nm to 900 nm in this use and in particular, further preferably in the range of 100 nm to 700 nm which is visible light wavelength. In the mode, particles ionically bonded with a graft polymer are systematically arranged in nearly a single layer state.

1-1-2. Fine Particles Having Optical Property

When the fine particle adsorption pattern forming method of the invention is applied to the preparation of a color filter, a sharp cut filter, a non linear optical material and the like which are used for an optical equipment, any of fine particles having non linear optical effect can be used as the functional fine particles. Examples of the fine particles include semi-conductor fine particles such as CdS, CdSe, $Bi_2O_3$, $Li_2O$, $ZrO_2$, $B_2O_3$, $CeO_2$ and CuCl. In this case, when silica glass or alumina glass is used as a substrate, not only they are used as a color filter and the like, but also they are expected to be used as the non linear optical materials such as an optical switch and a material for optical memory because it was confirmed that the tertiary non linear optical sensitivity is large.

When the non linear optical material is prepared by usual methods, namely, a sol-gel method, an impregnation method, a spattering method, an ion injection method, a melt precipitation method and the like using these fine particles, there have been generated problems that the increase of fine particle concentration in a composite substance is difficult and productivity is lowered because fine particles are very easily agglomerated, etc. In particular, with respect to fine particles in which the concentration is low and the rate of contribution to physical property is low, uses are limited and they are not suitable for image memory, an optical integrated circuit and the like utilizing the tertiary non linear optical effect.

According to the invention, since the fine particles form interaction with the polar group of the graft polymer (for example, ionic bonding) and the polar group exists in the graft polymer at a higher density, the concentration of fine particles can be easily increased. Accordingly, the invention is preferable for such uses as the non linear optical material among optical materials, in particular.

1-2. Fine Particles for Organic Light Emitting Device

When the fine particle adsorption pattern material of the invention is applied to the preparation of organic light emitting devices, it can form organic light emitting devices by using fine particles on which an organic dye molecule excited by hot carrier to be emitted was agglomerated, and forming a layer which contains the fine particles on the surface of a support containing electrodes. As the organic dye used herein, organic dyes shown below are mentioned. However, the organic dye is not limited to those, and suitably selected considering the intended use and the like.

Organic Dye

Examples of the organic dye include oxazole-base dyes such as p-bis[2-(5-phenyloxazole)]benzene (POPOP) which are blue light emission; coummarin-base dyes such as coummarin 2, coummarin 6, coummarin 7, coummarin 24, coummarin 30, coummarin 102 and coummarin 540 which are green light emission; Rohdamine-base (red) dyes such as Rohdamine 6G, Rohdamine B, Rohdamine 101, Rohdamine 110, Rohdamine 590 and Rohdamine 640 which are red light emission; and oxazine-base dyes such as oxazine-1, oxazine-4, oxazine-9 and oxazine-118 which are light emission at a near infrared region and are preferable for an optically functional element which is particularly suitable for optical communication.

Further, cyanine-base dyes such as phthalocyanine and cyanine iodide are also mentioned. It is preferable for thin film formation to select a dye which is easily dissolved in a polymer such as an acryl resin when these dyes are selected. Examples of the dye include POPOP, coummarin 2, coummarin 6, coummarin 30, Rohdamine 6G, Rohdamine B and Rohdamine 101.

The organic dye may be an organic molecule used for an organic electroluminescence (EL) film, for example, 8-hydroxyquinoline aluminum ($AlQ_3$), 1,4-bis(2,2-diphenylvinyl)biphenyl, a poly(paraphenylenevinylene) derivative (PPV), a distyrylarylene derivative, a styrylbiphenyl derivative, a phenanthroline derivative, or fine particles formed by a medium obtained by adding an additive to the organic molecules.

1-3. Other Fine Particles

As fine particles useful as the fine particles according to the invention other than the above-mentioned fine particles, the under-mentioned fine particles are included.

Namely, there are mentioned metal oxide fine particles such as ferric oxide, cobalt oxide, chromium oxide, stannic oxide and antimony oxide, inorganic compounds such as silicon oxide, zirconium oxide, alumina and magnesium oxide.

The fine particles according to the invention have been explained above by exemplifying Specific examples 1-1 to 1-3. However, the invention is not limited to these, and it is needless to say that the fine particle adsorption pattern having a functional surface which makes use of physical property which functional fine particles have, can be variously constituted in accordance with the purpose.

2. Physical Property of Fine Particles Surface

When the above-mentioned respective fine particles are those which have charge themselves, for example, silica fine particles, the graft polymer having a polar group having reverse charge may be prepared to form patterns.

Further, in the case of fine particles which have no electric charge themselves, fine particles having electric charge can be prepared by using a particle surface modifier having electric charge, and adsorbed on the preparation zone of the graft polymer. The width of selecting fine particles can be broadened by the latter.

It is preferable from the viewpoint of durability that these fine particles are bonded in the maximum amount which can be adsorbed on the polar group which exists in the graft polymer. Further, it is preferable from the viewpoint of the efficiency of expressing functionality of the functional surface that the dispersion concentration in a dispersion in which the fine particles are dispersed is about 10 to about 20% by mass.

Examples of the method of providing the fine particle adsorption pattern by adsorbing the above-mentioned fine particles on the graft polymer include 1) a method of coating a dispersion of fine particles having charge on their surfaces on the preparation zone of the graft polymer obtained through the above-mentioned (A) and (B) steps, 2) a method of immersing in a dispersion of fine particles a support on which patterns comprising the preparation zone and non-preparation zone of a graft polymer are formed, and 3) a method of depositing fine particles on the preparation zone of the graft polymer. Among these, the methods 1) and 2) are preferable. In both the cases of coating and immersion, an excessive amount of electrically charged fine particles are supplied, and the contact time of the dispersion with the preparation zone of the graft polymer is preferably about 10 seconds to about 180 minutes and further preferably 1 minute to about 100 minutes for introducing an adequate ionic bonding between a polar group and an ionic group. At this time, as the dispersion to be used, an aqueous dispersion uniformly dispersed is preferably used.

The reason why an aqueous dispersion is preferable is that since the graft polymer having a polar group has affinity with water, the graft polymer and fine particles are more easily interacted by using the aqueous dispersion. Accordingly, it is preferable from the viewpoint of bettering aqueous dispersion property that the fine particles used in the invention adsorb sodium alkylbenzene sulfonate, sodium alkyl sulfate, sodium dioctyl sulfosuccinate, polyalkylene glycol (for example, polyoxyethylene nonylphenyl ether), a silicone-base dispersion and the like as a dispersant on their surface. The dispersant can be suitably selected in accordance with the kinds of the polar group which the graft polymer has and fine particles adsorbed.

3. Adsorption of Fine Particles to Graft Polymer

The specific mode in which fine particles are adsorbed is mentioned. For example, when a graft polymer having an ionic group such as ammonium which has positive charge as a polar group is prepared on a support, then excessive dispersion is washed with water and further wiped with cotton and the like after the support is immersed in the dispersion of silica fine particles for a predetermined time so that particles are adsorbed in a pattern shape, particles adhered on a portion other than a desired portion are perfectly removed, therefore the fine particle adsorption pattern layer in which the silica fine particles are adsorbed in a pattern shape is formed.

Next, the second preferable mode of the fine particle adsorption pattern forming method of the invention is explained.

<(A) Polymerization Initiation Layer Forming Step>

In the step, a polymerization initiation layer is formed which is obtained by fixing, by a cross-linking reaction, a polymer having functional groups having polymerization initiation ability and cross-linking groups at side chains, on a support; Regarding the details of the step, the content of (1) the polymerization initiation layer forming step in the above-mentioned pattern forming method of the invention is applied.

The support used in the step is similar to the support used in the above-mentioned pattern forming method of the invention, and is suitably selected depending on the uses of the fine particle adsorption pattern forming material obtained by the forming method.

<(B) Pattern Forming Step>

In the step, a pattern comprising the hydrophilic zone and the hydrophobic zone is formed on the surface of the polymerization initiation layer, by providing a polymer compound layer comprising a polymer compound which is directly and chemically bonded with the polymerization initiation layer formed in the step (A) and has functional groups whose hydrophilicity or hydrophobicity is changed by heat, acid or radiation and by applying heat, acid or radiation to the polymer compound layer imagewise.

[Specific Preparation Method of Polymer Compound Layer Comprising Polymer Compound Having Functional Groups in which Hydrophilicity or Hydrophobicity is Changed by Heat, Acid or Radiation]

As the specific preparation method of a polymer compound layer in the step, there is used a method of immersing the polymerization initiation layer provided on a support in a monomer solution having a polarity conversion group and a polymerizable group, then carrying out photo irradiation to prepare active species on the polymerization initiation layer, and directly bonding and polymerizing the monomer for the active species. Further, the polymer compound layer of the invention may be formed by bonding those obtained by preliminarily polymerizing or copolymerizing a polymer compound having a polarity conversion group, with the active species formed in polymerization initiation layer.

There is explained below the polymer compound having functional groups (hereinafter, appropriately referred to as the polarity conversion group) in which hydrophilicity or hydrophobicity is changed by heat, acid or radiation, which constitutes the polymer compound layer of the invention.

As the polarity conversion group, there are two kinds of functional groups which are changed from hydrophobicity to hydrophilicity and functional groups which are changed from hydrophilicity to hydrophobicity.

[Illustration of Functional Groups in which Hydrophilicity or Hydrophobicity is Changed]

Then, there are explained the functional groups (polarity conversion group) in which hydrophilicity or hydrophobicity is changed by heat, acid or radiation. As the polarity conversion group, there are two kinds of functional groups which are changed from hydrophobicity to hydrophilicity and functional groups which are changed from hydrophilicity to hydrophobicity.

(Functional Groups which are Changed from Hydrophobicity to Hydrophilicity)

As the functional groups which are changed from hydrophobicity to hydrophilicity, known functional groups described in literatures can be mentioned. Useful examples of these functional groups include the alkyl sulfonate, disulfone and sulfoneimide which are described in JP-A No. 10-282672, the alkoxyalkyl ester which is described in EP0652483 and WO92/9934, the tert-butyl ester which is described in Macromolecules edited by H. Ito et al, Vol. 21, pp. 1477, and, additionally, the carboxylic acid ester protected by an acid decomposing group such as a silyl ester and a vinyl ester which is described in literatures. However, the functional group is not limited to these. Among these, a secondary alkyl sulfonate group which is shown in the under description, a tertiary carboxylic acid ester group and an alkoxyalkyl ester group which is shown in the under description are superior in particular.

In the invention, the secondary alkyl sulfonate groups which are superior in particular as the functional groups which are changed from hydrophobicity to hydrophilicity is an ester represented by the under-mentioned formula (I).

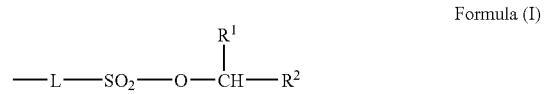

Formula (I)

In the general formula (I), L represents an organic group comprising a polyvalent non metal atom which is necessary for being linked with a polymer skeleton, and $R^1$ and $R^2$ represent a substituted or unsubstituted alkyl group. $R^1$ and $R^2$ may form a ring together with a secondary carbon atom (CH) to which $R^1$ and $R^2$ are bonded.

$R^1$ and $R^2$ of the above-mentioned general formula (I) represent a substituted or unsubstituted alkyl group or a substituted or unsubstituted aryl group, and $R^1$ and $R^2$ may form a ring together with a secondary carbon atom (CH) to which $R^1$ and $R^2$ are bonded. When $R^1$ and $R^2$ represent a substituted or unsubstituted alkyl group, the alkyl group includes linear chain, branched or cyclic alkyl groups such as a methyl group, an ethyl group, an isopropyl group, a tert-butyl group and a cyclohexyl group, and the alkyl group having 1 to 25 carbon atoms is suitably used. When $R^1$ and $R^2$ represent a substituted or unsubstituted aryl group, the aryl group includes a carbocyclic aryl group and a heterocyclic aryl group. As the carbocyclic aryl group, there are used those having 6 to 19 carbon atoms such as a phenyl group, a naphthyl group, an anthracenyl group and a pyrenyl group. Further, as the heterocyclic aryl group, there are used those containing 3 to 20 carbon atoms and 1 to 5 hetero atoms; such as a pyridyl group, a furyl group, additionally, a quinolyl group in which a benzene ring was condensed to prepare a ring, a benzofuryl group, a thioxanthone group and a carbazole group.

When $R^1$ and $R^2$ represent a substituted alkyl group or a substituted aryl group, the substituent usable includes alkoxy groups having 1 to 10 carbon atoms such as a methoxy group and an ethoxy group; halogen atoms such as a fluorine atom, a chlorine atom and a bromine atom; halogen substituted alkyl groups such as a trifluoromethyl group and a trichloromethyl group; alkoxycarbonyl groups or aryloxycarbonyl groups having 2 to 15 carbon atoms such as a methoxycarbonyl group, an ethoxycarbonyl group, a tert-butyloxycarbonyl group and a p-chlorophenyloxycarbonyl group; a hydroxy group; acyloxy groups such as acetyloxy, benzoyloxy and p-diphenylaminobenzoyloxy; carbonate groups such as a tert-butyloxycarbonyloxy group; ether groups such as a tert-butyloxycarbonylmethyloxy group and a 2-pyranyloxy group; substituted or unsubstituted amino groups such as an amino group, a dimethylamino group, a diphenylamino group, a morpholino group and an acetylamino group; thioether groups such as a methylthio group and a phenylthio group; alkenyl groups such as a vinyl group and a steryl group; a nitro group; a cyano group; acyl groups such as a formyl group, an acetyl group and a benzoyl group; aryl groups such as a phenyl group and a naphthyl group; and heteroaryl groups such as a pyridyl group. When $R^1$ and $R^2$ are a substituted aryl group, alkyl groups such as a methyl group and an ethyl group can be used as the substituent in addition to the above-mentioned groups.

The above-mentioned $R^1$ and $R^2$ are preferably a substituted or unsubstituted alkyl group from the viewpoint of superior preservation stability of a sensitive material, and in particular, preferably alkyl groups substituted with an electroattracting group such as an alkoxy group, a carbonyl group, an alkoxycarbonyl group, a cyano group and a halogen group, or alkyl groups such as a cyclohexyl group and a norbornyl group. As the physical property value, a compound in which the chemical shift of the secondary methine proton in proton NMR in deuterio chloroform appears at lower magnetic field than 4.4 ppm is preferable, and a compound in which the chemical shift appears at lower magnetic field than 4.6 ppm is more preferable. Thus, the reason why the alkyl group substituted with an electroattracting group is preferable in particular is considered to be that carbocation which seems to be prepared as an intermediate in thermal decomposition reaction is not stabilized by the electroattracting group therefore decomposition is suppressed. Specifically, as the structure of —CHR$^1$R$^2$, a structure represented by the under-mentioned formula is preferable in particular.

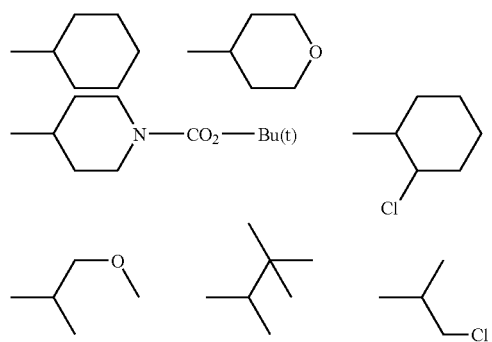

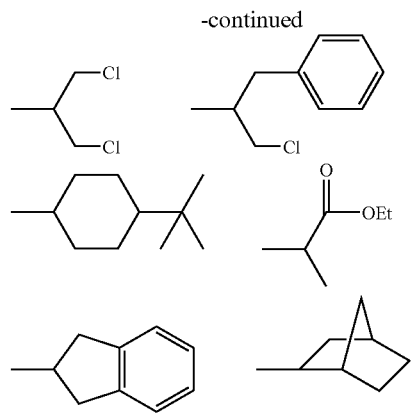

Further, the polyvalent linking group comprising a non metal atom represented by "L" in the above-mentioned general formula (I) consists of 1 to 60 carbon atoms, 0 to 10 nitrogen atoms, 0 to 50 oxygen atoms, 1 to 100 hydrogen atoms and 0 to 20 sulfur atoms. As the more specific linking group, a linking group which is constituted by the under-mentioned structure units in combination can be mentioned.

Polyvalent Naphthalene

Polyvalent Anthracene

When the polyvalent linking group has a substituent, as the substituent, there can be used alkyl group having 1 to 20 carbon atoms such as a methyl group and an ethyl group; aryl group having 6 to 16 carbon atoms such as a phenyl group and an naphthyl group; a hydroxy group, a carboxyl group, a sulfonamide group, a N-sulfonylamide group, an acyloxy group having 1 to 6 carbon atoms such as an acetoxy group, alkoxy groups having 1 to 6 carbon atoms such as a methoxy group and an ethoxy group; halogen atoms such as chlorine and bromine; alkoxycarbonyl groups having 2 to 7 carbon atoms such as a methoxycarbonyl group, an ethoxycarbonyl group and a cyclohexyloxycarbonyl group; a cyano group; carboxylic acid ester groups such as tert-butylcarbonate, etc.

In the invention, the alkoxyalkyl ester groups which are superior in particular as the functional groups which are changed from hydrophobicity to hydrophilicity are those represented by the under-mentioned formula (II).

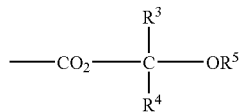

Formula (II)

In the formula (II), $R^3$ represents a hydrogen atom, $R^4$ represents a hydrogen atom or an alkyl group having 18 or less carbon atoms, and $R^5$ represents an alkyl group having 18 or less carbon atoms. Two of $R^3$, $R^4$ and $R^5$ may be bonded to form a ring. In particular, $R^4$ and $R^5$ are preferably bonded to form a 5 or 6-membered ring.

As described above, the secondary alkyl sulfonate group which is represented by the under-mentioned general formula (I) is preferable in particular, as the functional groups of the invention which are changed from hydrophobicity to hydrophilicity.

Specific examples of the functional groups represented by the above-mentioned general formulae (I) to (II) and the tertiary carboxylic acid ester groups are shown below.

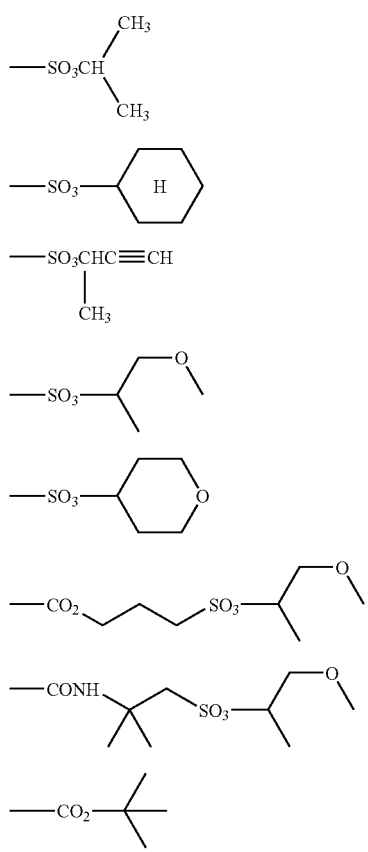

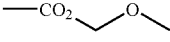

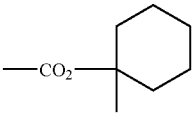

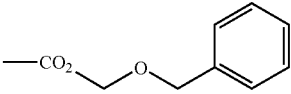

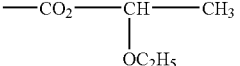

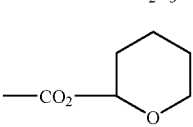

(Functional Groups which are Changed from Hydrophilicity to Hydrophobicity)

In the invention, examples of the functional groups which are changed from hydrophilicity to hydrophobicity by heat, acid or radiation include, but are not specifically limited to, known functional groups. However, a carboxylic acid group and a carboxylic acid salt group represented by the under-mentioned formula (III) are mentioned as preferable groups.

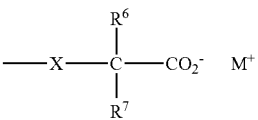

Formula (III)

In the formula (III), X represents —O—, —S—, —Se—, —NR$^8$—, —CO—, —SO—, —SO$_2$—, —PO—, —SiR$^8$R$^9$— and —CS—, and each of R$^6$, R$^7$, R$^8$ and R$^9$ represents independently a monovalent group, and M represents an ion having positive charge.

Specific examples of $R^6$, $R^7$, $R^8$ and $R^9$ include —F, —Cl, —Br, —I, —CN, —R$^{10}$, —OR$^{10}$, —OCOR$^{10}$, —OCOOR$^{10}$, —OCONR$^{10}$R$^{11}$, —OSO$_2$R$^{10}$, —COR$^{10}$, —COOR$^{10}$, —CONR$^{10}$R$^{11}$, —NR$^{10}$R$^{11}$, —NR$^{10}$R$^{11}$, —NR$^{10}$CONR$^{11}$R$^{12}$, —SR$^{10}$, —SOR$^{10}$, —SO$_2$R$^{10}$ and —SO$_3$R$^{10}$.

$R^{10}$, $R^{11}$ and $R^{12}$ are hydrogen, an alkyl group, an aryl group, an alkenyl group and an alkynyl group.

Among these, $R^6$, $R^7$, $R^8$ and $R^9$ are preferably hydrogen, an alkyl group, an aryl group, an alkenyl group and an alkynyl group.

M represents an ion having positive charge. Specific examples of M include a sodium ion, a potassium ion, an ammonium ion, a lithium ion, and a hydrogen ion.

Specific examples of the functional group represented by the above-mentioned general formula (III) are shown below.

-continued

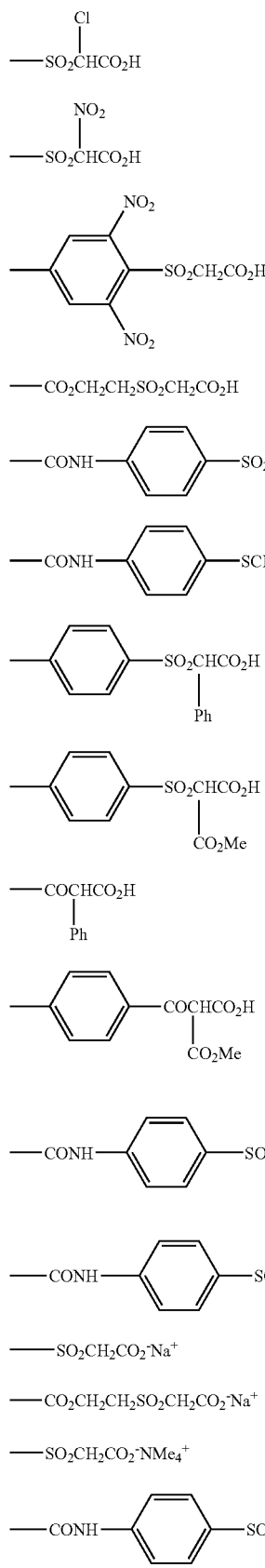

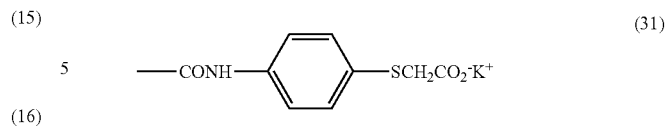

The polymer compound of the invention having a polarity conversion group may be a homopolymer of one monomer having the above-mentioned functional groups, and a copolymer of 2 or more monomers. It may be a copolymer with another monomer so far as it does not damage the effect of the invention.

Specific examples of the monomer having the above-mentioned functional groups are shown below.

(Specific Examples of Monomer Having Functional Groups Represented by Above-Mentioned General Formulae (I) to (II))

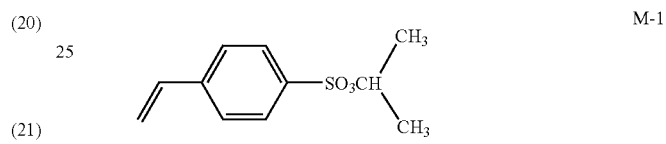
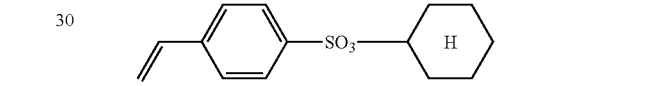
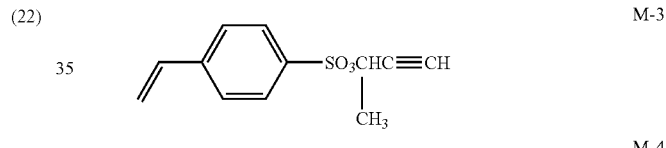
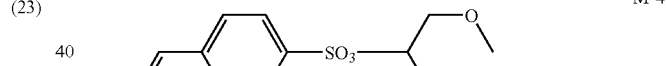
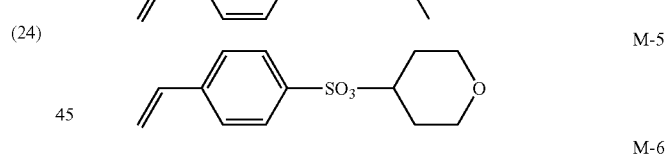
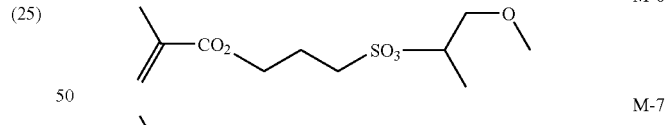
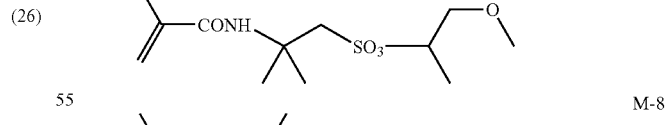
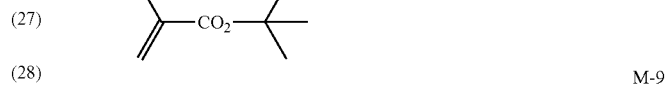
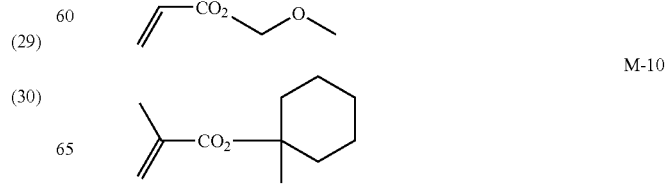

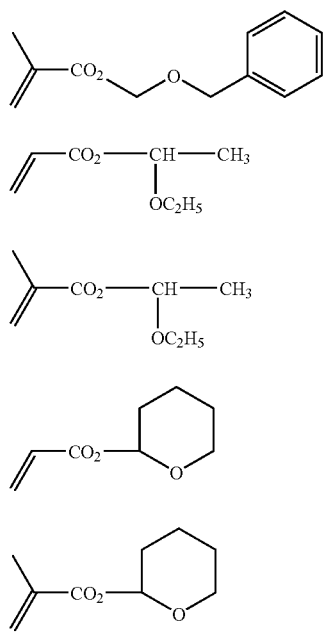

(Specific Examples of Monomer Having Functional Groups Represented by Above-mentioned General Formula (III))

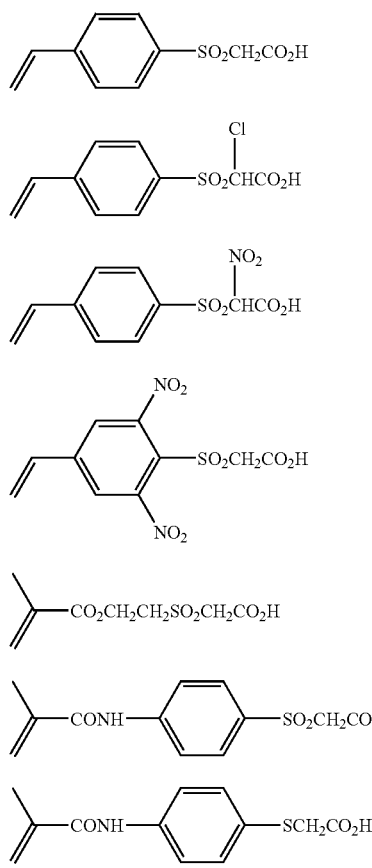

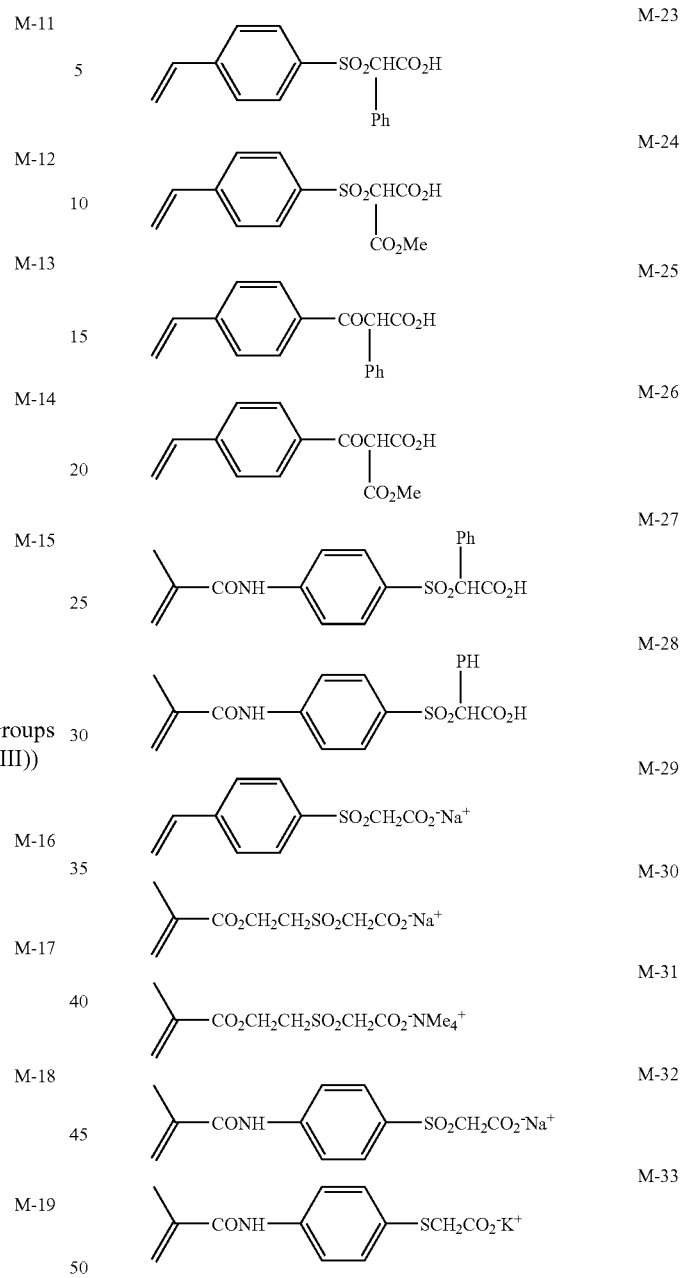

(Photothermal Conversion Substance)

When the formation of the hydrophilic zone and hydrophobic zone (hydrophilic/hydrophobic patterns) by the step is carried out by heat, it is preferable that the photothermal conversion substance is let be contained in any of the photothermal conversion substance layer separately provided between the graft polymer layer, the polymerization initiation layer and the support or between the polymerization initiation layer and the support substrate, and exposed imagewise by IR laser and the like.

As the applicable photothermal conversion substance, all of substances can be used so far as they are substances which absorb light such as ultraviolet rays, visible rays, infrared rays and white beam and convert light to heat. Examples of the substance include carbon black, carbon graphite, a pigment, a phthalocyanine-base pigment, iron powder, graphite powder, ferric oxide powder, lead oxide, silver oxide, chromium oxide, iron sulfide and chromium sulfide. In particular, a dye, a pigment or a metal which effectively absorbs infrared rays of a wavelength of 760 nm to 1200 nm is preferable.

(Acid Generating Substance)

When the formation of the hydrophilic zone and hydrophobic zone (hydrophilic/hydrophobic patterns) by the step is carried out by acid hydrolysis, it is preferable that the acid generating substance is let be contained in any of the photothermal conversion substance layers which were separately provided between the graft polymer layer, the polymerization initiation layer and the support, or between the polymerization initiation layer and the support substrate, and exposed imagewise by active beam.

The acid generating agent is a compound generating an acid by heat or light, and general examples thereof include a photo initiator of photo cationic polymerization, a photo initiator of photo radical polymerization, a photo quenching agent of dyes, a photo discoloring agent, known compounds generating an acid by light which are used for micro resist and the like, and a mixture thereof. These can be used by being suitably selected.

Examples of the compound include diazonium salts described in S. I. Schlesinger, Photogr. Sci. Eng., Vol. 18, 387 (1974), T. S. Bal et al., Polymer, Vol. 21, 423 (1980) and the like; ammonium salts described in U.S. Pat. Nos. 4,069, 055 and 4,069,056, JP-A No. 3-140140 and the like; phosphonium salts described in D. C. Necker et al., Macromolecules, Vol. 17, 2468 (1984), C. S. Wen et al., The Proc. Conf. Rad. Curing ASIA, p 478, Tokyo, October (1988), U.S. Pat. Nos. 4,069,055 and 4,069,056 and the like; iodonium salts described in J. V. Crivello et al., Macromolecules, Vol. 10(6), 1307(1977), Chem. & Eng. News, November 28, p 31 (1988), European Patent No. 104143, U.S. Pat. Nos. 339,049 and 410,201, JP-A Nos. 2-150848 and 2-296514 and the like;

sulfonium salts described in J. V. Crivello et al., Polymer J., Vol. 17, 73 (1985), J. V. Crivello et al., J. Org. Chem., Vol. 43, 3055 (1978), W R. Watt et al., J. Polymer Sci., Polymer Chem. Ed., Vol. 22, 1789 (1984), J. V. Crivello et al., Polymer Bull., Vol. 14, 279 (1985), J. V. Crivello et al., Macromolecules, Vol. 14(5), 1141 (1981), J. V. Crivello et al., J. Polymer Sci., Polymer Chem. Ed., Vol. 17, 2877 (1979), European Patent No. 370693, U.S. Pat. No. 3,902, 114, European Patent Nos. 233567, 297443 and 297442, U.S. Pat. Nos. 4,933,377, 4,491,628, 5041358, 4760013, 4734444 and 2833827, German Patent Nos. 2904626, 3604580 and 3604581 and the like; selenonium salts described in J. V. Crivello et al., Macromolecules, Vol. 10(6), 1307 (1977), J. V. Crivello et al., J. Polymer Sci., Polymer Chem. Ed., Vol. 17, 1047 (1979) and the like; the onium salt of the arsonium salt and the like described in C. S. Wen et al., Teh, Pro. Conf. Rad. Curing ASIA p. 478, Tokyo, October (1988) and the like; organic halogen compounds described in U.S. Pat. No. 3,905,815, Japanese Patent Publication No. 46-4605, JP-A Nos. 48-36281, 55-32070, 60-239736, 61-169835, 61-169837, 62-58241, 62-212401, 63-70243 and 63-298339 and the like; organic metals/organic halogen compounds described in K. Meier et al., J. Rad. Curing, Vol. 13 (4), 26 (1986), T. P. Gill et al., Inorg. Chem., Vol. 19, 3007 (1980), D. Astruc, Acc. Chem. Res., Vol. 19 (12), 377 (1896), JP-A No. 2-161445 and the like;

photo acid generating agents having o-nitrobenzyl type protective group described in S. Hayase et al., J. Polymer Sci., 25, 753 (1987), E. Reichman et al., J. Polymer Sci. Polymer Chem. Ed., 23. 1 (1985), Q. Q. Zhu et al., J. Photochem. 36, 85, 39. 317 (1987), B. Amit et al., Tetrahedron Lett., (24) 2205 (1973), D. H. R. Barton et al., J. Chem. Soc., 3571(1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11(4), (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patent Nos. 0290750, 046083, 156535, 271851 and 0388343, U.S. Pat. Nos. 3,901,710 and 4,181,531, JP-A Nos. 60-198538 and 53-133022 and the like, compounds generating sulfonic acid by optical decomposition which is represented by iminosulfonate and the like, described in TUNOOKA et al., Polymer Preprints Japan, 35(8), G. Berner et al., J. Rad. Curing, 13 (4), W. J. Mijs et al., Coating Technol. 55(697), 45 (1983), Akzo, H. Adachi et al., Polymer Preprints, Japan, 37(3), European Patent Nos. 0199672, 84515, 199672, 044115 and 0101122, U.S. Pat. Nos. 4,618,554, 4,371,605 and 4431774, JP-A Nos. 64-18143,2-245756 and 3-140109 and the like; and disulfone compounds described in JP-A No. 61-166544 and the like.

The patterns comprising the hydrophilic zone and hydrophobic zone on the surface of the polymerization initiation layer can be formed as described above.

<(C) Fine Particle Adsorption Step>

In the step, fine particles are adsorbed on the hydrophilic zone or hydrophobic zone which was formed by the above-mentioned step (B). With respect to the fine particles and the adsorption method thereof which are applied to the step, the similar content as that of the step (C) in the first preferable mode of the above-mentioned fine particle adsorption pattern forming method can be applied.

The fine particles may be used as they are, and surface treatment may be carried out in accordance with the polarity of the graft polymer adsorbed.

According to the fine particle adsorption pattern forming method of the invention which has been explained above, there can be formed the firm and uniform fine particle adsorption pattern which is not peeled by a mechanical operation such as rubbing, by the polymerization initiation layer and the fine particle adsorption site comprising the graft polymer provided on the surface of the polymerization initiation layer, only on desired zones. Since the fine particle adsorption pattern is formed by a simple operation, it can be applied to a large area.

Accordingly, the fine particle adsorption pattern material obtained by the fine particle adsorption pattern forming method of the invention is useful for various uses, for example, optical materials such as a color filter, a sharp cut filter and non linear optical material; an organic light emitting device; a micro lens array; a magnetic material; and an optical switch.

<<Conductive Pattern Forming Method>>

Next, the conductive pattern forming method of the invention is explained in detail.

The conductive pattern forming method of the invention has (i) the step of forming a polymerization initiation layer which is obtained by fixing, by a cross-linking reaction, a polymer having functional groups having polymerization initiation ability and cross-linking groups at side chains, on a support (the "polymerization initiation layer forming step"), (ii) the step of forming a graft polymer having a polar group in a pattern shape on the surface of the polymerization initiation layer (the "pattern forming step"), and (iii) the step of adsorbing a conductive material on the graft polymer (hereinafter, referred to as the "conductive material adsorption step").

These (i) polymerization initiation layer forming step, (ii) pattern forming step and (iii) conductive material adsorption step are specifically described in the explanation of the preferable modes of the invention which are described later.

The preferable modes of the conductive pattern forming method of the invention include methods described below. However, the invention is not limited to these methods.

A first preferable mode of the conductive pattern forming method of the invention is characterized by having the step of forming a polymerization initiation layer which is obtained by fixing, by a cross-linking reaction, a polymer having functional groups having polymerization initiation ability and cross-linking groups at side chains, on a support (step (i)), the step of forming a pattern comprising a preparation zone and a non-preparation zone of a graft polymer, by preparing the graft polymer on the surface of the polymerization initiation layer using graft polymerization, by contacting a compound having a polymerizable group and a polar group on the polymerization initiation layer and supplying energy imagewise (step (ii)), and the step of adsorbing a conductive material on the preparation zone of the graft polymer (step (iii)).

A second preferable mode of the conductive pattern forming method of the invention is characterized by having the step of forming a polymerization initiation layer which is obtained by fixing, by a cross-linking reaction, a polymer having functional groups having polymerization initiation ability and cross-linking groups at side chains, on a support (step (i)), the step of forming patterns comprising the hydrophilic zone and the hydrophobic zone on the surface of the polymerization initiation layer, by providing a polymer compound layer comprising a polymer compound which is directly and chemically bonded with the polymerization initiation layer and has a functional group whose hydrophilicity or hydrophobicity is changed by heat, acid or radiation and by applying heat, acid or radiation to the polymer compound layer imagewise (step (ii)), and the step of adsorbing a conductive material on the hydrophilic zone or hydrophobic zone (step (iii)).

First, the first preferable mode of the conductive pattern forming method of the invention is explained.

<(i) Polymerization Initiation Layer Forming Step and (ii) Pattern Forming Step>

In the step, the polymerization initiation layer and the patterns comprising the preparation zone and non-preparation zone of a graft polymer are formed on a support. Here, in the first preferable mode of the conductive pattern forming method of the invention, the similar content as that of (A) the polymerization initiation layer forming step and (B) the pattern forming step in the first preferable mode of the above-mentioned fine particle adsorption pattern forming method can be applied to (i) the polymerization initiation layer forming step and (ii) the pattern forming step.

The support used in the step is not specifically limited, and is a plate-like article which is stable in dimension. Examples of the plate-like article include a paper, a paper on which a plastic (for example, poly(ethylene terephthalate), polyethylene, polypropylene, polystyrene and the like) is laminated, a metal plate (for example, aluminum, zinc, copper and the like), aplastic film (for example, cellulose diacetate, cellulose triacetate, cellulose propionate, cellulose butyrate, cellulose nitrate, poly(ethylene terephthalate), polyethylene, polystyrene, polypropylene, polycarbonate, poly(vinyl acetal), polyimide and the like), and a paper, plastic film or glass on which the above-mentioned metal is laminated or deposited. Among these, a polyester film, a polyimide film or glass is preferable as the support of the invention, and a polyimide film is preferable in particular.

<(iii) Conductive Material Step>

In the step, the conductive material is adsorbed on the preparation zone of a graft polymer formed by the above-mentioned step (ii).

[Conductive Material]

The conductive material according to the invention may be those capable of being adsorbed on the polar group which the graft polymer has, and among these, conductive fine particles can be preferably used.

The conductive fine particles usable in the invention is not specifically limited so far as they are those having conductivity, and fine particles comprising known conductive materials can be arbitrarily selected to be used. Examples of the fine particles include metal fine particles such as Au, Ag, Pt, Cu, Rh, Pd, Al and Cr; oxide semiconductor fine particles such as $In_2O_3$, $SnO_2$, $ZnO$, $CdO$, $TiO_2$, $CdIn_2O_4$, $Cd_2SnO_2$, $Zn_2SnO_4$ and $In_2O_3$—$ZnO$; fine particles doped with impurities suited for these; spinel type compound fine particles such as $MgInO$ and $CaGaO$; conductive nitride fine particles such as $TiN$, $ZrN$ and $HfN$; and conductive boride fine particles such as $LaB$. As organic materials, conductive polymer fine particles are mentioned as preferable organic materials. An organic component may be adsorbed on these fine particles as a dispersant.

(Relation Between Polar Group of Graft Polymer and Conductive Fine Particles)

When the graft polymer prepared from the above-mentioned (ii) step has an anionic group such as a carboxyl group, a sulfonic acid group or a phosphonic acid group, the preparation zone of the graft polymer comes to selectively have negative charge, and a conductive zone (for example, wiring) is formed here by adsorbing (cationic) conductive fine particles which has positive charge thereon.

As the cationic conductive fine particles, metal (oxide) fine particles having positive charge and the like are mentioned. Fine particles having positive charge at a high density on the surface can be prepared, for example, by a method of Tohru Yonezawa et al, namely, T. Yonezawa, Chemistry Letters, 1999, page 1061, T. Yonezawa, Langumuir 2000, Vol. 16, 5218 and Tohru Yonezawa, Polymer Preprints, Japan, Vol. 49, 2911 (2000). Yonezawa et al. show that metal particle surface chemically modified at a high density by a functional group having positive charge can be formed by utilizing a metal-sulfur bond.

On the other hand, when the graft polymer prepared has a cationic group such as an ammonium group described in JP-A No. 10-296895, the preparation zone of the graft polymer comes to selectively have positive charge, and the conductive zone (wiring) is formed by adsorbing conductive fine particles having negative charge thereon. As the negatively charged metal particles, gold particles or silver particles obtained by citric acid reduction can be mentioned.

The particle diameter of the conductive fine particles used in the invention is preferably in the range of 0.1 nm to 1000 nm, and further preferably in the range of 1 nm to 100 nm from the viewpoints of conductivity performance, heating fusion ability and the strength of the conductive zone.

Here, when a transparent wiring substrate and the like are intended to be obtained, there are used the conductive fine particles whose particle diameter is preferably in the range of 0.2 to 100 nm, and further preferably in the range of 1 to 10 nm from the viewpoint of securing light permeability.

It is preferable from the viewpoint of durability that there is bonded the maximum amount of the above-mentioned conductive fine particles which can be adsorbed on the polar group that the graft polymer has. Further, the dispersion concentration of a dispersion is preferably about 0.001 to about 20% by mass from the viewpoint of securing conductivity.

Examples of the method of adsorbing the conductive fine particles on the polar group that the graft polymer has include a method of coating a solution in which conductive fine particles having charge on their surfaces are dissolved or dispersed, on the preparation zone of the graft polymer, and a method of immersing a support where patterns comprising the preparation zone and non-preparation zone of a graft polymer are formed, in these solutions or dispersions. In both the cases of coating and immersion, an excessive amount of charged fine particles are supplied, and the contact time of a solution or a dispersion with the preparation zone of the graft polymer is preferably about 10 seconds to about 24 hours and further preferably 1 minute to about 180 minutes so that introduction by an adequate adsorption action (for example, adsorption by an ionic bonding) is carried out between a polar group and an ionic group.

In the invention, the conductive fine particles are not only used alone, but also a plural number of them can be used in combination, if necessary. A plural number of materials can also be used by being preliminarily mixed, in order to obtain desired conductivity.

Further, in the first preferable mode of the conductive pattern forming method of the invention, it is preferable that the heating step of heating a conductive material which is adsorbed on the graft polymer is carried out after the conductive material adsorption step. Fusion occurs between adsorbed conductive materials by carrying out the heating step, adhesion property between the conductive materials is improved, and conductivity can also be raised. In particular, when the conductive material is conductive fine particles, the adhesion property between the conductive fine particles is improved by mutual fusion through the heating step even if the conductive fine particles are adsorbed in a rough state. Since the gap between the conductive fine particles is lessened, good conductivity can be expressed.

Here, the temperature used in the heating step is preferably 50° C. to 500° C., further preferably 100° C. to 300° C. and preferably 150° C. to 300° C. in particular.

Then, the second preferable mode of the conductive pattern forming method of the invention is explained.

<(i) Polymerization Initiation Layer Forming Step and (ii) Pattern Forming Step>

In the step, the polymerization initiation layer and the patterns comprising a hydrophilic zone and a hydrophobic zone are formed on a support. In the second preferable mode of the conductive pattern forming method of the invention, the similar content as that of (A) the polymerization initiation layer forming step and (B) the pattern forming step in the preferable second mode of the above-mentioned fine particle adsorption pattern forming method of the invention can be applied to (i) the polymerization initiation layer forming step and (ii) the pattern forming step.

The support used in the step is similar as the support used in the above-mentioned first preferable mode of the conductive pattern forming method of the invention.

<(iii) Fine Particle Adsorption Step>

In the step, the conductive material is adsorbed on the hydrophilic zone or hydrophobic zone formed by the above-mentioned step (ii). With respect to the conductive material and adsorption method thereof which are applied to the step, the similar content as that of the step (iii) in the preferable first mode of the above-mentioned conductive pattern forming method of the invention can be applied.

Also in the second preferable mode of the above-mentioned conductive pattern forming method of the invention, the heating step of heating the conductive material which is adsorbed on the hydrophilic zone or hydrophobic zone is preferably carried out after the (iii) conductive material adsorption step. The conditions of the heating step are similar as those of the step (iii) in the first preferable mode of the conductive pattern forming method of the invention.

In the step, the conductive fine particles may be used as they are, and surface treatment may be carried out in accordance with the polarity of a graft polymer adsorbed.

(Relation Between Polarity Conversion Group of Graft Polymer and Conductive Fine Particles)

Only exposed zone comes to selectively have negative charge in the polymer compound layer comprising a graft polymer having an anion graft polarity conversion functional group such as an alkyl sulfonate group which is represented by the general formula (I) previously and specifically exemplified, and a conductive zone (for example, wiring) is formed by adsorbing here the conductive fine particles having positive charge. As the cationic conductive fine particles which are used herein, metal (oxide) fine particles with positive charge which is described in the above description and the like are used.

In the second preferable mode of the conductive pattern forming method of the invention, since only an exposed portion converts polarity and comes to have the adsorption ability of conductive fine particles, wiring of a plural number of different conductive fine particles can be successively formed on a single support.

Namely, a first circuit is formed by exposing the polymer compound layer, adsorbing one kind of conductive fine particles on the exposed zone and removing excessive conductive fine particles by washing with water. Since the polarity conversion group of an unexposed portion is not influenced at this time, a second circuit can be formed by carrying out imagewise exposure for the same polymer compound layer again to generate polar conversion and adsorbing other conductive fine particles on a new exposed zone. Thus, a circuit having a plural number of different conductivities can be formed by imagewise exposure stepwise on the same substrate.

According to the conductive pattern forming method of the invention which has been explained above, there can be formed the firm and uniform conductive pattern which is not peeled by a mechanical operation such as rubbing, by the polymerization initiation layer and the conductive material adsorption site comprising the graft polymer provided on the surface of the polymerization initiation layer, only on desired zones.

Accordingly, the conductive pattern material obtained by the conductive pattern forming method of the invention can be used for formation of various circuits and a nanoscale conductive pattern can be formed by selecting the pattern forming means, therefore wide uses are expected including the formation of circuits such as a micro machine, an ultra LSI and a print wiring board.

Further, when a transparent film such as PET is used as a support, it can be used as a transparent conductive film on which a pattern is formed. The uses of the transparent conductive film include a transparent electrode for display, a dimming device, a solar cell, a touch panel and other transparent conductive films, and the films are particularly useful as an electromagnetic wave shield filter which is attached to a CRT and a plasma display.

Since the electromagnetic wave shield filter requires high conductivity and transparency, it is preferable to provide conductive material layers in a lattice shape. The line width of the lattice is preferably 20 to 100 μm, and the width of the opening is preferably about 50 to about 600 μm. The lattice may be not always regularly constituted in a straight line, and may be constituted in a curve.

When a polyimide with high heat resistance and flexibility is utilized as the support, it can also be utilized for a flexible wiring substrate. In the invention, since the conductive material layer with an arbitrary pattern shape can be easily formed, various settings can be made in accordance with purposes.

<<Pattern Forming Material>>

Next, pattern forming material of the invention is explained.

The pattern forming material of the invention comprises a support, a polymerization initiation layer formed on the support by using a polymer having functional groups having polymerization initiation ability at side chains, and a pattern comprising a preparation zone and a non-preparation zone of a graft polymer which is directly and chemically bonded on the surface of the polymerization initiation layer.

Respective elements constituting the pattern forming material of the invention are explained below.

[Support]

The support used in the pattern forming material of the invention is similar as the support used in the above-mentioned pattern forming method of the invention, and suitably selected depending on the uses of the fine particle adsorption pattern forming material obtained by the forming method.

[Polymerization Initiation Layer]

The polymerization initiation layer in the pattern forming material of the invention is formed by using a polymer having functional groups having polymerization initiation ability (hereinafter, referred to as the "polymerization initiation group") at side chains. The polymer is not particularly limited so far as it is a polymer in which the polymerization initiation group is pendent at side chains. However, those obtained by polymerizing a monomer having a polymerization initiation group or copolymerizing a monomer having a polymerization initiation group with another monomer are preferable. As the monomer having a polymerization initiation group, a monomer having a polymerization initiation group which is used for constituting the specific polymerization initiation polymer in the (A) polymerization initiation layer forming step of the above-mentioned pattern forming method is preferable.

It is preferable that the polymer having a polymerization initiation group at side chains further has cross-linking groups at side chains. It is more preferable that the polymerization initiation layer is formed by cross-linking a polymer having cross-linking groups at side chains by a cross-linking reaction due to heat. Namely, the polymer is preferably the specific polymerization initiation polymer which is used in the above-mentioned pattern forming method of the invention. Accordingly, it is a preferable mode that the polymerization initiation layer in the pattern forming material of the invention is a layer obtained by fixing the specific polymerization initiation polymer by a cross-linking reaction. The fixation by cross-linking reaction is preferably carried out by a cross-linking reaction using a cross-linking agent, and the cross-liking reaction using such a cross-linking agent is preferably carried out under a temperature condition of 50 to 300° C. With respect to the details of the polymerization initiation layer obtained by fixing the specific polymerization initiation polymer by a cross-linking reaction, the details of the polymerization initiation layer formed in (A) the polymerization initiation layer forming step of the above-mentioned pattern forming method of the invention are applied.

[Patterns Comprising Preparation Zone and Non-preparation Zone of Graft Polymer Directly and Chemically Bonded on Surface of Polymerization Initiation Layer]

The patterns formed by (B) the pattern forming step in the above-mentioned pattern forming method of the invention is applied as patterns comprising the preparation zone and non-preparation zone of a graft polymer.

Further, in the pattern forming material of the invention, it is a preferable mode that the preparation zone of a graft polymer is formed by pattern-shaped application of energy. This is because the preparation zone of a graft polymer is made minute by carrying out the pattern-shaped application of energy such as scanning exposure and as a result, a minute pattern can be formed.

For the pattern forming material of the invention, since the difference in the quality of physical property exists between the preparation zone and non-preparation zone (the exposed zone of a polymerization initiator) of a graft polymer, clear boundaries are provided between the preparation zone and non-preparation zone of a graft polymer. Accordingly, it can be applied to various uses using the patterns.

For example, in the pattern forming material of the invention, the preparation zone of a graft polymer shows hydrophilicity or hydrophobicity, and the hydrophilicity/hydrophobicity of the non-preparation zone (the exposed zone of a polymerization initiation layer) is made different from that of the preparation zone, therefore it can be applied as the material for the hydrophilic/hydrophobic patterns.

[Application of Pattern Forming Material]

Further, the pattern forming material of the invention can be applied to various uses by bestowing various substances to the preparation zone of a graft polymer.

For example, it can be applied as an image forming material by bestowing a colorant to the preparation zone of a graft polymer. The image forming material has the advantages that it can be applied to a large area, has high sharpness and is excellent in uniformity.

It can be applied as a fine particle adsorption pattern forming material by bestowing fine particles to the preparation zone of a graft polymer. The fine particle adsorption pattern forming material has the advantages that the fine particles are firmly and uniformly adsorbed at desired zones and the adhesion property of the fine particles is high.

Further, it can be applied as a conductive pattern material by bestowing a conductive material to the preparation zone of a graft polymer. The conductive pattern material has the advantages that the adhesion property of the conductive material is high, that resolution is high, and that conductivity is stable without disconnection.

<<Planographic Printing Plate>>

Next, the planographic printing plate of the invention is explained in detail.

The planographic printing plate of the invention is characterized by having a pattern comprising a preparation zone and a non-preparation zone of a graft polymer which is directly and chemically bonded on the surface of a polymerization initiation layer which contains a polymer having functional groups having polymerization initiation ability at side chains and is provided on a support, and characterized in that the preparation zone of a graft polymer exhibits hydrophilicity or hydrophobicity, and a hydrophilicity or hydrophobicity of the above-mentioned non-preparation zone is different from that of the preparation zone.

Namely, the planographic printing plate of the invention forms hydrophilic/hydrophobic patterns from the preparation zone and non-preparation zone of a graft polymer, and uses the hydrophobic zone as an image portion and the hydrophilic zone as a non-image portion. For example, in the case of the hydrophilic/hydrophobic pattern which is obtained by preparing a graft polymer having hydrophilicity on the surface of a polymerization initiation layer which exhibits hydrophobicity, wetting water is adsorbed on the hydrophilic zone (the preparation zone of a graft polymer) by supplying wetting water and an oily ink to the plate surface to form a non-image portion, and the hydrophobic zone (the zone comprising the polymerization initiation layer) becomes the hydrophobic oily ink accepting zone to form an image portion. The graft polymer having hydrophilicity is directly bonded with the polymerization initiation layer, and the hydrophilic zone is excellent in water holding capacity derived from the high hydrophilicity and in durability, therefore the occurrence of staining at the non-image portion is effectively suppressed. Further, the image portion is constituted by the polymerization initiation layer exhibiting the hydrophobicity. However, the difference between the hydrophilic zone and the hydrophobic zone is enlarged together with the high hydrophilicity of the hydrophilic zone, an image having excellent image quality can be formed, and further, it has the effect of being excellent in the printing resistance as a printing plate.

EXAMPLES

The invention is explained in detail below with reference to Examples. However, the invention is not limited to this.

Synthesis Example 1

(Synthesis of Specific Polymerization Initiation Polymer A)

To a 300 ml three necked flask, 30 g of propylene glycol monomethyl ether (MFG) was added to be heated at 75° C. Thereto, a solution of 8.1 g of [2-(acryloyloxy)ethyl](4-benzoylbenzyl)dimethylammonium bromide, 9.9 g of 2-hydroxyethyl methacrylate, 13.5 g of isopropyl methacrylate, 0.43 g of dimethyl-2,2'-azobis(2-methyl propionate) and 30 g of MFG was added dropwise over 2.5 hours. Then, the reaction temperature was raised to 80° C., and further reaction was made for 2 hours to obtain the specific polymerization initiation polymer A described below. The numerical values shown in the following structures show the molar copolymerization ratio of respective repeating units.

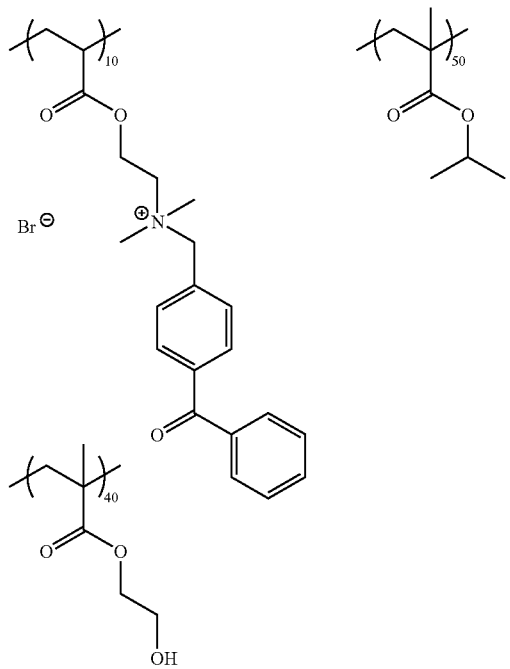

Synthesis Example 2

(Synthesis of Specific Polymerization Initiation Polymer B)

To a 300 ml three necked flask, 30 g of propylene glycol monomethyl ether (MFG) was added to be heated at 75° C. Thereto, a solution of 5.1 g of 4-methacryloyloxy-benzophenone, 9.9 g of 2-hydroxyethyl methacrylate, 9.8 g of isopropyl methacrylate, 3.97 g of [2-(methacryloyloxy)ethyl] trimethylammonium bromide, 0.43 g of dimethyl-2,2'-azobis(2-methyl propionate) and 30 g of propylene glycol monomethyl ether (MFG) was added dropwise over 2.5 hours. Then, the reaction temperature was raised to 80° C., and further reaction was made for 2 hours to obtain the specific polymerization initiation polymer B described below. The numerical values shown in the following structures show the molar copolymerization ratio of respective repeating units.

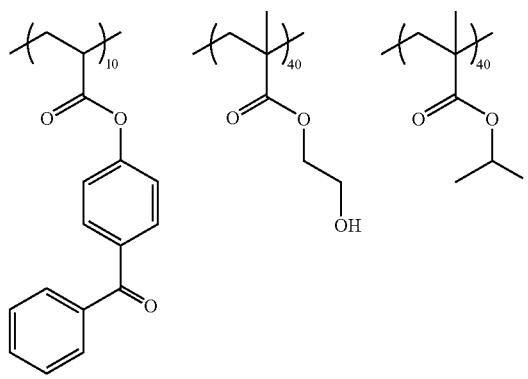

-continued

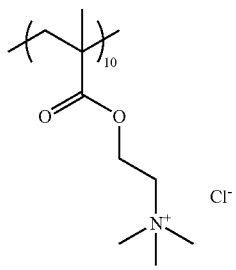

Synthesis Example 3

(Synthesis of Specific Polymerization Initiation Polymer C)

To a 300 ml three necked flask, 30 g of propylene glycol monomethyl ether (MFG) was added to be heated at 75° C. Thereto, a solution of 8.1 g of [2-(acryloyloxy)ethyl](4-benzoylbenzyl)dimethylammonium bromide, 9.9 g of 2-aminoethyl methacrylate, 13.5 g of isopropyl methacrylate, 0.43 g of dimethyl-2,2'-azobis(2-methyl propionate) and 30 g of propylene glycol monomethyl ether (MFG) was added dropwise over 2.5 hours. Then, the reaction temperature was raised to 80° C., and further reaction was made for 2 hours to obtain the specific polymerization initiation polymer C described below. The numerical values shown in the following structures show the molar copolymerization ratio of respective repeating units.

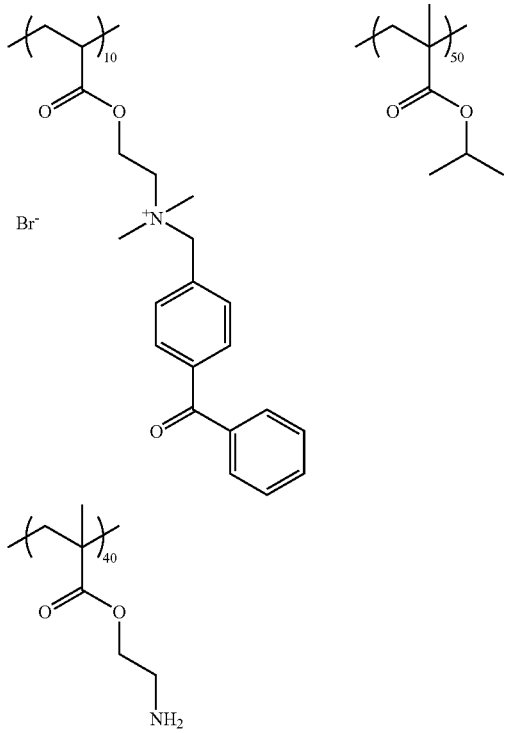

1. Examples related to pattern forming method, image forming method, pattern forming material, and planographic printing plate Example 1

(Formation of Polymerization Initiation Layer)

A polyethylene terephthalate film having a film thickness of 0.188 mm (product name: M4100 manufactured by Toyobo Co., Ltd.) was used as a support, and the specific polymerization initiation layer coating solution A was coated on the surface using a rod bar No. 18 to be dried and cross-linked at 110° C. for 10 minutes. The film thickness of the polymerization initiation layer obtained was 6.2 µm.

| [Polymerization initiation layer coating solution A] | |
|---|---|
| The above-mentioned specific polymerization initiation polymer A | 0.4 g |
| TDI (tolylene-2,4-diisocyanate) | 0.16 g |
| Propylene glycol monomethyl ether (MFG) | 1.6 g |

(Compound Having Polymerizable Group: Synthesis of Hydrophilic Polymer (P-1))

18 G of a poly(acrylic acid) (average molecular weight=25000) was dissolved in 300 g of dimethylacetamide (DMAC), and 0.41 g of hydroquinone, 19.4 g of 2-methacryloyloxyethyl isocyanate and 0.25 g of dibutyltin dilaurate were added thereto, and the mixture was reacted at 65° C. for 4 hours. The acid value of the polymer obtained was 7.02 meq/g. Then, the carboxylic group was neutralized with a 1 mol/l (1N) sodium hydroxide aqueous solution, ethyl acetate was added thereto to precipitate the polymer, and the polymer was adequately washed to obtain 18.4 g of a hydrophilic polymer (P-1) having a polymerizable group at side chains.

(Formation of Upper Layer)

The coating liquid composition 1 described below was coated on the polymerization initiation layer of the support on which the polymerization initiation layer was formed using a rod bar No. 6, and it was dried at 80° C. for 2 minutes to form an upper layer. The coating face of the above-mentioned coating liquid composition 1 was uniform.

| [Coating liquid composition 1] | |
|---|---|
| Hydrophilic polymer (P-1) having a polymerizable group at side chains | 2 g |
| Water | 18 g |
| (Graft polymerization) | |

Energy was supplied imagewise on the upper layer thus obtained under the conditions described below, and the hydrophilic/hydrophobic pattern forming material 1 comprising the preparation zone and non preparation zone of a graft polymer was obtained.

Energy application was carried out by using a 400 W high pressure mercury lamp (UVL-400P manufactured by RICOH Science Industry Co.) under argon atmosphere and irradiating it for 80 minutes imagewise. After the photo irradiation, the support was adequately washed with ion exchanged water.

Example 2

(Formation of Polymerization Initiation Layer)

A polyethylene terephthalate film having a film thickness of 0.188 mm (product name: M4100 manufactured by Toyobo Co., Ltd.) was used as a support, and the specific polymerization initiation layer coating solution B was coated on the surface using a rod bar No. 18 to be dried and cross-linked at 110° C. for 10 minutes. The film thickness of the polymerization initiation layer obtained was 6.2 μm.

| [Polymerization initiation layer coating solution B] | |
|---|---|
| The above-mentioned specific polymerization initiation polymer A | 0.4 g |
| TDI (tolylene-2,4-diisocyanate) | 0.16 g |
| Methyl ethyl ketone (MEK) | 1.6 g |

(Formation of upper layer)

In a similar manner as in example 1, the coating liquid composition 1 described was coated on the polymerization initiation layer of the support on which the polymerization initiation layer was formed to form an upper layer.

(Graft Polymerization)

Energy was supplied imagewise on the upper layer thus obtained under the conditions described below, and the hydrophilic/hydrophobic pattern forming material 2 comprising the preparation zone and non preparation zone of a graft polymer was obtained.

Energy application was carried out by using a 1.5 kW high pressure mercury lamp (manufactured by Ushio Inc.) under argon atmosphere and irradiating it for 3 minutes imagewise. After the photo irradiation, the support was adequately washed with ion exchanged water.

Example 3

The hydrophilic/hydrophobic pattern forming material 3 was obtained by a similar method as in Example 1, except that the hydrophilic polymer (P-1) in the coating liquid composition 1 was replaced with the macromonomer (M-1) synthesized by the method below, in Example 1.

(Compound Having Polymerizable Group: Synthesis of Macromonomer (M-1))

After 30 g of acrylamide and 3.8 g of 3-mercaptopropionic acid were dissolved in 70 g of ethanol, the solution temperature was raised to 60° C. under nitrogen atmosphere and 300 mg of 2,2-azobisisobutyronitrile was added thereto, and the mixture was reacted for 6 hours. After the reaction, white precipitate was filtered and adequately washed with methanol to obtain 30.8 g of a terminal carboxylic acid prepolymer (acid value=0.787 meq/g, molecular weight=1.29×10$^3$).

20 G of the above-mentioned prepolymer was dissolved in 62 g of dimethylsulfoxide, 6.71 g of glycidyl methacrylate, 504 mg of N,N-dimethyldodecylamine (catalyst) and 62.4 mg of hydroquinone (polymerization inhibitor) were added thereto, and the mixture was reacted at 140° C. under nitrogen atmosphere for 7 hours. The reaction solution was added to acetone to precipitate a polymer, and the polymer was adequately washed to obtain 23.4 g of a terminal methacrylate macromonomer (M-1). The molecular weight of the macromonomer (M-1) obtained was 1.43×10$^3$.

Example 4

The hydrophilic/hydrophobic pattern forming material 4 was obtained by a similar method as in Example 1, except that the preparation zone and non-preparation zone of a graft polymer were formed by the method described below, in Example 1.

(Graft Polymerization)

The support on which the polymerization initiation layer was formed was immersed in an acrylic acid solution (10% by weight, solvent: water) and photo irradiation was carried out imagewise for 30 minutes by using a 400 W high pressure mercury lamp (UVL-400P manufactured by RICOH Science Industry Co.) under argon atmosphere. After the photo irradiation, the support was adequately washed with ion exchanged water.

Example 5

(Formation of Polymerization Initiation Layer)

A polyethylene terephthalate film having a film thickness of 0.188 mm (product name: M4100 manufactured by Toyobo Co., Ltd.) was used as a support, and the polymerization initiation layer coating solution C was coated on the surface using a rod bar No. 18 to be dried and cross-linked at 110° C. for 10 minutes. The film thickness of the polymerization initiation layer obtained was 6.2 μm.

| [Polymerization initiation layer coating solution C] | |
|---|---|
| The above-mentioned specific polymerization initiation polymer B | 0.4 g |
| TDI (tolylene-2,4-diisocyanate) | 0.16 g |
| Methylethyl ketone (MEK) | 1.6 g |

(Compound Having Polymerizable Group: Synthesis of Hydrophilic Polymer (P-2))

-Synthesis of Monomer A-

To a 500 ml three necked flask, 58.6 g of 2-hydroxyethyl methacrylate was charged and 250 ml of acetone was added to be stirred. After 39.2 g of pyridine and 0.1 g of p-methoxyphenol were added, the mixture was cooled by an ice bath in which ice water was charged. After the temperature of the solution mixture became 5° C. or less, 114.9 g of 2-bromoisobutanic acid bromide was added dropwise using a dropping funnel over 3 hours. After termination of the dropwise addition, the ice bath was removed and the solution mixture was further stirred for 3 hours. The reaction solution mixture was charged in 750 ml of water to be stirred for one hour. The aqueous solution mixture was extracted 3 times with 500 ml of ethyl acetate using a separatory funnel. The organic layer was successively washed with 500 ml of 1M (mol/l) hydrochloric acid, 500 ml of a saturated sodium bicarbonate aqueous solution and 500 ml of saturated saline. To the organic layer, 100 g of magnesium sulfate was charged and dried by dehydration, and then filtered. The solvent was distilled off under reduced pressure to obtain 120.3 g of a monomer A.

Then, 40 g of N,N-dimethylacetamide was charged to a 1000 ml three necked flask and heated to 70° C. under nitrogen flow. Thereto, 40 g of N,N-dimethylacetamide solution of 12.58 g of the monomer A, 27.52 g of methacrylic acid and 0.921 g of V-601 (manufactured by Wako Pure Chemical Industries, Ltd.) was added dropwise over 2.5 hours. After termination of the dropwise addition, the mixture was heated to 90° C. to be further stirred for 2 hours. After the reaction solution was cooled to room temperature, 3.5 liter of water was charged to precipitate a polymer compound. The polymer compound precipitated was obtained by filtration, washed with water and dried to obtain 30.5 g of a polymer compound. The mass average molecular weight of the polymer compound obtained was measured by a gel permeation chromatography method (GPC) in which a polystyrene was used as a standard substance, and, as a result, it was 124000.

To a 200 ml three necked flask, 26.0 g of the polymer compound obtained and 0.1 g of p-methoxyphenol were charged, the mixture was dissolved in 60 g of N,N-dimethylacetamide and 60 g of acetone and cooled on an ice bath in which ice water was charged. After the temperature of the solution mixture became 5° C. or less, 60.4 g of 1,8-diazabicyclo[5,4,0]-7-undecene (DBU) was added dropwise over one hour using a dropping funnel. After termination of the dropwise addition, the ice bath was removed and the solution mixture was further stirred for 8 hours. The reaction solution was charged in 2 L of water in which 17 ml of concentrated hydrochloric acid was dissolved to precipitate a hydrophilic polymer (P-2) having a polymerizable group at side chains. The hydrophilic polymer (P-2) precipitated was obtained by filtration, washed with water and dried to obtain 15.6 g.

(Formation of Upper Layer)

The coating liquid composition 2 described below was coated on the polymerization initiation layer of the support on which the polymerization initiation layer was formed using a rod bar No. 6, and it was dried at 80° C. for 2 minutes to form an upper layer. The coating face of the above-mentioned coating liquid composition 2 was uniform.

| [Coating liquid composition 2] | |
|---|---|
| Hydrophilic polymer (P-2) having a polymerizable group at side chains | 2 g |
| Water | 18 g |
| (Graft polymerization) | |

Energy was supplied imagewise on the upper layer thus obtained under the conditions described below, and the hydrophilic/hydrophobic pattern forming material 5 comprising the preparation zone and the none preparation zone of a graft polymer was obtained.

Energy application was carried out by using a 1.5 kW high pressure mercury lamp (manufactured by Ushio Inc.) under argon atmosphere and irradiating it for 3 minutes imagewise. After the photo irradiation, the support was adequately washed with ion exchanged water.

Example 6

The hydrophilic/hydrophobic pattern forming material 6 comprising the preparation zone and non-preparation zone of a graft polymer was obtained by a similar method as in Example 5, except that the specific polymerization initiation polymer B in the polymerization initiation layer coating solution B was replaced with the above-mentioned specific polymerization initiation polymer C, in Example 5.

[Evaluation of Pattern Forming Property]

The hydrophilic/hydrophobic pattern forming materials 1 to 6 obtained were immersed in a methylene blue aqueous solution (0.5% by mass) being a cationic dye for 5 minutes. The surface of the hydrophilic/hydrophobic pattern was observed at magnification 50000-fold by a scanning electron microscope (S800 manufactured by JOEL). Then, it was confirmed that, in the hydrophilic/hydrophobic pattern forming materials 1, 2 and 3 the dyes were selectively adsorbed on the zones where a graft polymer was prepared, and that patterns having L/S=5 μm/5 μm were formed. Further, it was confirmed that, in the hydrophilic/hydrophobic pattern forming material 4, the dye was selectively adsorbed on the zones where a graft polymer was prepared, and that patterns having L/S=10 μm/10 μm were formed. Moreover, it was confirmed that, in the hydrophilic/hydrophobic pattern forming materials 5 and 6, the dye was selectively adsorbed on the zones where a graft polymer was prepared, and that patterns having L/S=10 μm/10 μm were formed were formed.

The cross section of the pattern was observed at magnification of 50000-fold by a scanning electron microscope (S800 manufactured by JOEL), the thickness of pattern (a height from the surface of the polymerization initiation layer to the top of the convex of the pattern) was 0.6 μm in the hydrophilic/hydrophobic pattern forming materials 1, 2, and 6, and was 0.5 μm in the hydrophilic/hydrophobic pattern forming materials 3 to 5.

According to the evaluation, it was clarified that, as the image forming method of the invention, a dye was selectively adsorbed on the preparation zone of a graft polymer by bestowing a colorant (methylene blue-dye) on the hydrophilic/hydrophobic patterns obtained, and that the image forming material was obtained.

[Evaluation as Planographic Printing Plate]

Printing was carried out using the hydrophilic/hydrophobic pattern forming materials 1 to 6 obtained as the planographic printing plate by the following method. When the hydrophilic/hydrophobic pattern forming materials 1 to 6 are used as the planographic printing plate, the preparation zone of a graft polymer becomes the non-image portion, the zone where the polymerization initiation layer are exposed (the none preparation zone) becomes the image portion, and an ink is adhered on the image portion.

The hydrophilic/hydrophobic pattern forming materials 1 to 6 were installed in a Lithron printing machine, IF201 (2.5%) and IF202 (0.75%) manufactured by Fuji Photo Film Co., Ltd. were supplied as wetting water, GEOS-G black manufactured by Dainippon Ink and Chemicals Incorporated was supplied as an ink, and printing was normally carried out.

When it was observed whether the image portion of the printing article obtained was formed well or not and whether staining occurs at the non-image portion or not, the printing articles having good image quality without the drop-out of the image portion and staining were obtained for any of the planographic printing plates comprising the hydrophilic/hydrophobic pattern forming materials 1 to 6.

Then, the printing of 10000 sheets was continued. However, with respect to the planographic printing plates comprising the hydrophilic/hydrophobic pattern forming materials 1 to 6, the haze of the image portion and the staining of the non-image portion did not occur even at the time of termination of the printing of 10000 sheets, and good printed articles were obtained.

It was grasped thereby that when the hydrophilic/hydrophobic pattern forming material obtained by the pattern forming method of the invention is used as the planographic printing plate (the planographic printing plate of the invention), both of the image quality and the printing durability of a printing article were good.

2. Examples Related to Fine Particle Adsorption Pattern Forming Method

Example 7

(Formation of Polymerization Initiation Layer)

A polyethylene terephthalate film having a film thickness of 0.188 mm (product name: M4100 manufactured by Toyobo Co., Ltd.) was used as a support, and the polymerization initiation layer coating solution C described below was coated on the surface using a rod bar No. 18 to be dried and cross-linked at 110° C. for 10 minutes. The film thickness of the polymerization initiation layer obtained was 6.2 μm.

| [Polymerization initiation layer coating solution C] | |
|---|---|
| The above-mentioned specific polymerization initiation polymer A | 0.4 g |
| TDI (tolylene-2,4-diisocyanate) | 0.16 g |
| Methyl ethyl ketone (MEK) | 1.6 g |

(Graft polymerization)

The support on which the polymerization initiation layer was formed was immersed in an acrylic acid aqueous solution (10% by mass) and pattern exposure was carried out for 30 minutes by using a 400 w high-pressure mercury lamp (UVL-400P manufactured by RICHOH Science Industry Co.) under argon atmosphere.

After the photo irradiation, the film obtained was adequately washed with ion exchanged water, to obtain the hydrophilic/hydrophobic pattern forming material 7 comprising the preparation zone of a graft polymer on which acrylic acid was grafted imagewise and the non-preparation zone.

(Adsorption of $TiO_2$ Fine Particles on Preparation Zone of Graft Polymer)

The hydrophilic/hydrophobic pattern material 7 obtained was immersed in a $TiO_2$ fine particles aqueous dispersion having positive charge (1.5% by mass, particle diameter: about 20 nm, manufactured by CI Chemicals Co., Ltd.) for one hour, and the $TiO_2$ fine particles on whose surface the dispersing agent derived from the $TiO_2$ fine particles aqueous dispersion was adsorbed were taken out after being adsorbed on the preparation zone of a graft polymer, adequately washed with water, and rubbed reciprocally 30 times by a hand using a cloth (BEMCOT manufactured by Asahi Chemical Industry Co., Ltd.) in water. Then, they were dried to obtain the fine particle adsorption pattern material 1 in Example 7.

<Evaluation>

When the surface and section of the fine particle adsorption pattern material 1 obtained were observed at magnification of 50000-fold by a scanning electron microscope (S800 manufactured by JEOL), it was clarified that they were patterns in which $TiO_2$ fine particles were penetrated in the film comprising the graft polymer, and that the fine particles were laminated. It was clarified that the fine particles were hardly adhered on the portion other than the preparation zone of a graft polymer, and that the patterns were patterns having good discrimination.

After the sample was washed again 50 times by a cloth in water, observation by an electron microscope was carried out. However, it was clarified that the patterns were sharp patterns in which the fine particles were laminated on the film comprising the graft polymer in like manner as before, that the pattern shape was not changed by the rubbing operation, and therefore that the patterns are patterns having powerful strength.

When the zeta potential of the $TiO_2$ fine particles was measured by using a zetasizer 2000 manufactured by Malvern Instruments Inc., it was confirmed that the potential was +42 mV and was positive charge.

Example 8

The hydrophilic/hydrophobic pattern forming material 8 was obtained by a similar method as in Example 7, except that the graft polymerization step in Example 7 was replaced with the following method.

(Graft Polymerization)

The support on which the polymerization initiation layer was formed was immersed in an acrylic acid aqueous solution (10% by mass) and pattern exposure was carried out for 10 minutes by using a 1.5 kW high pressure mercury lamp (manufactured by Ushio Inc.) under argon atmosphere.

After the photo irradiation, the film obtained was adequately washed with ion exchanged water, to obtain the hydrophilic/hydrophobic pattern forming material 8 comprising the preparation zone of a graft polymer on which acrylic acid was grafted imagewise and the non-preparation zone.

(Adsorption of $TiO_2$ Fine Particles on Preparation Zone of Graft Polymer)

The $TiO_2$ fine particles were adsorbed on the preparation zone of a graft polymer as in Example 7, and then the fine particle adsorption pattern material 2 in Example 8 was obtained.

<Evaluation>

The fine particle adsorption pattern material 2 obtained was observed by a scanning electron microscope in a similar manner as in Example 7. Sharp patterns in which the fine particles were laminated in the film comprising the graft polymer were observed. When the similar rubbing operation as in Example 7 was repeated, the shape of the patterns was not changed.

Example 9

(Adsorption of $Al_2O_3$ Fine Particles on Preparation Zone of Graft Polymer)

The fine particle adsorption pattern material 3 in Example 9 was obtained by a similar method as in Example 7, except that the $Al_2O_3$ fine particles (particle diameter: about 10 nm, manufactured by CI Chemicals Co., Ltd.) on whose surface the dispersing agent derived from the $Al_2O_3$ fine particles aqueous dispersion was adsorbed were adsorbed on the preparation zone of a graft polymer, in place of the $TiO_2$ fine particles in Example 7.

<Evaluation>

With respect to the fine particle adsorption pattern material 3 obtained, when observation was carried out by a scanning electron microscope in a similar manner as in Example 7, sharp patterns in which the fine particles were laminated in the film comprising the graft polymer were observed. When the similar rubbing operation as in Example 7 was repeated, the shape of the patters was not changed.

Further, it was confirmed that the zeta potential of the $Al_2O_3$ fine particles was +77 mV and was positive charge.

Example 10

(Graft Polymerization)

The support having the similar polymerization initiation layer as in Example 7 was immersed in a [2-(methacryloyloxy)ethyl]trimethylammonium chloride aqueous solution (30% by mass), and pattern exposure was carried out for 30 minutes by using a 400 W high pressure mercury lamp (UVL-400P manufactured by RICOH Science Industry Co.) under argon atmosphere.

After the photo irradiation, the film obtained was adequately washed with ion exchanged water to obtain the hydrophilic/hydrophobic pattern material 10 comprising the preparation zone and non-preparation zone of a graft polymer in which [2-(methacryloyloxy)ethyl]trimethylammonium chloride was grafted imagewise.

(Adsorption of ZnO Fine Particles on Preparation Zone of Graft Polymer)

The hydrophilic/hydrophobic pattern material 10 obtained was immersed in a ZnO fine particles aqueous dispersion (1.5% by mass, particle diameter: about 15 nm, manufactured by CI Chemicals Co., Ltd.) for one hour, and the ZnO fine particles on whose surface the dispersing agent derived from the ZnO fine particles aqueous dispersion was adsorbed were adsorbed on the preparation zone of a graft polymer, then taken out, adequately washed with water, and then reciprocally rubbed 30 times by a hand using a cloth (BEMCOT manufactured by Asahi Chemical Industry Co., Ltd.) in water. Then, they were dried to obtain the fine particle adsorption pattern material 4 in Example 10.

<Evaluation>

With respect to the fine particle adsorption pattern material 4 obtained, observation was carried out by a scanning electron microscope in a similar manner as in Example 7, sharp patterns in which the fine particles were laminated in the film comprising the graft polymer were observed. When the similar rubbing operation as in Example 7 was repeated, the shape of the pattern was not changed.

Further, when the zeta potential of the ZnO fine particles was measured, it was confirmed that the potential was −60 mV and was negative charge.

Example 11

(Graft Polymerization)

The support having the similar polymerization initiation layer as in Example 7 was immersed in a [2-(methacryloyloxy)ethyl]trimethylammonium chloride aqueous solution (30% by mass), and pattern exposure was carried out for 10 minutes by using a 1.5 k W high pressure mercury lamp (manufactured by Ushio Inc.) under argon atmosphere.

After the photo irradiation, the film obtained was adequately washed with ion exchanged water to obtain the hydrophilic/hydrophobic pattern material 11 comprising the preparation zone and non-preparation zone of a graft polymer in which [2-(methacryloyloxy)ethyl]trimethylammonium chloride was grafted imagewise.

(Adsorption of ZnO Fine Particles on Preparation Zone of Graft Polymer)

The ZnO fine particles were let be adsorbed on the preparation zone of a graft polymer of the hydrophilic/hydrophobic pattern material 11 in a similar manner as in Example 10, then the fine particle adsorption pattern material 5 in Example 11 was obtained.

<Evaluation>

With respect to the fine particle adsorption pattern material 5 obtained, observation was carried out by a scanning electron microscope in a similar manner as in Example 7, sharp patterns in which the fine particles were laminated in the film comprising the graft polymer were observed. When the similar rubbing operation as in Example 7 was repeated, the shape of the patterns was not changed.

Example 12

(Formation of Polymerization Initiation Layer)

A polyethylene terephthalate film having a film thickness of 0.188 mm (product name: M4100 manufactured by Toyobo Co., Ltd.) was used as a support, and the polymerization initiation layer coating solution D described below was coated on the surface using a rod bar No. 18 to be dried and cross-linked at 110° C. for 10 minutes. The film thickness of the polymerization initiation layer obtained was 6.2 µm.

| [Polymerization initiation layer coating solution D] | |
| --- | --- |
| The above-mentioned specific polymerization initiation polymer A | 0.4 g |
| TDI (tolylene-2,4-diisocyanate) | 0.16 g |
| Photothermal conversion material (IR125, manufactured by Wako Pure Chemical Industries, Ltd.) | 0.1 g |
| Methyl ethyl ketone | 1.6 g |
| (Formation of polymer compound layer) | |

The support on which the polymerization initiation layer was formed was immersed in a 10% by mass of sodium α(styrene-4-sulfonyl)acetate aqueous solution, and photo irradiation was carried out for 30 minutes by using a 400 W high-pressure mercury lamp (UVL-400P manufactured by ROCOH Science Industry Co.) under argon atmosphere. After the photo irradiation, the support obtained was adequately washed with ion exchanged water to obtain a support having a polymer compound layer on which sodium (styrene-4-sulfonyl)acetate was graft-polymerized.

The polymer compound layer obtained was exposed by IR laser (beam diameter: 20 µm) which emits infrared rays of a wavelength of 830 nm, and the polarity of the exposed portion was converted to be hydrophilic. Then, it was adequately washed with ion exchanged water to obtain the hydrophilic/hydrophobic pattern material 12 comprising the hydrophilic zone and hydrophilic zone.

(Adsorption of $TiO_2$ Fine Particles on Hydrophilic Zone)

The hydrophilic/hydrophobic pattern material 12 obtained was immersed for one hour in a $TiO_2$ fine particle aqueous dispersion having positive charge (1.5% by mass, particle diameter: about 20 nm, manufactured by CI Chemicals Co., Ltd.) used in Example 7, and the $TiO_2$ fine particles on whose surface the dispersing agent derived from the $TiO_2$ fine particle aqueous dispersion was adsorbed were let be adsorbed on the hydrophilic zone, then taken out, adequately washed with water, and then rubbed reciprocally 30 times by a hand using a cloth (BEMCOT manufactured by Asahi Chemical Industry Co., Ltd.) in water. Then, they were dried to obtain the fine particle adsorption pattern material 6 in Example 12.

<Evaluation>

When the fine particle adsorption pattern material 6 obtained was observed at magnification of 50000 by a scanning electron microscope (JEOL S800), it was clarified that it was patterns on which the $TiO_2$ fine particles were laminated. Further, it was clarified that the fine particles were hardly adhered on the portion other than the hydrophilic zone of a graft polymer, and that the patterns were patterns having good discrimination.

After the sample was washed again 85 times by a cloth in water, observation by an electron microscope was carried out. However, it was clarified that the patterns were similar sharp patterns as before, that the pattern shape was not changed by the rubbing operation, and therefore that the patterns were patterns having powerful strength.

Example 13

The hydrophilic/hydrophobic pattern forming material 13 in Example 13 was obtained by a similar method as in Example 12, except that the step of formation of polymer compound layer in Example 12 was replaced with the following method.

(Formation of Polymer Compound Layer)

The support on which the polymerization initiation layer was formed was immersed in a 10% by mass of sodium α(styrene-4-sulfonyl)acetate aqueous solution, and photo irradiation was carried out for 10 minutes by using a 1.5 kW high pressure mercury lamp (manufactured by Ushio Inc.) under argon atmosphere. After the photo irradiation, the support obtained was adequately washed with ion exchanged water to obtain a support having a polymer compound layer on which sodium (styrene-4-sulfonyl)acetate was graft-polymerized.

The polymer compound layer obtained was exposed by IR laser (beam diameter: 20 μm) which emits infrared rays of a wavelength of 830 nm, and the polarity of the exposed portion was converted to be hydrophilic. Then, it was adequately washed with ion exchanged water to obtain the hydrophilic/hydrophobic pattern material 13 comprising the hydrophilic zone and hydrophilic zone.

(Adsorption of $TiO_2$ Fine Particles on Hydrophilic Zone)

The $TiO_2$ fine particles were let be adsorbed on the hydrophilic zone of the hydrophilic/hydrophobic pattern material 13 obtained in a similar manner as in Example 12, then the fine particle adsorption pattern material 7 in Example 13 was obtained.

<Evaluation>

With respect to the fine particle adsorption pattern material 7 obtained, observation was carried out by a scanning electron microscope in a similar manner as in Example 12, sharp patterns in which the fine particles were laminated in the film comprising the graft polymer were observed. When the similar rubbing operation as in Example 12 was repeated, the shape of the pattern was not changed.

Example 14

(Graft Polymerization)

The support having a similar polymerization initiation layer as in Example 7 was formed was immersed in a tertiary-butyl acrylate solution (30% by mass, solvent: propylene glycol monomethyl ether) and exposure was carried out for 30 minutes by using a 400 W high pressure mercury lamp (UVL-400P manufactured by RICOH Science Industry Co.) under argon atmosphere.

After the photo irradiation, the film obtained was adequately washed with ion exchanged water, to obtain a support on which tertiary-butyl acrylate was grafted. Then, the solution A having the composition described below was coated on the support. The film thickness of the film obtained (a polymer compound layer) was 0.5 μm.

| <Solution A> | |
|---|---|
| Triphenylsulfonium triflate | 0.05 g |
| Methyl ethyl ketone | 1 g |

The film obtained was pattern-exposed for one minute using a 400 W high pressure mercury lamp (UVL-400P manufactured by RICOH Science Industry Co.), the polarity of the exposed portion was converted to be hydrophilic and heating was carried out at 90° C. for 2 minutes. Then, the film was washed with methyl ethyl ketone to obtain the hydrophilic/hydrophobic pattern material 14 comprising the hydrophilic zone and hydrophobic zone.

(Adsorption of $TiO_2$ Fine Particles on Hydrophilic Zone)

The hydrophilic/hydrophobic pattern material 14 obtained was immersed for one hour in a $TiO_2$ fine particle aqueous dispersion having positive charge (1.5% by mass, particle diameter: about 20 nm, manufactured by CI Chemicals Co., Ltd.), and the $TiO_2$ fine particles on whose surface the dispersing agent derived from the $TiO_2$ fine particle aqueous dispersion was adsorbed were let be adsorbed on the hydrophilic zone, then taken out, adequately washed with water, and then rubbed reciprocally 30 times by a hand using a cloth (BEMCOT manufactured by Asahi Chemical Industry Co., Ltd.) in water. Then, they were dried to obtain the fine particle adsorption pattern material 8 in Example 14.

<Evaluation>

When the section and surface of the fine particle adsorption pattern material 5 obtained were observed at magnification of 50000 by a scanning electron microscope (manufactured by JEOL S800), it was clarified that it was patterns in which $TiO_2$ fine particles were penetrated in the film comprising the graft polymer, and that the fine particles were laminated in the film. Further, it was clarified that the fine particles were hardly adhered on the portion other than the graft, and that the patterns are patterns having good discrimination.

After the sample was washed again 50 times by a cloth in water, observation by an electron microscope was carried out. However, it was clarified that the patterns were sharp patterns in which the similar fine particles as before were laminated in the graft film, that the pattern shape was not changed by the rubbing operation, and therefore that the patterns were patterns having powerful strength.

Further, when the zeta potential of the $TiO_2$ fine particles was measured by using zetasizer 2000 manufactured by Malvern Instruments Inc., it was confirmed that the potential was +42 mV and was positive charge.

Example 15

The hydrophilic/hydrophobic pattern forming material 15 was obtained by a similar method as in Example 14, except that the graft polymerization step in Example 14 was replaced with the following method.

(Graft Polymerization)

The support having a similar polymerization initiation layer as in Example 7 was formed was immersed in a tertiary-butyl acrylate solution (30% by mass, solvent: propylene glycol monomethyl ether) and exposure was carried out for 10 minutes by using a 1.5 kW high pressure mercury lamp (manufactured by Ushio Inc.) under argon atmosphere.

After the photo irradiation, the film obtained was adequately washed with ion exchanged water, to obtain a support on which tertiary-butyl acrylate was grafted. Then, the solution A having the composition described below was coated on the support. The film thickness of the film obtained (a polymer compound layer) was 0.5 µm.

| <Solution A> | |
|---|---|
| Triphenylsulfonium triflate | 0.05 g |
| Methyl ethyl ketone | 1 g |

The film obtained was pattern-exposed for one minute using a 1.5 kW high pressure mercury lamp (manufactured by Ushio Inc.), the polarity of the exposed portion was converted to be hydrophilic and heating was carried out at 90° C. for 2 minutes. Then, the film was washed with methyl ethyl ketone to obtain the hydrophilic/hydrophobic pattern material 15 comprising the hydrophilic zone and hydrophobic zone.

(Adsorption of TiO$_2$ Fine Particles on Hydrophilic Zone)

The TiO$_2$ fine particles were let be adsorbed on the hydrophilic zone of the hydrophilic/hydrophobic pattern material 15 obtained in the same manner as in Example 14, then the fine particle adsorption pattern material 9 in Example 15 was obtained.

<Evaluation>

With respect to the fine particle adsorption pattern material 9 obtained, observation was carried out by a scanning electron microscope in a similar manner as in Example 14, sharp patterns in which the fine particles were laminated in the film comprising the graft polymer were observed. When the similar rubbing operation as in Example 14 was repeated, the shape of the pattern was not changed.

3. Examples Related to Conductive Pattern Forming Method

Example 16

(Formation of Polymerization Initiation Layer)

A JIS A 1050 aluminum plate having a film thickness of 0.3 mm was used as a support, and the polymerization initiation layer coating solution E described below was coated on the surface using a rod bar No. 18 to be dried and cross-linked at 110° C. for 10 minutes. The film thickness of the polymerization initiation layer obtained was 6.3 µm.

| [Polymerization initiation layer coating solution E] | |
|---|---|
| The above-mentioned specific polymerization initiation polymer A | 0.4 g |
| TDI (tolylene-2,4-diisocyanate) | 0.16 g |
| Infrared absorber (IR125, manufactured by Wako Pure Chemical Industries, Ltd.) | 0.1 g |
| Methyl ethyl ketone (MEK) | 1.6 g |

(Graft polymerization)

The support on which the polymerization initiation layer which was formed was immersed in a sodium α(styrene-4-sulfonyl) acetate aqueous solution (10% by mass), and exposure was carried out for 30 minutes by using a 1000 W high pressure mercury lamp under argon atmosphere.

After the photo irradiation, the film obtained was adequately washed with ion exchanged water to obtain a support having a polymer compound layer on which sodium (styrene-4-sulfonyl)acetate was graft-polymerized.

(Pattern Formation)

The polymer compound layer obtained was exposed imagewise by IR laser (beam diameter: 20 µm) which emits infrared rays of a wavelength of 830 nm, and the polarity of the exposed portion was converted to be hydrophilic to obtain the hydrophilic/hydrophobic pattern material 16 comprising the hydrophilic zone and hydrophilic zone.

[Adsorption of Conductive Material]

The hydrophilic/hydrophobic pattern material 16 obtained was immersed in an Ag dispersion solution with positive charge prepared as described below, then the surface was adequately washed with flowing water, and the excessive Ag dispersion solution was removed to prepare the conductive pattern material 1 in Example 16 by being heated for one hour at 300° C.

[Preparation of Ag Particles (Conductive Material) Having Positive Charge]

To 50 ml of an ethanol solution of silver perchlorate (5 mM), 3 g of bis(1,1-trimethylammonium decanoylaminoethyl)disulfide was added, and 30 ml of a sodium hydroborate solution (0.4 M) was slowly added dropwise while it is vigorously stirred to reduce the ion, to obtain the dispersion of silver particles coated with quaternary ammonium. When the size of the silver particles was measured, an average particle diameter was 5 nm.

[Evaluation of Conductive Circuit]

When surface conductivity in the adsorption portion of the Ag fine particles of the conductive pattern material 1 obtained was measured by four-probe method, it showed 10Ω/□.

[Evaluation of Abrasion Resistance]

The surface of the conductive pattern material 1 obtained was reciprocally rubbed 150 times by a hand using a cloth (BEMCOT manufactured by Asahi Chemical Industry Co., Ltd.) wetted with water. After the rubbing, the surface was observed at magnification of 100000-fold by a scanning electron microscope (JEM-200CX manufactured by JEOL), the similar surface as that before the rubbing treatment was confirmed and it was confirmed that the adhesion property of the Ag fine particles was high.

Example 17

(Formation of Polymerization Initiation Layer)

A polyimide film having a film thickness of 0.125 mm (trade name: Kapton manufactured by TORAY-Du Pont Co., Ltd.) was used as a support, and the polymerization initiation layer coating solution F described below was coated on the surface using a rod bar No. 18 to be dried and cross-linked at 110° C. for 10 minutes. The film thickness of the polymerization initiation layer obtained was 6.2 μm.

| [Polymerization initiation layer coating solution F] | |
|---|---|
| The above-mentioned specific polymerization initiation polymer A | 0.4 g |
| TDI (tolylene-2,4-diisocyanate) | 0.16 g |
| Methyl ethyl ketone (MEK) | 1.6 g |
| (Graft polymerization) | |

The support having the polymerization initiation layer obtained was immersed in an acrylic acid aqueous solution (10% by mass), and exposure was carried out for 10 minutes by using a 1 kW high pressure mercury lamp under argon atmosphere.

After the photo irradiation, the support obtained was adequately washed with ion exchanged water to obtain a support on which acrylic acid was graft-polymerized: Further, a solution of 1 L of water, 40 g of N-ethyl-N'(3-dimethylaminopropyl)carbodiimide hydrochloride and 6 g of N-hydroxysuccinimide was prepared, the above-mentioned support on which acrylic acid was graft-polymerized was immersed therein, and ester conversion was carried out. After that, the support was further reacted with 6 g of 2-nitrobenzylphenol to obtain a support having a polymer compound layer comprising a polymer having an optically decomposable functional group (a polarity conversion group).

(Pattern Formation)

The polymer compound layer obtained was exposed imagewise by laser (beam diameter: 20 μm) which emits blue light of a wavelength of 400 nm, and the polarity of the exposed portion was converted to be hydrophilic to obtain the hydrophilic/hydrophobic pattern material 17 comprising the hydrophilic zone and hydrophobic zone.

[Adsorption of Conductive Material]

The hydrophilic/hydrophobic pattern material 17 obtained was immersed in a Ag dispersion solution with positive charge used in Example 16, then the surface was adequately washed with flowing water, and the excessive Ag dispersion was removed and heated at 300° C. for one hour to obtain the conductive pattern material 2 in Example 17.

[Evaluation of Conductive Circuit]

When surface conductivity in the adsorption portion of the Ag fine particles of the conductive pattern material 2 obtained was measured by four-probe method, it showed 20Ω/□.

[Evaluation of Abrasion Resistance]

The surface of the conductive pattern material 2 obtained was rubbed reciprocally 150 times by a hand using a cloth (BEMCOT manufactured by Asahi Chemical Industry Co., Ltd.) wetted with water. After the rubbing, the surface was observed at magnification of 100000-fold by a scanning electron microscope (JEM-200CX manufactured by JEOL), the similar surface as that before the rubbing treatment was confirmed and it was confirmed that the adhesion property of the Ag fine particles was high.

Example 18

(Graft Polymerization)

The support on which the polymerization initiation layer prepared by a similar method as in Example 17 was formed was immersed in a 30% by mass of tert-butyl acrylate solution (solvent: propylene glycol monomethyl ether (MFG)), and exposure was carried out for 15 minutes by using a 1 kW high pressure mercury lamp under argon atmosphere.

After the photo irradiation, the film obtained was adequately washed with ion exchanged water to obtain a support having a polymer compound layer comprising in which tert-butyl acrylate was graft-polymerized.

(Pattern Formation of Graft Polymer)

The coating solution 3 described below was coated on the polymer compound layer obtained. The film thickness of the coating was 0.5 μm.

| <Coating solution 3> | |
|---|---|
| Triphenylsulfonium triflate | 0.05 g |
| Methyl ethyl ketone (MEK) | 1 g |

The coating film obtained was exposed pattern-wise for one minute using a 1 kW high pressure mercury lamp, the polarity of the exposed portion was converted to be hydrophilic and then, heating was further carried out at 90° C. for 2 minutes. The film obtained was washed with methyl ethyl ketone (MEK) to obtain the hydrophilic/hydrophobic pattern material 18 comprising the hydrophilic zone and hydrophobic zone.

[Adsorption of Conductive Material]

The hydrophilic/hydrophobic pattern material 18 obtained was immersed in a Ag dispersion solution with positive charge used in Example 16, then the surface was adequately washed with flowing water, and the excessive Ag dispersion was removed and heated at 300° C. for one hour to obtain the conductive pattern material 3 in Example 18.

[Evaluation of Conductive Circuit]

When surface conductivity in the adsorption portion of the Ag fine particles of the conductive pattern material 3 obtained was measured by a four-probe method, it showed 100Ω/□.

[Evaluation of Abrasion Resistance]

The surface of the conductive pattern material 3 obtained was rubbed reciprocally 150 times by a hand using a cloth (BEMCOT manufactured by Asahi Chemical Industry Co., Ltd.) wetted with water. After the rubbing, the surface was observed at magnification of 100000-fold by a scanning electron microscope (JEM-200CX manufactured by JEOL), the similar surface as that before the rubbing treatment was confirmed and it was confirmed that the adhesion property of the Ag fine particles was high.

Example 19

(Graft Polymerization)

The coating solution 4 described below was coated on the polymerization initiation layer in the support on which the polymerization initiation layer prepared by a similar method as in Example 17 was formed. The film thickness of the coating was 0.8 μm.

| <Coating solution 4> | |
|---|---|
| Hydrophilic polymer (P-1) used in the above-mentioned Example 1 | 0.25 g |
| Water | 5 g |
| Acetonitrile | 3 g |
| (Pattern formation of graft polymer) | |

Pattern-wise exposure was carried out to the film obtained for 30 seconds using a 1 kW high pressure mercury lamp, and then, the film obtained was washed with flowing water to obtain the hydrophilic/hydrophobic pattern material 19 comprising the preparation zone and non-preparation zone of a graft polymer in which a hydrophilic polymer was grafted on the exposed portion.

[Adsorption of Conductive Material]

The hydrophilic/hydrophobic pattern material 19 was immersed in a Ag dispersion solution with positive charge which in Example 16, then the surface was adequately washed with flowing water, and the excessive Ag dispersion was removed, and heated at 300° C. for one hour to obtain the conductive pattern material 4 in Example 19.

[Evaluation of Conductive Circuit]

When surface conductivity in the adsorption portion of the Ag fine particles of the conductive pattern material 4 obtained was measured by a four-probe method, it showed 1Ω/□.

[Evaluation of Abrasion Resistance]

The surface of the conductive pattern material 4 obtained was rubbed reciprocally 150 times by a hand using a cloth (BEMCOT manufactured by Asahi Chemical Industry Co., Ltd.) wetted with water. After the rubbing, the surface was observed at magnification of 100000-fold by a scanning electron microscope (JEM-200CX manufactured by JEOL), the similar surface as that before the rubbing treatment was confirmed and it was confirmed that the adhesion property of the Ag fine particles was high.

According to the invention, there can be provided the pattern forming method which can form a fine and sharp pattern capable of being applied over a wide range by a simple method without requiring a specific material, specific compound or high energy. Further, the image forming method, the pattern forming material and the planographic printing plate to which the pattern forming method is applied can also be provided.

There can be provided the fine particle adsorption pattern forming method which can form, by a simple procedure, a firm and uniform fine particle adsorption pattern which is not peeled by a mechanical operation such as rubbing, only on desired zones on a support, and which can also be applied to a large area pattern formation.

Furthermore, there can be provided the conductive pattern forming method which can obtain fine patterns having the high adhesion property of a conductive material, high resolution and stable conductivity without disconnection and which has a wide application range.

What is claimed is:

1. A pattern forming method comprising:
   providing a polymerization initiation layer which is obtained by fixing, by a cross-linking reaction, a polymer having functional groups having polymerization initiation ability and cross-linking groups at side chains, on a support; and
   forming a pattern comprising a preparation zone and a non-preparation zone of a graft polymer by preparing the graft polymer on the surface of the polymerization initiation layer using graft polymerization, by contacting a compound having a polymerizable group on the polymerization initiation layer and supplying energy imagewise.

2. An image forming method comprising:
   providing a polymerization initiation layer which is obtained by fixing, by a cross-linking reaction, a polymer having functional groups having polymerization initiation ability and cross-linking groups at side chains, on a support;
   forming a pattern comprising a preparation zone and a non-preparation zone of a graft polymer by preparing the graft polymer on the surface of the polymerization initiation layer using graft polymerization, by contacting a compound having a polymerizable group on the polymerization initiation layer and supplying energy imagewise; and adhering a colorant on the preparation zone or the non-preparation zone of the graft polymer.

3. A fine particle adsorption pattern forming method comprising:
   forming a polymerization initiation layer which is obtained by fixing, by a cross-linking reaction, a polymer having functional groups having polymerization initiation ability and cross-linking groups at side chains, on a support;
   preparing a graft polymer having a polar group in a pattern shape on the surface of the polymerization initiation layer; and
   adsorbing fine particles on the graft polymer.

4. A fine particle adsorption pattern forming method comprising:
   forming a polymerization initiation layer which is obtained by fixing, by a cross-linking reaction, a polymer having functional groups having polymerization initiation ability and cross-linking groups at side chains, on a support;
   forming a pattern comprising a preparation zone and a non-preparation zone of a graft polymer by preparing the graft polymer on the surface of the polymerization initiation layer using graft polymerization, by contacting a compound having a polymerizable group and a polar group on the polymerization initiation layer and supplying energy imagewise; and
   adsorbing fine particles on the preparation zone of the graft polymer.

5. A fine particle adsorption pattern forming method comprising:
   forming a polymerization initiation layer which is obtained by fixing, by a cross-linking reaction, a polymer having functional groups having polymerization initiation ability and cross-linking groups at side chains, on a support;
   forming a pattern comprising a hydrophilic zone and a hydrophobic zone on the surface of the polymerization initiation layer, by providing a polymer compound layer comprising a polymer compound which is directly and chemically bonded with the polymerization initiation layer and has a functional group whose hydrophilicity or hydrophobicity is changed by heat, acid or radiation and applying heat, acid or radiation imagewise to the polymer compound layer; and adsorbing fine particles on the hydrophilic zone or the hydrophobic zone.

6. A conductive pattern forming method comprising:

forming a polymerization initiation layer which is obtained by fixing, by a cross-linking reaction, a polymer having functional groups having polymerization initiation ability and cross-linking groups at side chains, on a support;

preparing a graft polymer having a polar group in a pattern shape on the surface of the polymerization initiation layer; and adsorbing a conductive material on the graft polymer.

7. A conductive pattern forming method according to claim 6, wherein the conductive material is further heated at a temperature in a range of 50 to 500° C. after the conductive material is adsorbed.

8. A conductive pattern forming method comprising:

forming a polymerization initiation layer which is obtained by fixing, by a cross-linking reaction, a polymer having functional groups having polymerization initiation ability and cross-linking groups at side chains, on a support;

forming a pattern comprising a preparation zone and a non-preparation zone of a graft polymer by preparing the graft polymer on the surface of the polymerization initiation layer using graft polymerization, by contacting a compound having a polymerizable group and a polar group on the polymerization initiation layer and supplying energy imagewise; and adsorbing a conductive material on the preparation zone of the graft polymer.

9. A conductive pattern forming method comprising:

forming a polymerization initiation layer which is obtained by fixing, by a cross-linking reaction, a polymer having functional groups having polymerization initiation ability and cross-linking groups at side chains, on a support;

forming a pattern comprising a hydrophilic zone and a hydrophobic zone on the surface of the polymerization initiation layer, by providing a polymer compound layer comprising a polymer compound which is directly and chemically bonded with the polymerization initiation layer and has a functional group whose hydrophilicity or hydrophobicity is changed by heat, acid or radiation and applying heat, acid or radiation imagewise to the polymer compound layer; and adsorbing a conductive material on the hydrophilic zone or the hydrophobic zone.

10. A pattern forming method comprising:

providing a polymerization initiation layer which is obtained by fixing, by a cross-linking reaction, a polymer having functional groups having polymerization initiation ability and cross-linking groups at side chains, on a support; and forming a pattern comprising a preparation zone anda non-preparation zone of a graft polymer by preparing the graft polymer on the surface of the polymerization initiation layer using graft polymerization, by contacting a compound having a polymerizable group on the polymerization initiation layer and supplying energy having a wavelength of 250 nm to 800 nm imagewise.

11. A pattern forming method comprising:

providing a polymerization initiation layer which is obtained by fixing, by a cross-linking reaction, a polymer having ketone groups having polymerization initiation ability and cross-linking groups at side chains, on a support; and forming a pattern comprising a preparation zone and a non-preparation zone of a graft polymer by preparing the graft polymer on the surface of the polymerization initiation layer using graft polymerization, by contacting a compound having a polymerizable group on the polymerization initiation layer and supplying energy imagewise.

* * * * *